US010665495B2

(12) United States Patent
Yokoyama et al.

(10) Patent No.: US 10,665,495 B2
(45) Date of Patent: May 26, 2020

(54) SUBSTRATE ATTACHMENT/DETACHMENT DEVICE, PLATING DEVICE, CONTROL DEVICE FOR A SUBSTRATE ATTACHMENT/DETACHMENT DEVICE, AND STORAGE MEDIUM THAT STORES A PROGRAM FOR CAUSING A COMPUTER TO EXECUTE A METHOD OF CONTROLLING A SUBSTRATE ATTACHMENT/DETACHMENT DEVICE

(71) Applicant: EBARA CORPORATION, Tokyo (JP)

(72) Inventors: Toshio Yokoyama, Tokyo (JP); Yoshitaka Mukaiyama, Tokyo (JP); Takuya Tsushima, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 25 days.

(21) Appl. No.: 15/851,655

(22) Filed: Dec. 21, 2017

(65) Prior Publication Data
US 2018/0182659 A1 Jun. 28, 2018

(30) Foreign Application Priority Data
Dec. 22, 2016 (JP) .................. 2016-249631

(51) Int. Cl.
*H01L 21/687* (2006.01)
*C25D 17/00* (2006.01)
*C25D 17/06* (2006.01)

(52) U.S. Cl.
CPC ...... *H01L 21/68728* (2013.01); *C25D 17/001* (2013.01); *C25D 17/06* (2013.01); *H01L 21/68764* (2013.01)

(58) Field of Classification Search
CPC ............... C25B 17/001; C25B 17/006; H01L 21/68728; H01L 21/68764; C25D 17/001; C25D 17/006
See application file for complete search history.

(56) References Cited

U.S. PATENT DOCUMENTS

2003/0026065 A1* 2/2003 Suhara ............. H01L 21/68728
361/600
2004/0253087 A1* 12/2004 Iizuka .................... B66C 13/06
414/626
(Continued)

FOREIGN PATENT DOCUMENTS

JP 4179707 B 11/2008
JP 2009-270167 A 11/2009
(Continued)

Primary Examiner — Ciel P Contreras
(74) Attorney, Agent, or Firm — BakerHostetler

(57) ABSTRACT

A substrate attachment/detachment device which clamps and holds a substrate by means of first and second retaining members of a substrate holder, the device comprising a first holder retainer configured to hold the first retaining member in a first posture; and a second holder retainer configured to be movable in a linear manner toward and away from the first holder retainer, capable of holding the second retaining member in the first posture and a second posture which is substantially orthogonal to the first posture, configured to push the second retaining member against the first retaining member in the first posture to lock the first and second retaining members to each other.

22 Claims, 85 Drawing Sheets

(56) References Cited

U.S. PATENT DOCUMENTS

| | | | |
|---|---|---|---|
| 2004/0261944 A1* | 12/2004 | Wakabayashi | B24B 37/345 |
| | | | 156/345.12 |
| 2013/0192983 A1* | 8/2013 | Fujikata | C25D 17/001 |
| | | | 204/242 |
| 2016/0194780 A1 | 7/2016 | Nagai et al. | |
| 2016/0258080 A1* | 9/2016 | Kimura | C25D 17/007 |
| 2016/0348264 A1 | 12/2016 | Fujikata et al. | |

FOREIGN PATENT DOCUMENTS

| | | |
|---|---|---|
| JP | 2016-117917 A | 6/2016 |
| JP | 2016-127069 A | 7/2016 |

\* cited by examiner

SUBSTRATE ATTACHMENT/DETACHMENT DEVICE, PLATING DEVICE, CONTROL DEVICE FOR A SUBSTRATE ATTACHMENT/DETACHMENT DEVICE, AND STORAGE MEDIUM THAT STORES A PROGRAM FOR CAUSING A COMPUTER TO EXECUTE A METHOD OF CONTROLLING A SUBSTRATE ATTACHMENT/DETACHMENT DEVICE

CROSS-REFERENCE TO RELATED APPLICATIONS

This application is based upon and claims benefit of priority from Japanese Patent Application No. 2016-249631 filed Dec. 22, 2016, the entire contents of which are incorporated herein by reference.

TECHNICAL FIELD

The present invention relates to a substrate attachment/detachment device, a plating device, a control device for a substrate attachment/detachment device, and a storage medium that stores a program for causing a computer to execute a method of controlling a substrate attachment/detachment device.

BACKGROUND ART

Substrates, such as semiconductor wafers and print-circuit boards, have been provided with wiring, bumps (projecting electrodes), etc. on their surfaces. A well-known method of forming the wiring, the bumps, etc. is an electrolytic plating method.

A plating device used for the electrolytic plating method has a substrate holder which holds a circular or polygonal substrate while sealing the end face of the substrate and exposing the surface (to-be-plated face) of the substrate. When a substrate surface is subjected to plating processing by using the plating device thus configured, the substrate holder holding the substrate is immersed in plating solution.

Japanese Unexamined Patent Application Publication (Kokai) No. 2016-117917 (Patent Literature 1) refers to a substrate holder for a semiconductor wafer. This substrate holder is configured so that a substrate placed on a fixed retaining member (first retaining member 22) is clamped by a movable retaining member (second retaining member 24), and a ferrule 27 on the second retaining member 24 is rotated to engage the ferrule 27 with a damper 33 on the first retaining member 22. The substrate is thus locked onto the substrate holder.

Japanese Patent No. 4179707 (Patent Literature 2) refers to a substrate holding jig for a square printed-circuit board. According to this substrate holding jig, a printed-circuit board P is locked by four grippers 30 disposed in a rectangular frame 20.

Japanese Unexamined Patent Application Publication (Kokai) No. 2009-270167 (Patent Literature 3) discusses a plating device which carries a substrate in the horizontal state and subjects the substrate to plating processing while maintaining the substrate horizontally on a holding base 42 of a plating section 26.

Japanese Unexamined Patent Application Publication (Kokai) No. 2016-127069 (Patent Literature 4) describes a substrate holder attachment/detachment device for a plating device which subjects a circular substrate like the one in the Patent Literature 1 to plating processing (FIG. 7).

SUMMARY OF INVENTION

Technical Problem

The configuration described in the Patent Literature 1 is for applying plating processing to circular semiconductor wafers. In these days, substrates to be plated have various dimensions, shapes, and thicknesses. Particularly when the substrate holder of the Patent Literature 1 is used to hold a large-size, thin film-like substrate, the substrate is likely to be bent by rotation of the ferrule.

According to the substrate holding jig of the Patent Literature 2, the end face of the substrate is clamped between a pair of blocks 31 and 32 of the gripper 30. In this state, both the blocks are screwed together to lock the substrate by means of the gripper 30. This configuration is not suitable for automation of the holding by the substrate holding jig.

According to the configuration described in the Patent Literature 3, the device is downsized without providing a complicated posture changing mechanism by carrying a glass substrate within the device to subject the substrate to the processing with the to-be-processed face of the glass substrate facing upward. However, if the processing is applied to a substrate which is a warped film that is thinner than the glass substrate, and the substrate is carried with the to-be-processed face thereof facing upward, the substrate is liable to get a scratch in the surface thereof or get broken.

In the case of large-size substrates, not only the substrates but the substrate holder for holding the substrates have to be increased in size, also increasing the weight of the substrate holder. In this view, there is concern that a substrate which is large in size and small in thickness cannot be smoothly and securely attached to or detached from the substrate holder of the substrate holder attachment/detachment device disclosed in the Patent Literature 4.

An object of the invention is to solve at least part of the above-discussed problems.

Solution to Problem

A substrate attachment/detachment device according to one embodiment of the invention is a substrate attachment/detachment device which clamps and holds a substrate by means of first and second retaining members of a substrate holder, the device comprising a first holder retainer configured to hold the first retaining member in a first posture; and a second holder retainer configured to be movable in a linear manner toward and away from the first holder retainer, capable of holding the second retaining member in the first posture and a second posture which is substantially orthogonal to the first posture, configured to push the second retaining member against the first retaining member in the first posture to lock the first and second retaining members to each other.

A plating device according to one embodiment of the invention comprises a substrate attachment/detachment device which clamps and holds a substrate by means of first and second retaining members of a substrate holder, and a plating processing section which receives the substrate holder holding the substrate which has been held in the substrate attachment/detachment device, and applies plating processing to the substrate. The substrate attachment/detachment device comprises a first holder retainer configured to support the first retaining member in a first posture; and a second holder retainer configured to be movable in a linear manner toward and away from the first holder retainer, capable of holding the second retaining member in the first posture and a second posture which is substantially orthogonal to the first posture, and configured to push the second retaining member against the first retaining member in the first posture to lock the first and second retaining members to each other.

A control device according to one embodiment of the invention is a control device of the substrate attachment/detachment device configured to clamp and hold a substrate by means of the first and second retaining members of the substrate holder. The control device executes processing including supporting the first holder retainer in the first posture by means of a first retaining member; fixing a substrate to the second retaining member by means of a second holder retainer while supporting the second retaining member by means of the second holder retainer in a second posture which is substantially orthogonal to the first posture, and then turning the second retaining member into the first posture; causing the second holder retainer to make a linear motion toward the first holder retainer; and pressing the second retaining member against the first retaining member by means of the second holder retainer to lock the first and second retaining members to each other.

A storage medium according to one embodiment of the invention is a storage medium that stores a program for causing a computer to execute a method of controlling a substrate attachment/detachment device configured to clamp and hold a substrate by means of first and second retaining members of the substrate holder. The storage medium stores a program for causing a computer to execute supporting the first retaining member in the first posture by means of the first holder retainer; fixing the substrate to the second retaining member by means of the second holder retainer while the second retaining member is supported by the second holder retainer in a second posture which is substantially orthogonal to the first posture, and turning the second retaining member into the first posture; causing the second holder retainer to make a linear motion toward the first holder retainer; and pressing the second retaining member against the first retaining member by means of the second holder retainer to lock the first and second retaining members to each other.

BRIEF DESCRIPTION OF DRAWINGS

FIG. 27O is an elevation view of the support plate of the turning device, which explains configuration of a horizontal positioning device.

DESCRIPTION OF EMBODIMENTS

Embodiments of the invention will be explained below with reference to the drawings. In each of the embodiments, the same or corresponding members are provided with the same reference marks, and repetitive explanations will be omitted. The present specification includes words: "front face," "rear face," "front," "back," "upper," "lower," "left," "right," etc. These words represent positions and directions on the exemplified drawings, and are not necessarily the same as the actual configuration when the device is in use or in other situations.

Figure 1:
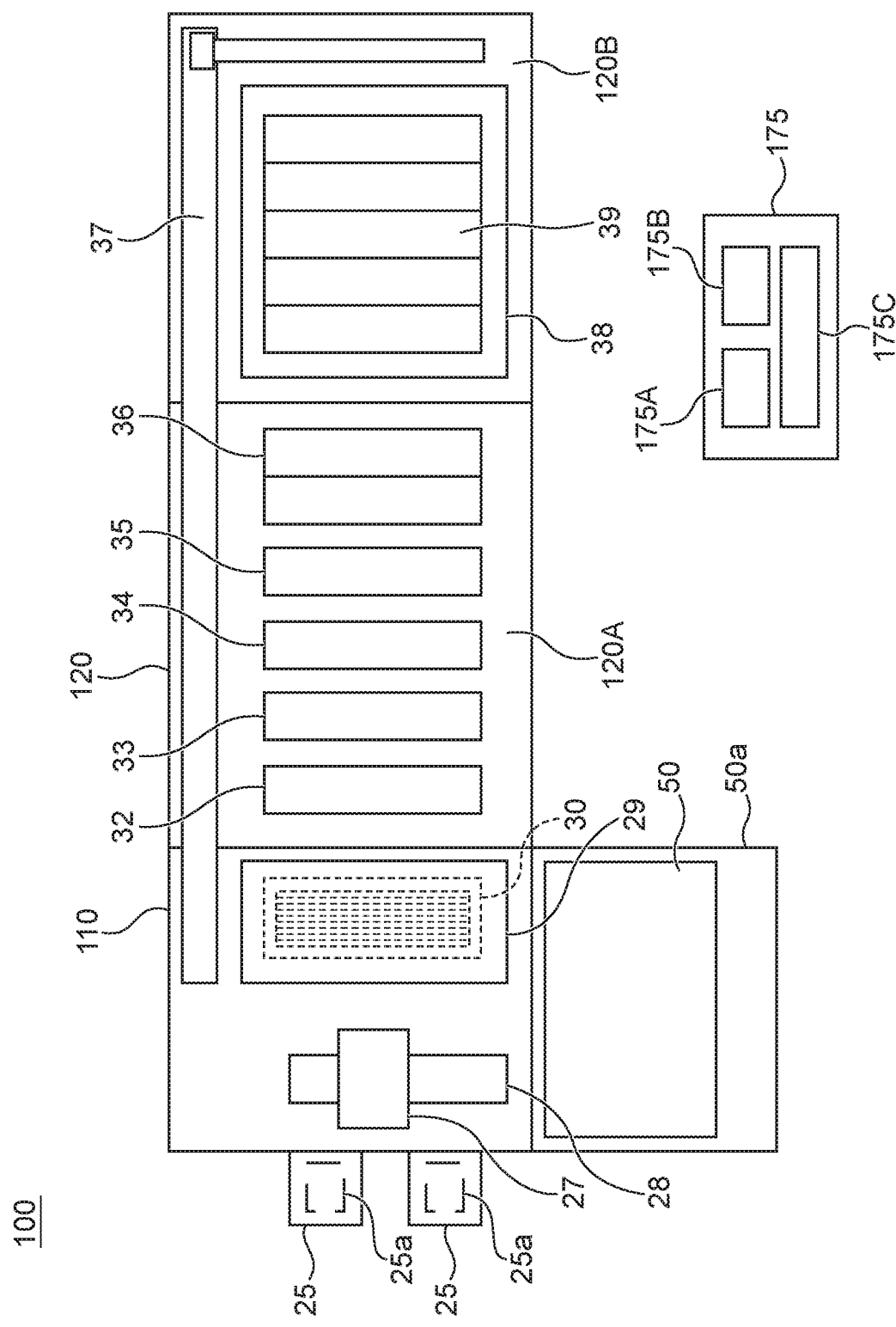
FIG. 1 is a view showing an overall layout of a plating device using a substrate holder according to one embodiment of the invention.

FIG. 1 is a view showing an overall layout of a plating device using a substrate holder according to one embodiment of the invention. As illustrated in FIG. 1, a plating device 100 can be roughly divided into a load/unload section 110 configured to load a substrate (corresponding to an example of an object to be processed) into a substrate holder 1 or unload the substrate from the substrate holder 1; a processing section 120 configured to process the substrate; and a washing section 50a. The processing section 120 includes a preprocessing and post-processing section 120A configured to perform preprocessing and post-processing of the substrate, and a plating processing section 120B configured to apply plating processing to the substrate. Substrates to be processed by the plating device 100 include square substrates and circular substrates. The square substrates include glass substrates, liquid crystal substrates, and print substrates, which have a polygonal shape such as a rectangle, and other polygonal objects to be plated. The circular substrates include semiconductor wafers, glass substrates, and other circular objects to be plated.

The load/unload section 110 has two cassette tables 25 and a substrate attachment/detachment mechanism 29. The cassette table 25 is mounted with a cassette 25a which stores a substrate, such as a semiconductor wafer, a glass substrate, a liquid crystal substrate, and a print substrate. The substrate attachment/detachment mechanism 29 is so configured as to attach/detach the substrate in/from the substrate holder 1 (which will be explained with reference to FIG. 2A and the subsequent figures). Provided near (for example, under) the substrate attachment/detachment mechanism 29 is a stocker 30 for storing the substrate holder 1. The units 25, 29 and 30 are disposed around a substrate transfer device 27 formed of a transfer robot which transfers the substrate between these units. The substrate transfer device 27 is configured to be capable of traveling using a traveling mechanism 28.

The washing section 50a has a washing device 50 configured to wash and dry a plated substrate. The substrate transfer device 27 is configured to transfer the plated substrate to the washing device 50 and remove a washed substrate from the washing device 50.

The preprocessing and post-processing section 120A has a prewet tank 32, a presoak tank 33, a prerinse tank 34, a blow tank 35, and a rinse tank 36. In the prewet tank 32, the substrate is immersed in pure water. In the presoak tank 33, an oxide film on a surface of a conductive layer, such as a seed layer, which is formed on a surface of the substrate is removed by etching. In the prerinse tank 34, a presoaked substrate is washed in a cleansing liquid (such as pure water) together with the substrate holder. In the blow tank 35, the liquid is drained off from a washed substrate. In the rinse tank 36, a plated substrate is washed in a cleansing liquid together with the substrate holder. The prewet tank 32, the presoak tank 33, the prerinse tank 34, the blow tank 35, and the rinse tank 36 are arranged in the order mentioned. The above-described configuration of the preprocessing and post-processing section 120A of the plating device 100 is one example. The configuration of the preprocessing and post-processing section 120A of the plating device 100 is not limited and may be configured in another manner.

The plating processing section 120B has a plurality of plating tanks 39 provided with an overflow tank 38. The plating tanks 39 each stores a single substrate in the inside thereof. In the plating tank 39, the substrate is immersed in plating liquid maintained in the plating tank 39, and a substrate surface is thus applied with plating such as copper plating. The plating liquid is not particularly limited in type, and various types of plating liquids may be used according to purposes.

The plating device 100 is disposed at the side of the above-described devices and transfers the substrate holder with the substrate between these devices. The plating device 100 has, for example, a substrate holder transfer device 37 which adopts a linear motor system. The substrate holder transfer device 37 is configured to transfer the substrata holder between the substrate attachment/detachment mechanism 29, the prewet tank 32, the presoak tank 33, the prerinse tank 34, the blow tank 35, the rinse tank 36, and the plating tank 39.

A plating processing system including the plating device 100 configured as described above has a controller 175 configured to control the above-mentioned sections. The controller 175 has a memory 175B which stores a predetermined program, a CPU (Central Processing Unit) 175A which executes the program of the memory 175B, and a controlling section 175C Which is materialized by the program being executed by the CPU 175A. The controlling section 175C is capable of, for example, controlling the transfer of the substrate transfer device 27, controlling the attachment/detachment of the substrate to/from the substrate holder by the substrate attachment/detachment mechanism 29, controlling the transfer of the substrate holder transfer device 37, controlling plating current and plating time in the plating tanks 39, and controlling diameter of an opening of an anode mask, not shown, and diameter of an opening of a regulation plate, not shown, the anode mask and the regulation plate being disposed in each of the plating tanks 39. The controller 175 is configured to be capable of communicating with a host controller, not shown, which integrally controls the plating device 100 and other related devices, and further capable of sending and receiving data to and from a database of the host controller. A storage medium forming the memory 175B stores various kinds of programs including various kinds of setting data and a plating processing program described later. Storage media that may be employed here are publicly-known media including memories, such as ROMs and RAMs that can be read by computer, and disc-type storage media, such as hard discs, CD-ROMs, DVD-ROMs, and flexible discs.

Figure 2A:
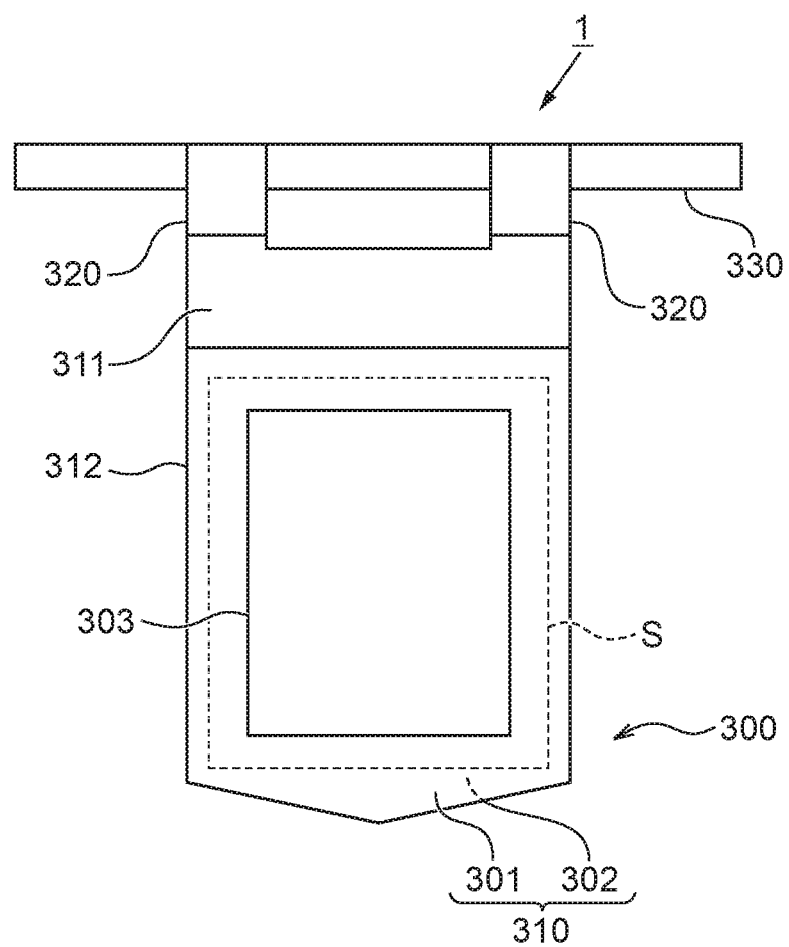
FIG. 2A is a schematic elevation view of a substrate holder according to one embodiment.
Figure 2B:
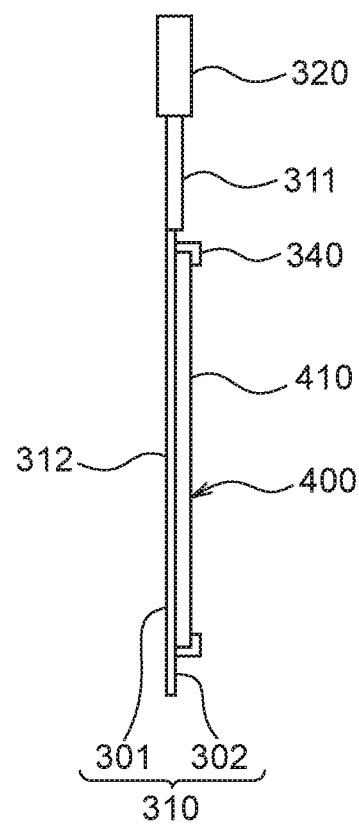
FIG. 2B is a schematic side view of the substrate holder.
Figure 2C:
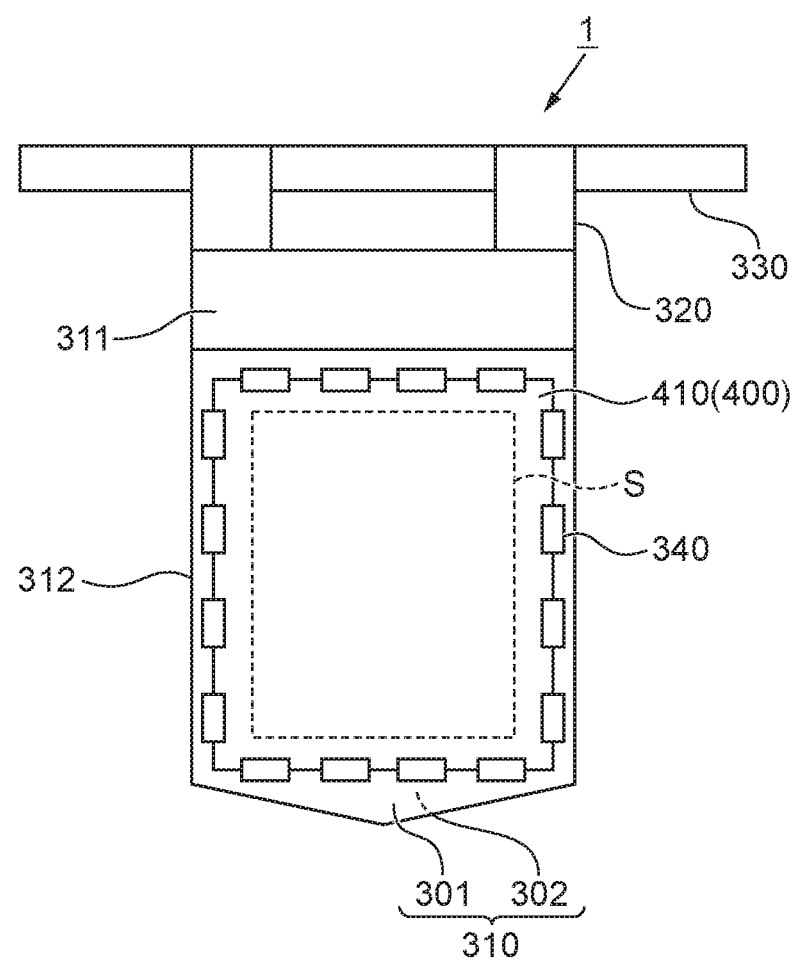
FIG. 2C is a schematic rear view of the substrate holder.
Figure 3A:
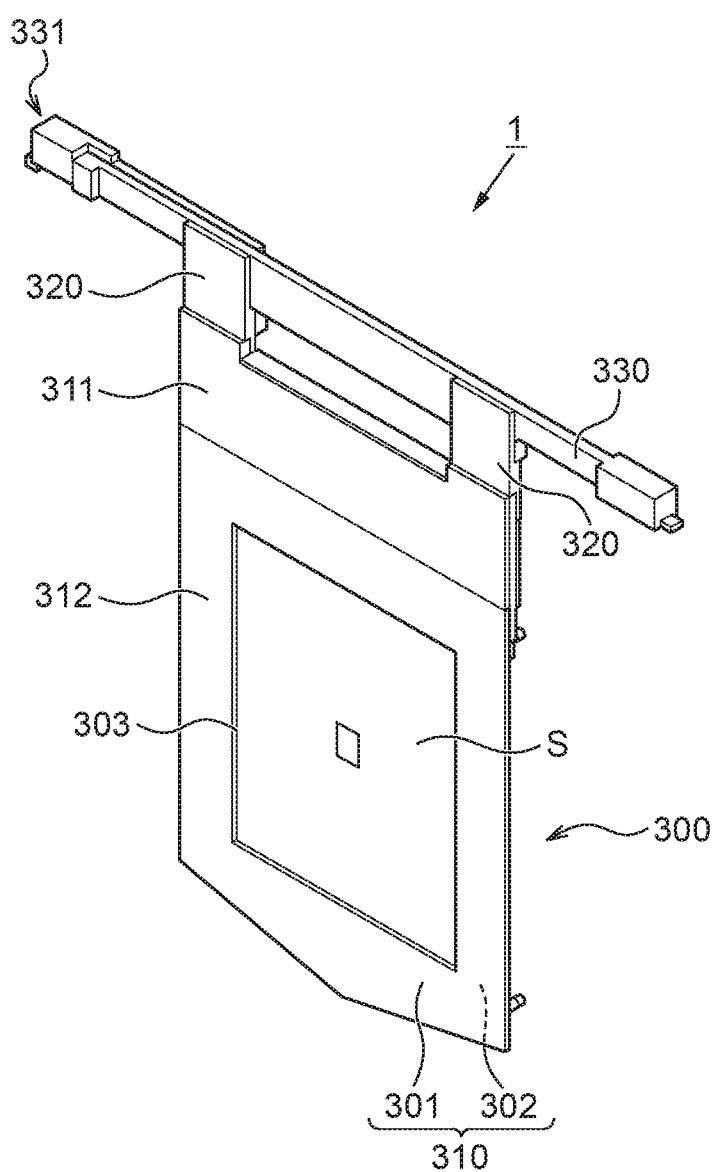
FIG. 3A is a front perspective view of the substrate holder.
Figure 3B:
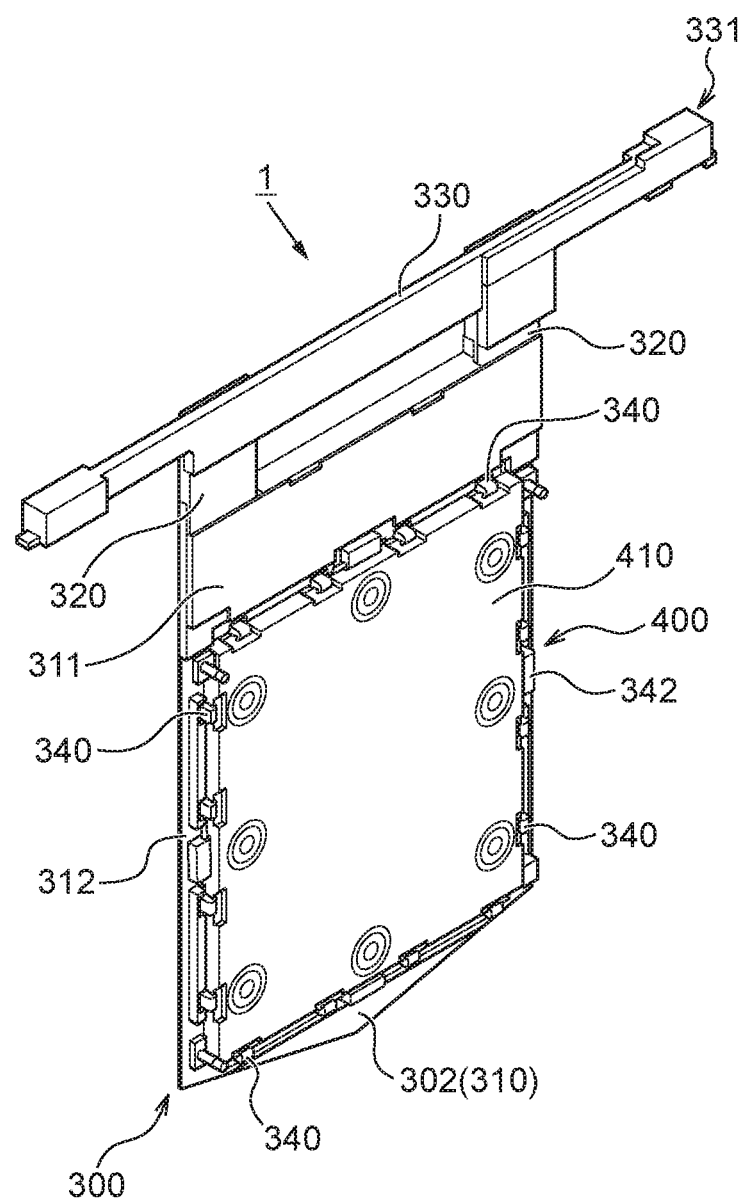
FIG. 3B is a rear perspective view of the substrate holder.
Figure 4A:
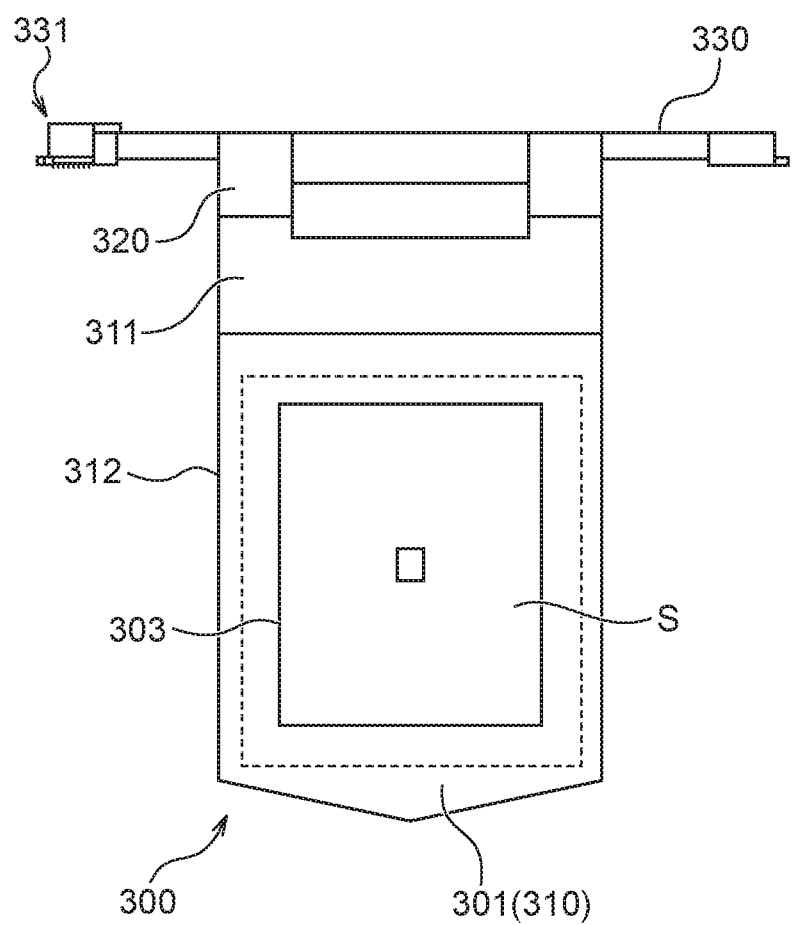
FIG. 4A is a front view of the substrate holder.
Figure 4B:
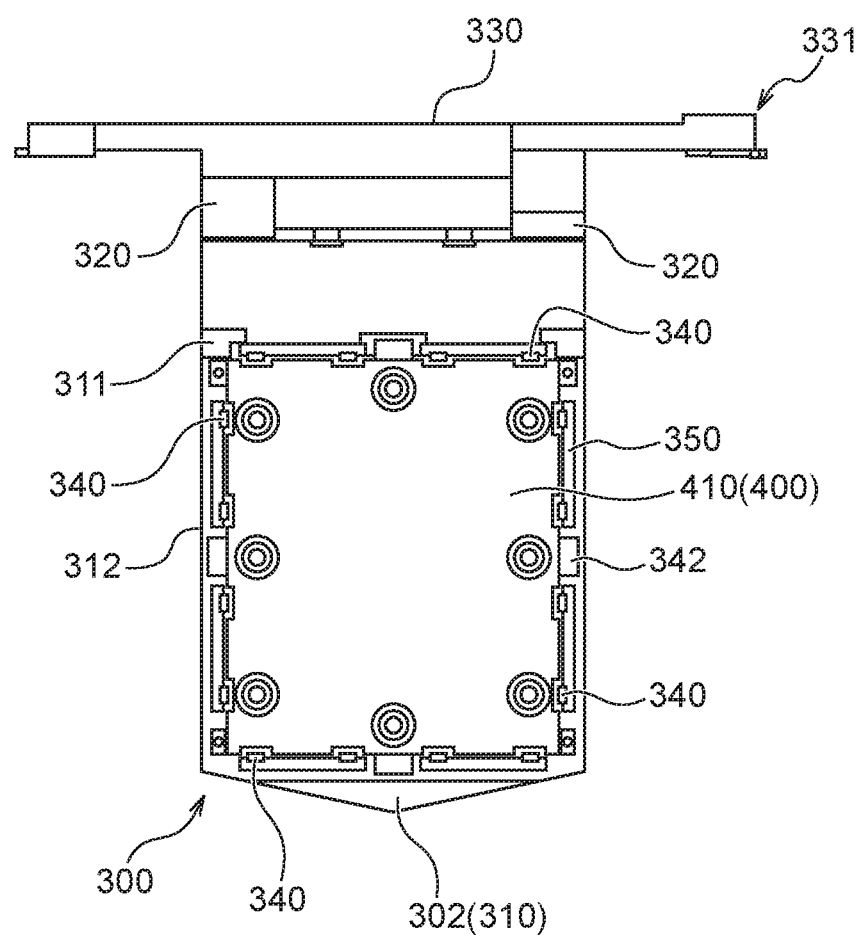
FIG. 4B is a rear view of the substrate holder.

FIG. 2A is a schematic elevation view of the substrate holder according to one embodiment. FIG. 2B is a schematic side view of the substrate holder. FIG. 2C is a schematic rear view of the substrate holder. FIG. 3A is a front perspective view of the substrate holder. FIG. 3B is a rear perspective view of the substrate holder. FIG. 4A is a front view of the substrate holder. FIG. 4B is a rear view of the substrate holder.

The substrate holder 1 has a front plate 300 and a back plate 400. A substrate S is held between the front plate 300 and the back plate 400. In the present embodiment, the substrate holder 1 holds the substrate S with one surface of the substrate S exposed. The substrate S may be a semiconductor wafer, a glass substrate, a liquid crystal substrate, a print substrate or another object to be plated. The substrate S has any one of circular, square, and other shapes. Although the following explanation includes a square substrate as an example, it is possible to hold a substrate in a circular or another shape if a shape of an opening of the substrate holder 1 is changed.

The from plate 300 has a front plate main body 310 and an arm 330. The arm 330 is a gripped part which is gripped by the substrate holder transfer device 37. The arm is also a supported part when disposed in the substrate attachment/detachment mechanism 29 and the plating tank 39. The substrate holder 1 is transferred in an upright position perpendicular to an installation surface of the plating device 100. The substrate holder 1 is then disposed inside the plating tank 39 in the upright position.

The front plate main body 310 is roughly rectangular in shape. The front plate main body 310 has a wiring buffer part 311, a face part 312, a front face 301, and a rear face 302. The front plate main body 310 fixed to the arm 330 at two places by an attachment part 320. The front plate main body 310 is provided with an opening 303. A to-be-plated surface of the substrate S is exposed from the opening 303. In the present embodiment, the opening 303 is formed to have a rectangular shape correspondingly to the substrate S having a rectangular shape. If the substrate S is a circular semiconductor wafer or the like, the opening 303 is also formed to have a circular shape.

The wiring buffer part 311 is disposed in the side of the front plate 310, which is close to the arm 330. The wiring buffer part 311 is an area in which cables reaching the front plate main body 310 through the arm 330 are distributed. The wiring buffer part 311 is also an area in which extra portions or length of the cables is accommodated. The wiring buffer part 311 is formed to have thickness that is slightly larger than other portions (face part 312) of the front plate main body 310 (see FIG. 2B). In the present embodiment, the wiring buffer part 311 is formed as a separate body from the other portions (face part 312) of the front plate main body 310, and is attached to the face part 312. Disposed at one end of the arm 330 is a connector 331 for electrical connection with outside wires (see FIG. 3A). The back plate 400 is fixed to the rear face 302 of the front plate main body 310 (or more specifically, the face part 312) by a clamp 340 (FIGS. 2C, 3B, and 4B).

(Attachment Structure for Attaching the Back Plate to the Front Plate)

Figure 5A:
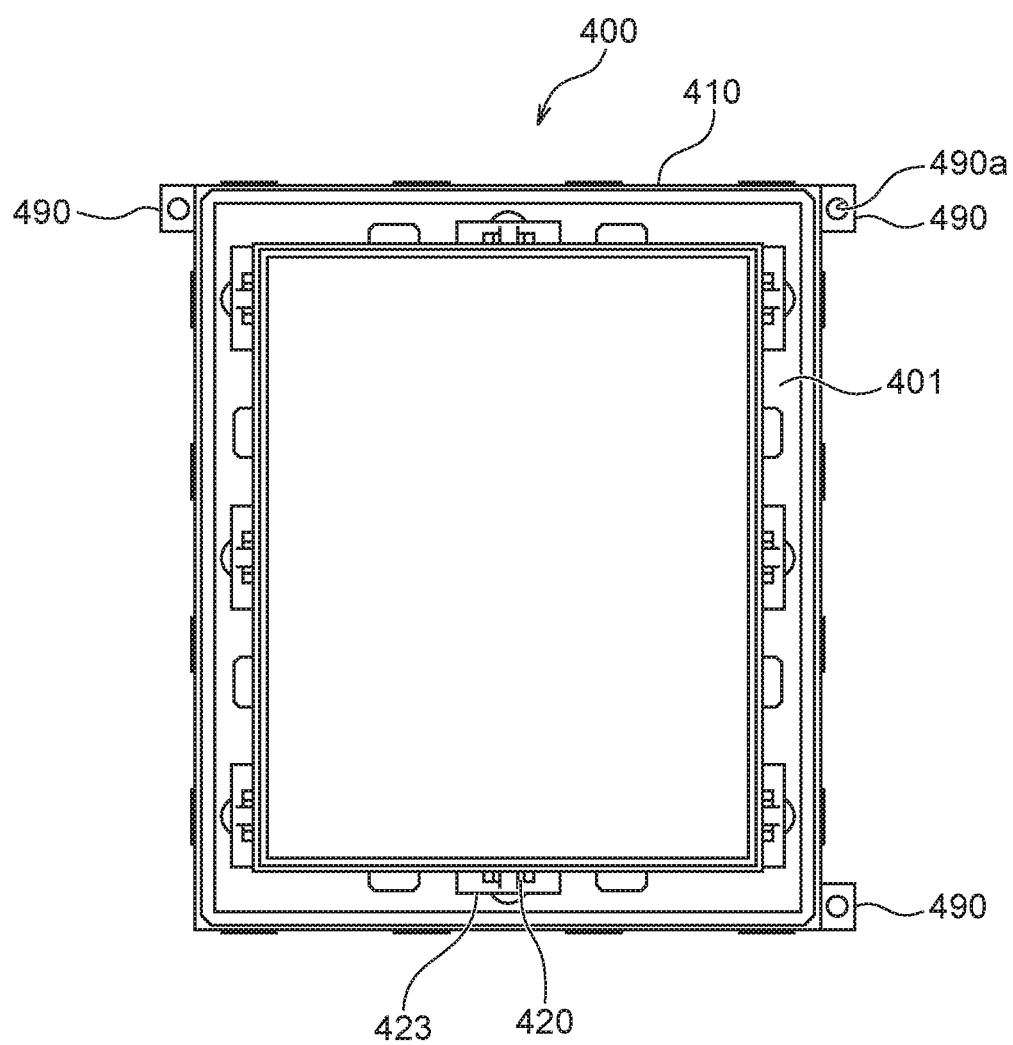
FIG. 5A is an elevation view of a back plate.
Figure 5B:
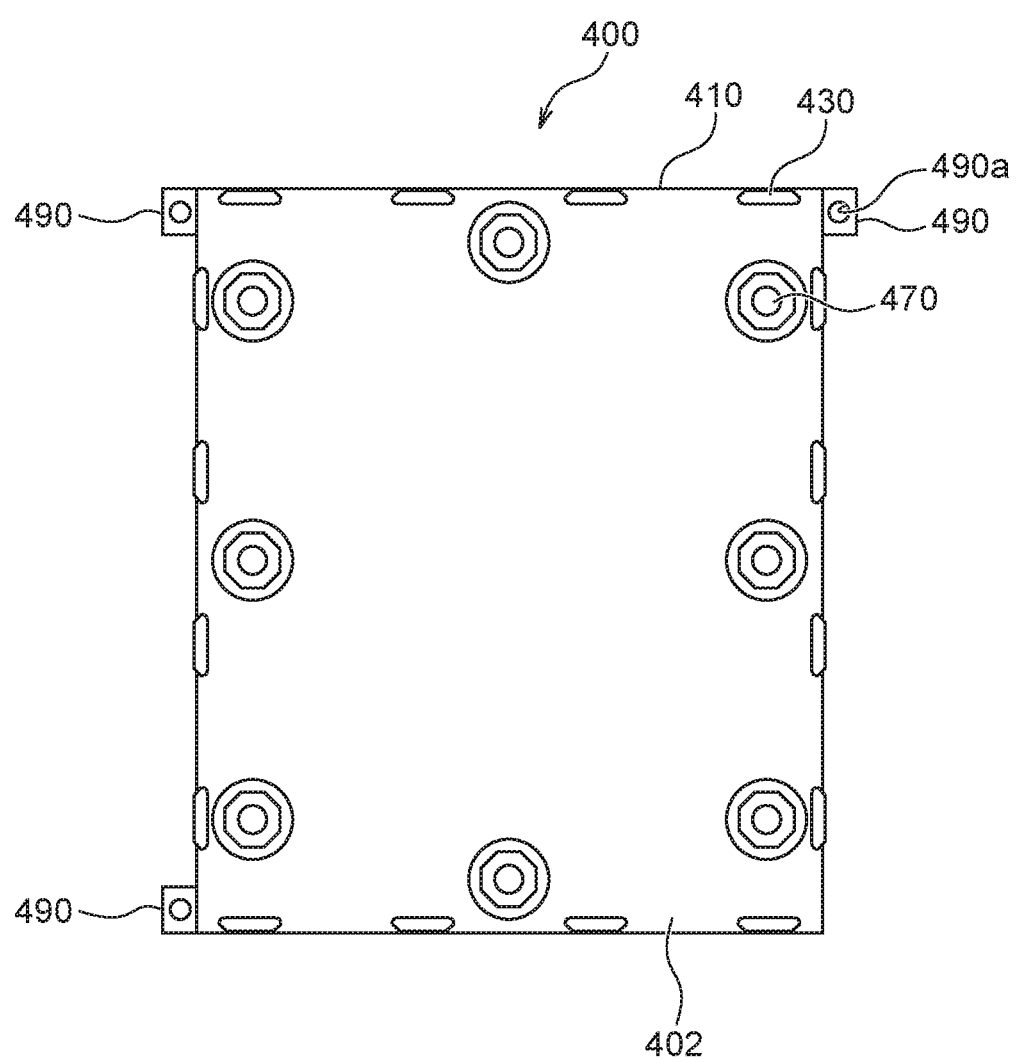
FIG. 5B is a rear view of the back plate.
Figure 6A:
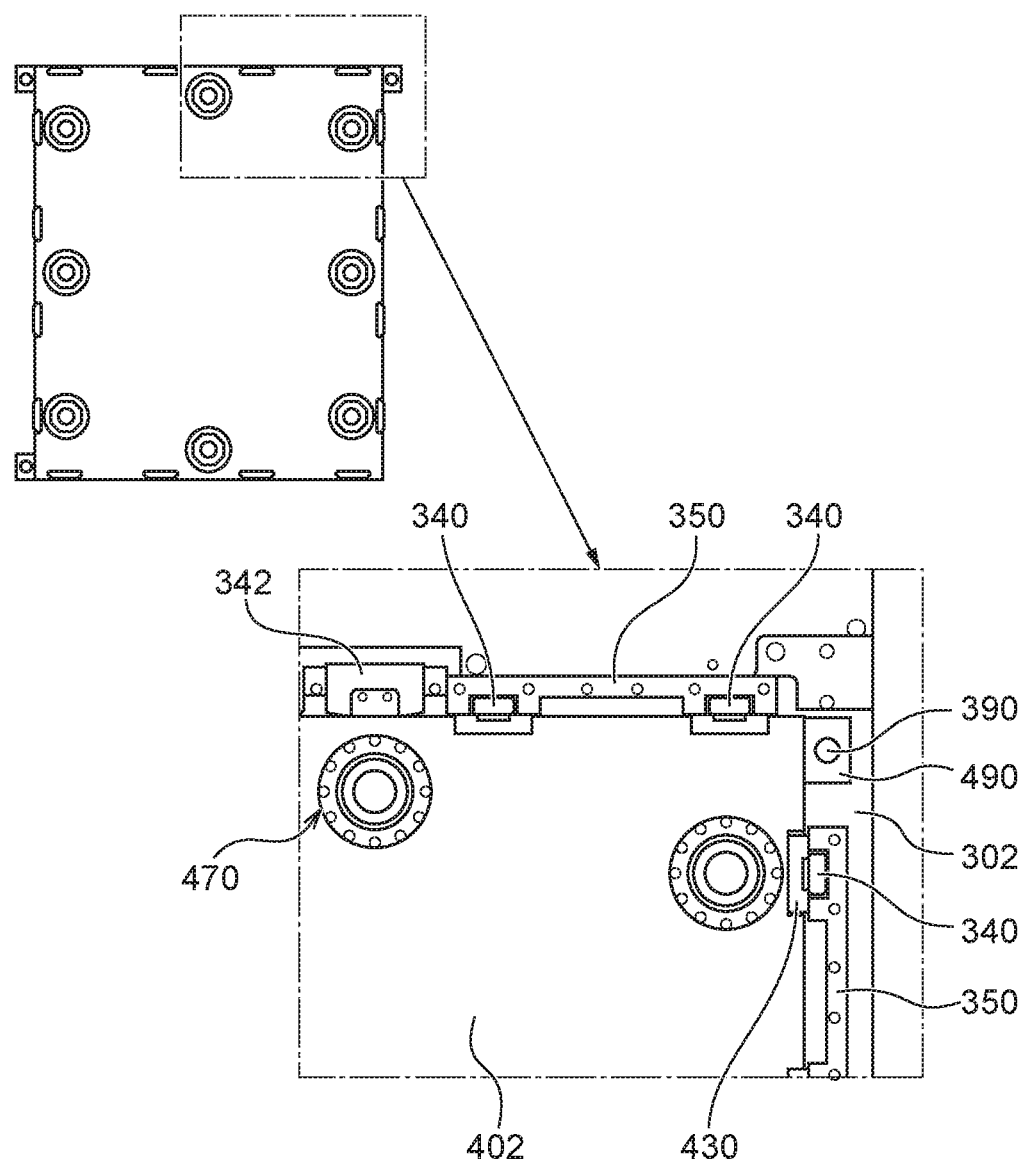
FIG. 6A is a partially-enlarged rear view of the substrate holder, which shows attachment of the back plate.
Figure 6B:
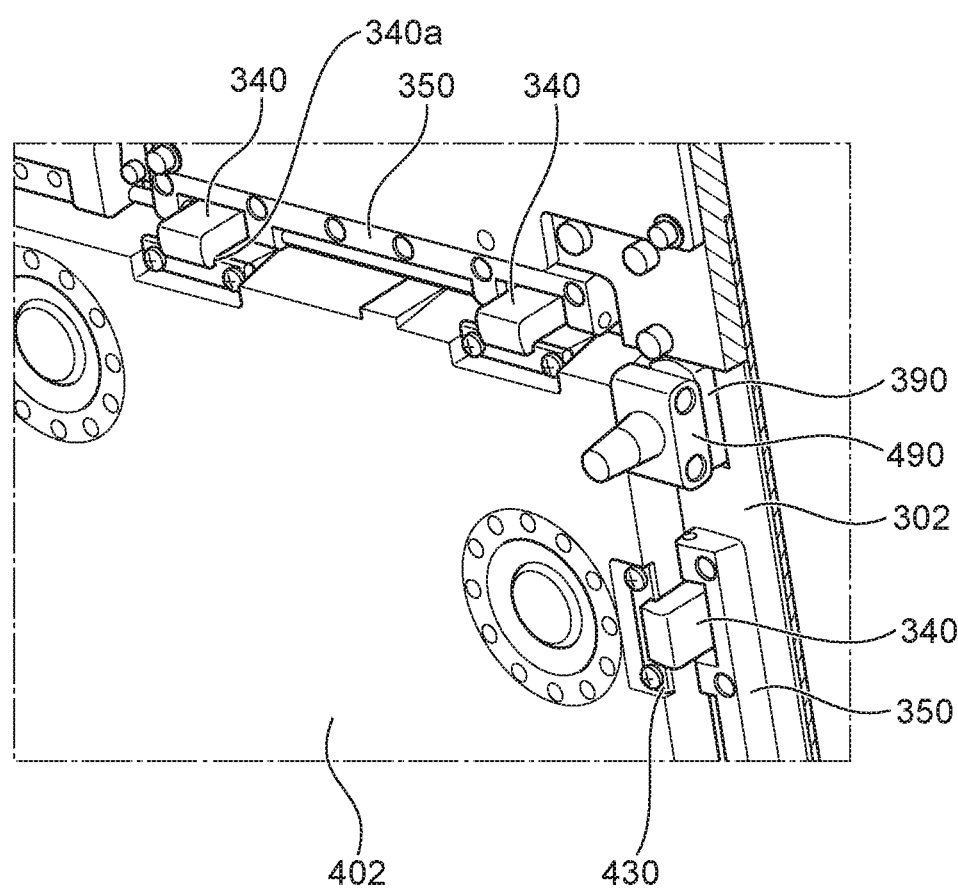
FIG. 6B is a partially-enlarged perspective view of the substrate holder, which shows the attachment of the back plate.
Figure 7:
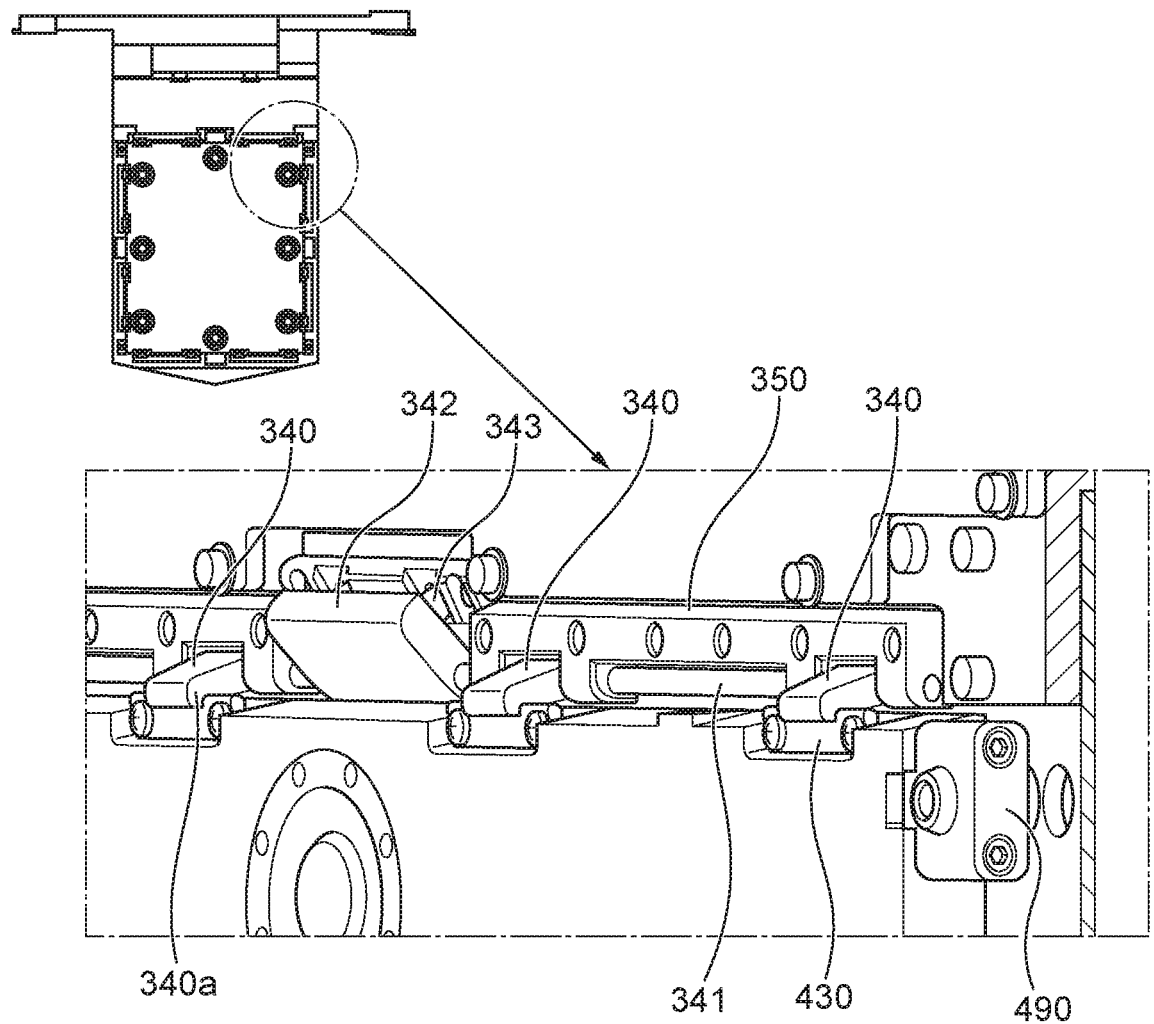
FIG. 7 is a perspective view showing relationship between a clamp and a coupling member.

FIG. 5A is an elevation view of the back plate. FIG. 5B is a rear view of the back plate. FIG. 6A is a partially-enlarged rear view of the substrate holder, which shows attachment of the back plate. FIG. 6B is a partially-enlarged perspective view of the substrate holder, which shows the attachment of the back plate. FIG. 7 is a perspective view showing relationship between the clamp and a coupling member.

The back plate 400 has a back plate main body 410. The back plate main body 410 is generally rectangular in shape, but has dimensions smaller than the front plate main body 310 of the front plate 300 (FIGS. 3B and 4B). The back plate main body 410 has a front face 401 (FIG. 5A) and a rear face (FIG. 5B).

The front face 401 of the back plate main body 410 is a mount surface on which the substrate S is mounted. The front face 401 is attached to the rear face 302 of the front plate main body 310. The front face 401 of the back plate main body 410 is provided with a clip part 420 for holding (fixing) the substrate S. The clip part 420 comprises eight clip parts 420 to correspond to sides of the substrate S. In the present example, two of the clip parts 420 are respectively disposed in upper and lower sides of the substrate S, and three of the clip parts 420 are disposed in each of right and left sides of the substrate S. The number and positions of the clip parts 420 are selected as needed according to the dimensions and shape of the substrate S, and are not limited by the number and positions illustrated in the drawings.

A positioning piece 490 is disposed in each of three of four corners of the back plate main body 410. A through-hole 490a is formed in the positioning piece 490. The positioning piece 490 may be formed integrally with the back plate main body 410 or formed separately from the back plate main body 410 to be attached to the back plate main body 410. In the rear face 302 of the front plate main body 310, positioning pins 390 are disposed to coincide with the positioning pieces 490 (FIGS. 6A and 6B). The positioning pins 390 may be formed integrally with the front plate main body 310 or formed separately from the front plate main body 310 to be attached to the front plate main body 310. At the time of attaching the back plate 400 to the front plate 300, the positioning pins 390 are inserted into the through-holes 490a of the positioning pieces 490 of the back plate 400 to adjust the positions of the back plate 400 and the front plate 300.

In the rear face 302 of the front plate 300, fixing members 350 are respectively disposed in four sides of the back plate 400 as shown in FIG. 4B. Two of the fixing members 350 are disposed in each side of the back plate 400 and juxtaposed to each other along one side of the back plate 400. As shown in FIGS. 6A, 6B and 7, two clamps 340 are attached to each of the fixing members 350. Accordingly, four clamps 340 are disposed in each side. Levers 342 for operating the four clamps at the same time are each disposed between the two fixing members 350 located in each side.

A rotary shaft 341 is disposed over the entire length of each of the two fixing members 350 in each side of the back plate 400. The rotary shaft 341 is disposed to be rotatable relative to the fixing member 350 (FIG. 7). The clamp 340 and the lever 342 are mounted on the rotary shaft 341 by keyed joint (key, keyway, and keyseat) so as not to be rotatable (FIGS. 8A, 8B, 9A, and 9B). The four clamps 340 are mounted on the rotary shafts 341 in the same phase as one another. The levers 342 are mounted on the rotary shafts 341 in a different phase from the four clamps 340. Due to the above-mentioned structure, when the levers 342 are rotated, the four clamps 340 synchronously rotate along with the rotation of the levers 342. In the present embodiment, the clamps 340 rotate around the rotary shafts 341 parallel with the faces 301 and 302 of the front plate main body 310. However, the clamps 340 may be configured to reciprocate in a perpendicular direction to the faces 301 and 302 of the front plate main body 310 to clamp the back plate 400.

Figure 9A:
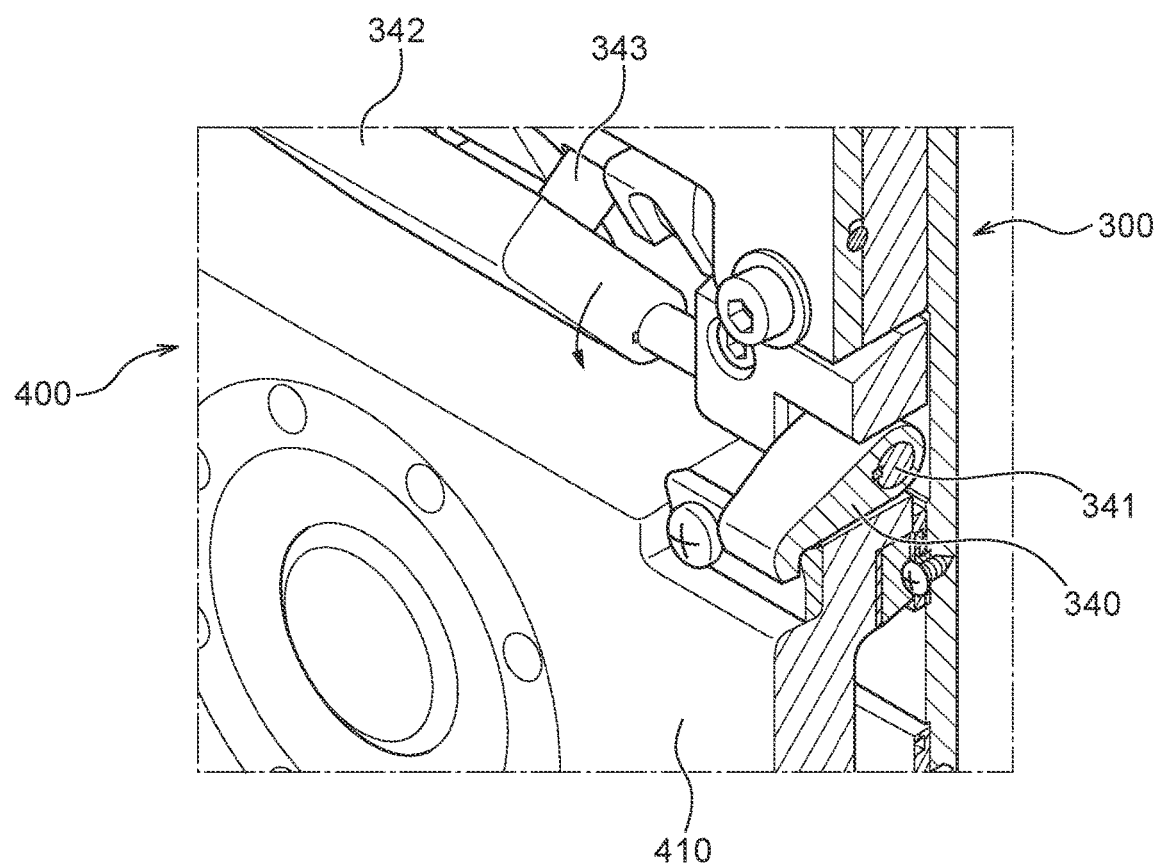
FIG. 9A is a sectional perspective view of the clamp in the clamping position.
Figure 10A:
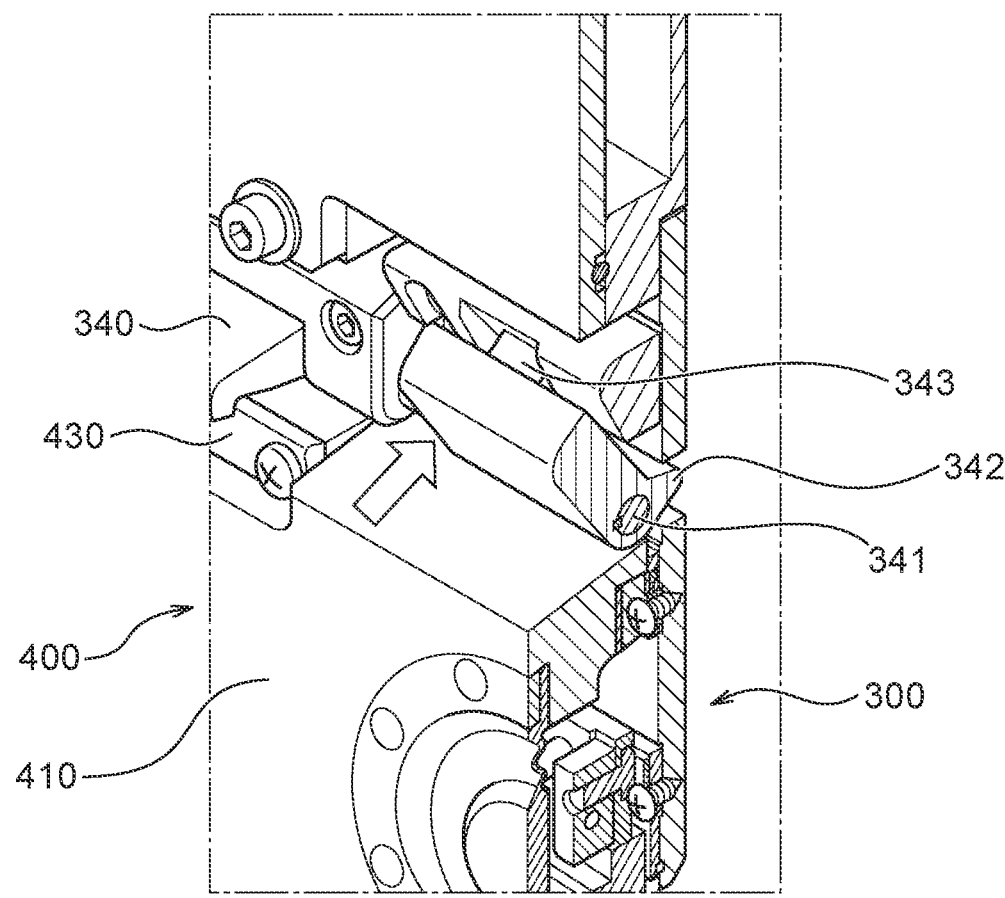
FIG. 10A is a perspective view showing configuration of the clamp in an unclamping position.
Figure 10B:
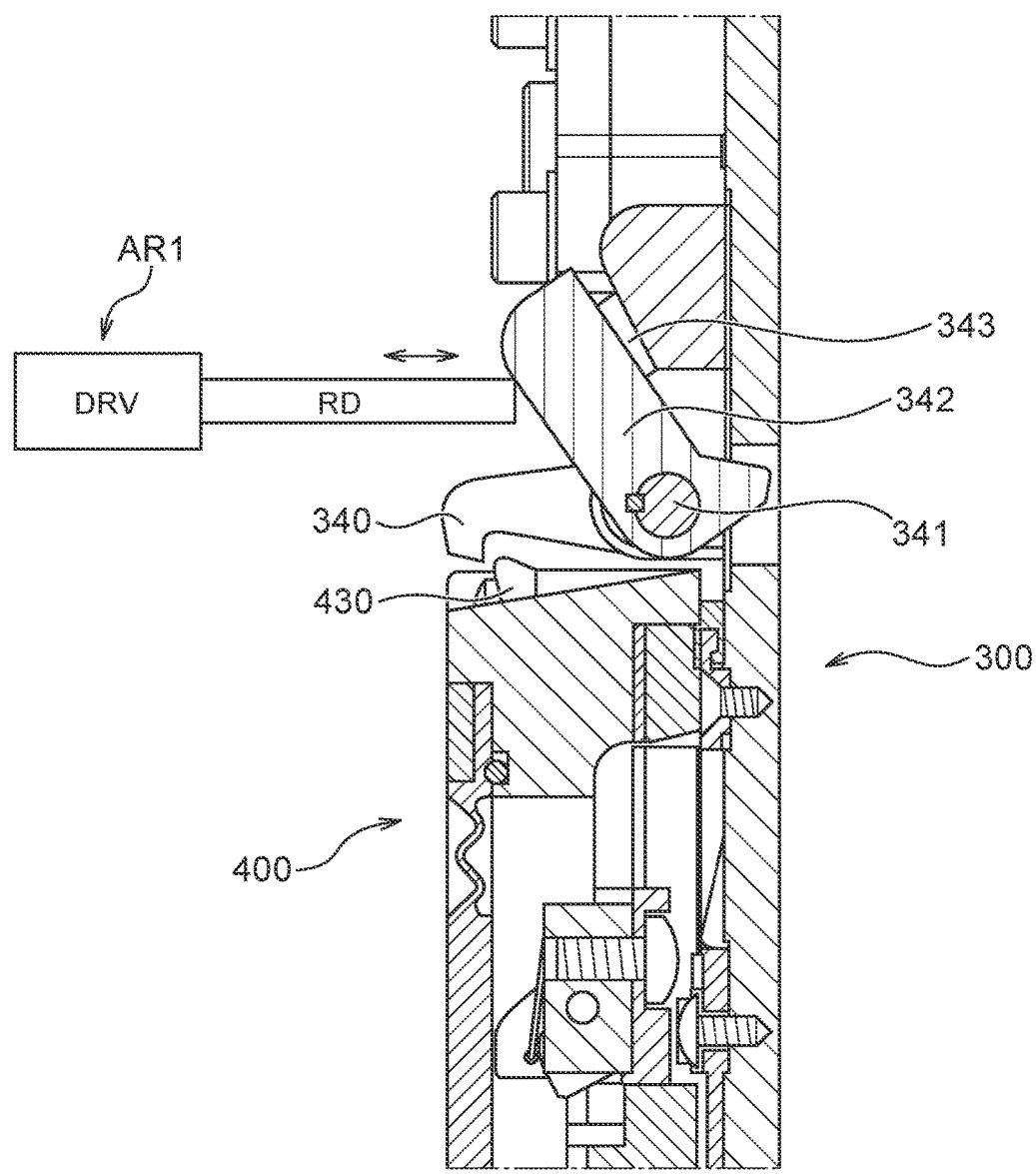
FIG. 10B is a side view of the clamp in the unclamping position.

The clamp 340 has an engaging part 340a at a distal end thereof, which is bent into a hook. The clamp 340 has a through-hole at a proximal end. The rotary shaft 341 is inserted in the through-hole and secured with a key, a keyway, and a keyseat so as not to be rotatable (see FIG. 9A). When the lever 342 is not applied with an outside force, the lever 342 is biased by a compression spring 343 so as to rise up from the rear face 302 of the front plate 300 as shown in FIG. 7. The clamp 340 is accordingly biased in a closing direction. In short, the clamp 340 is normally closed. The lever 342 is formed as a force receiving part which is capable of receiving pressure from outside. The lever 342 is capable of receiving pressure, for example, from an actuator installed in the substrate attachment/detachment mechanism 29. FIG. 10B schematically shows an actuator AR1. The actuator AR1 includes, for example, a drive DRV such as an air cylinder and a motor, and a rod-like member RD which is driven by the drive DRV. When applied with pressure from the actuator AR1, the lever 342 is rotated in a direction leaning toward the rear face 302 of the front plate 300, causing the clamp 340 to rotate in an opening direction. In the present example, the actuator AR1 comprises four actuators AR1 so as to correspond to the levers 342 located in each side. Preferably, the four actuators AR1 are simultaneously driven to push the levers 342. The four actuators AR1 may be separately driven and do not necessarily have to be driven at the same time.

In the rear face 402 of the back plate 400, engaging receiving parts 430 are disposed in corresponding positions to the clamps 340. As illustrated in the present embodiment, the engaging receiving part 430 is formed of a different member from the back plate main body 410 of the back plate 400. The engaging receiving part 430 may be attached to the back plate main body 410 or formed integrally with the back plate main body 410. The engaging receiving part 430 is provided with a projection 430a having such a shape that the hook-shaped engaging part 340a of the clamp 340 can hook into and engage with the projection 430a. The projection 430a has a larger length than the engaging part 340a to ensure the engagement with the engaging part 340a of the clamp 340.

The following description will explain a fitting structure in which the back plate 400 is attached to the front plate 300 with reference to the drawings.

Figure 8A:
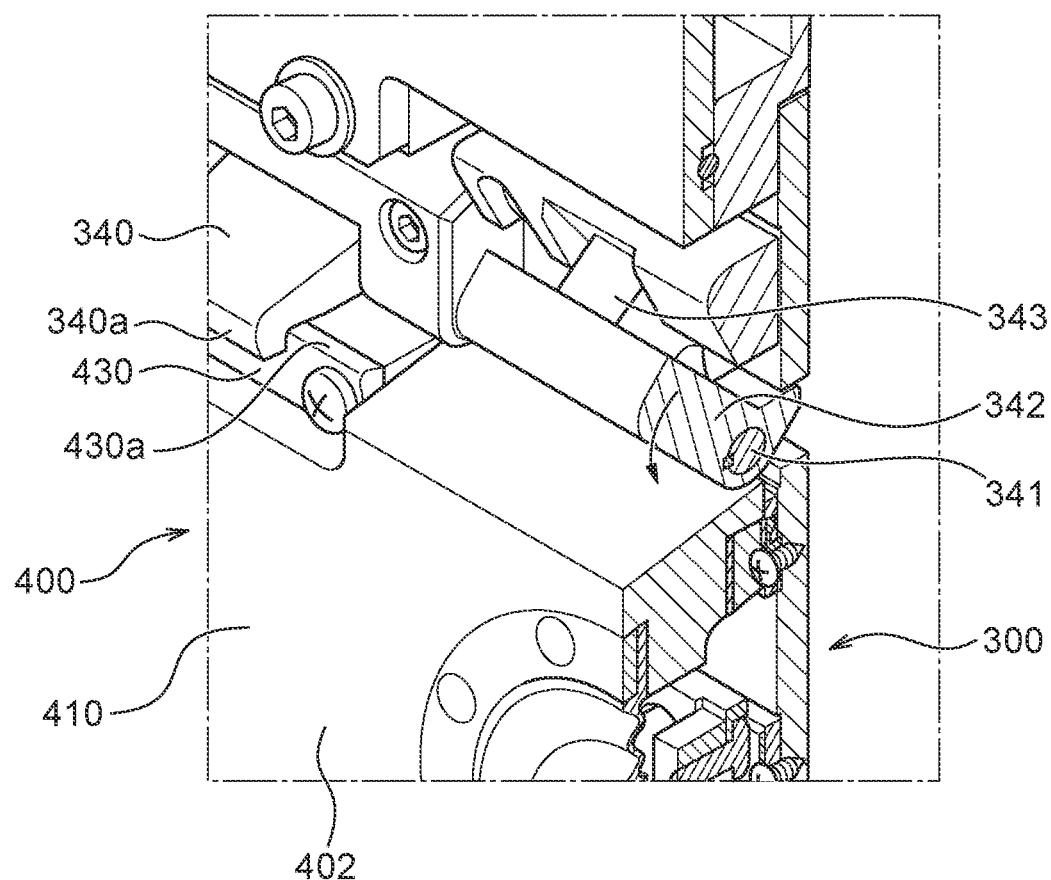
FIG. 8A is a perspective view of the clamp in a clamping position.
Figure 8B:
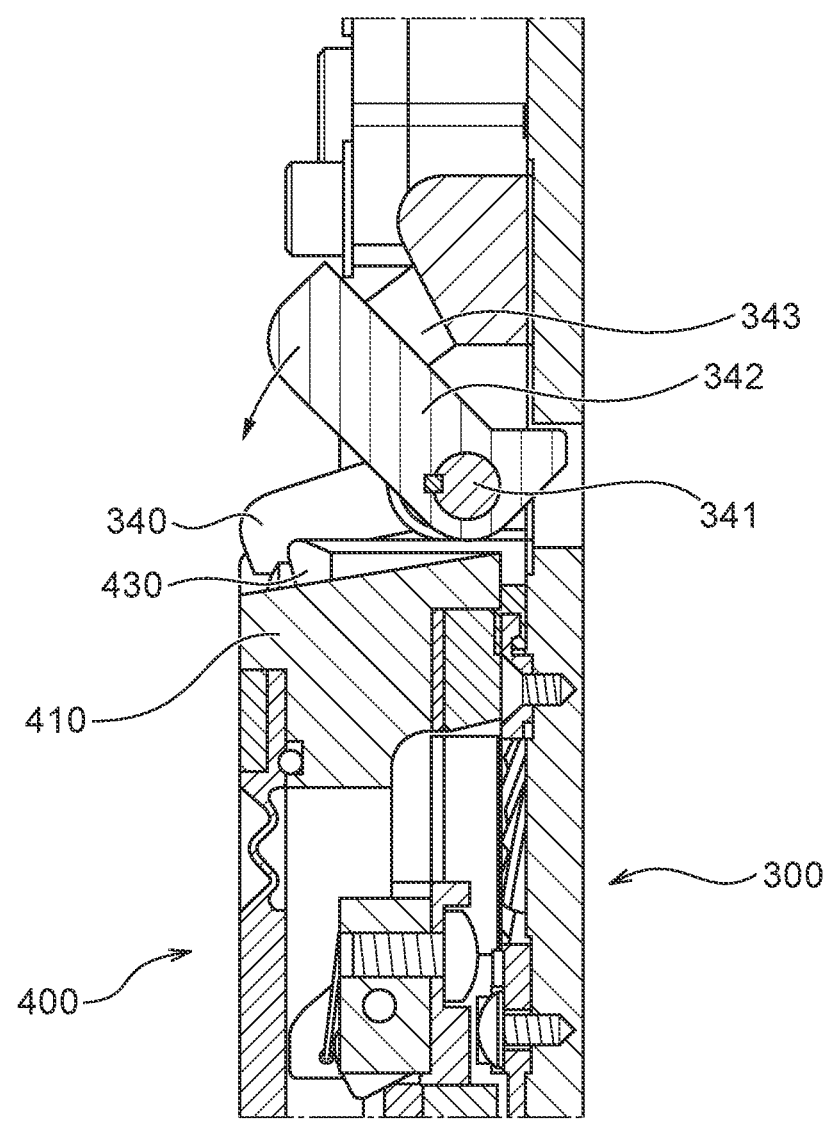
FIG. 8B is a side view of the clamp in the clamping position.
Figure 9B:
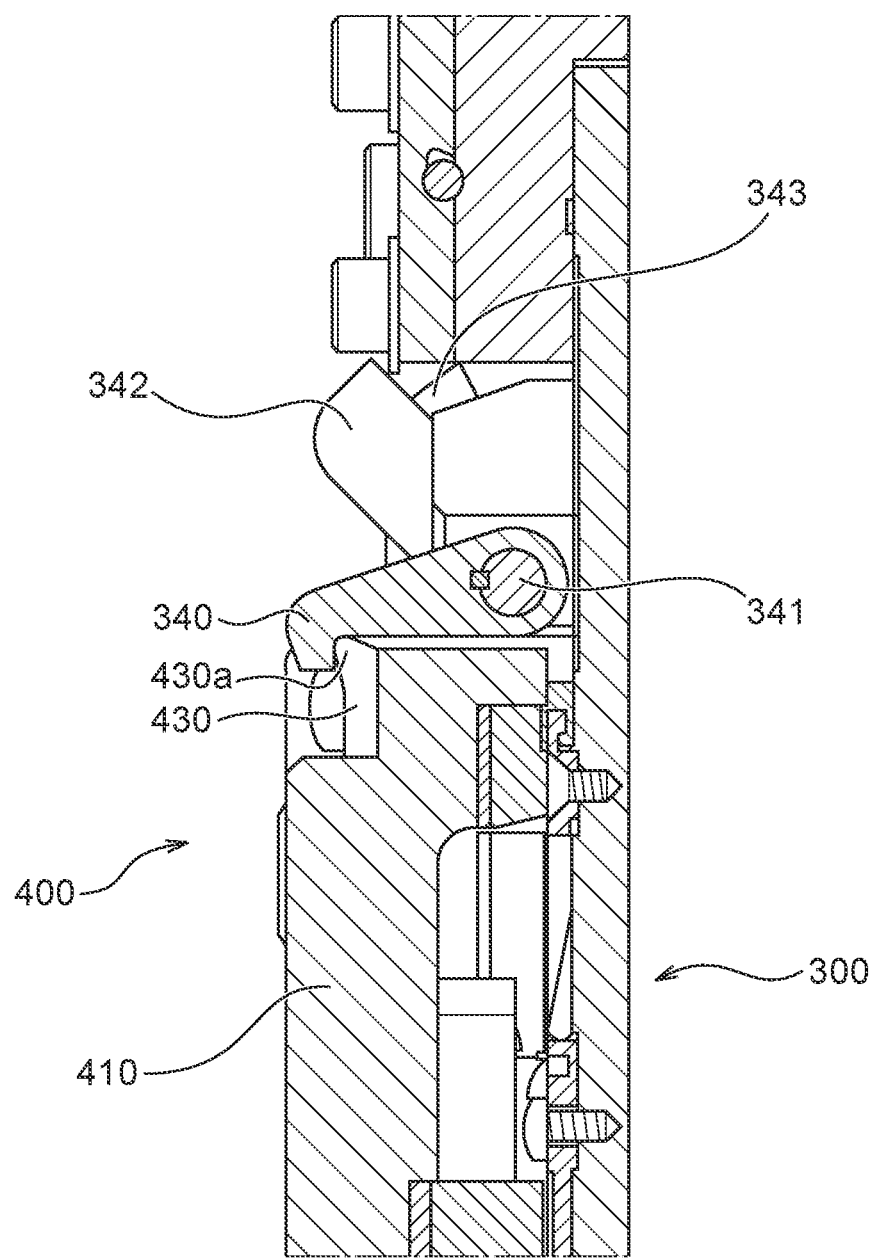
FIG. 9B is a sectional view of the clamp in the clamping position.
Figure 11A:
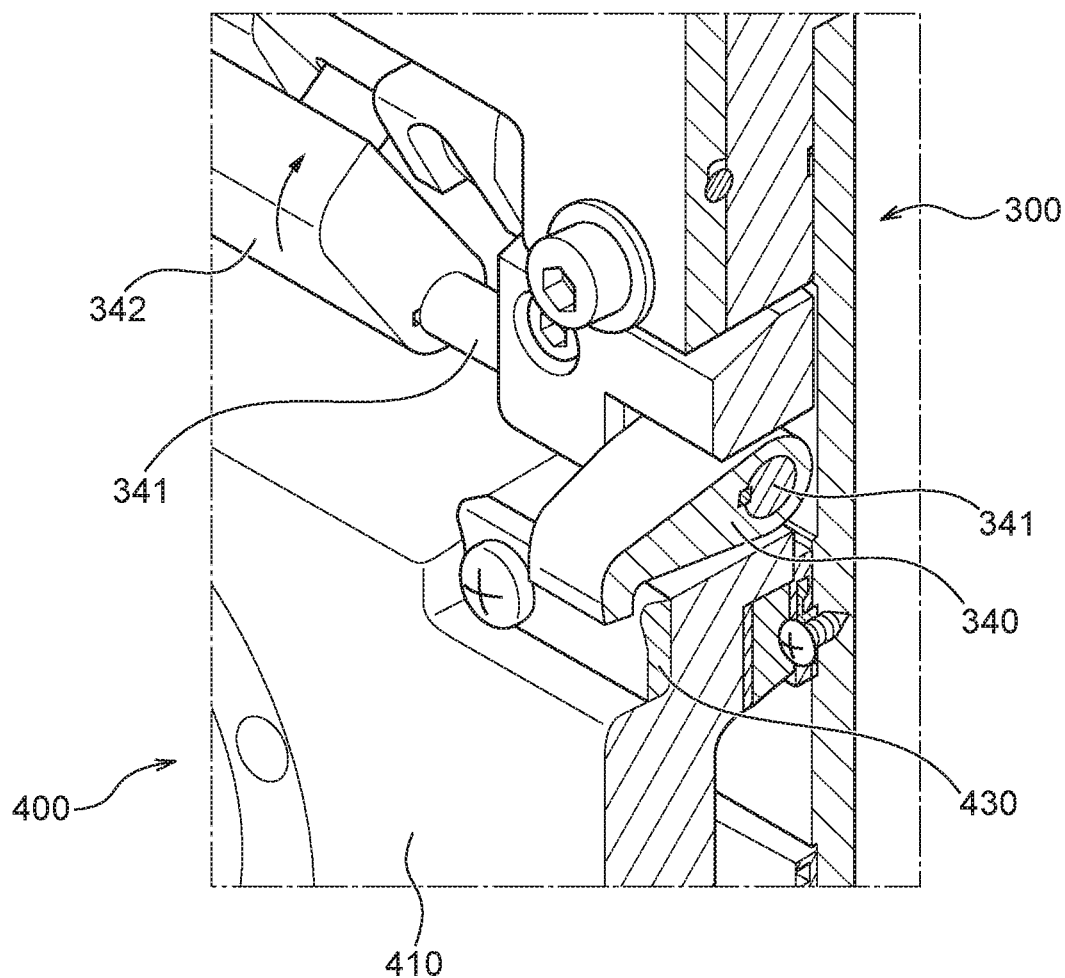
FIG. 11A is a sectional perspective view of the clamp in the unclamping position.
Figure 11B:
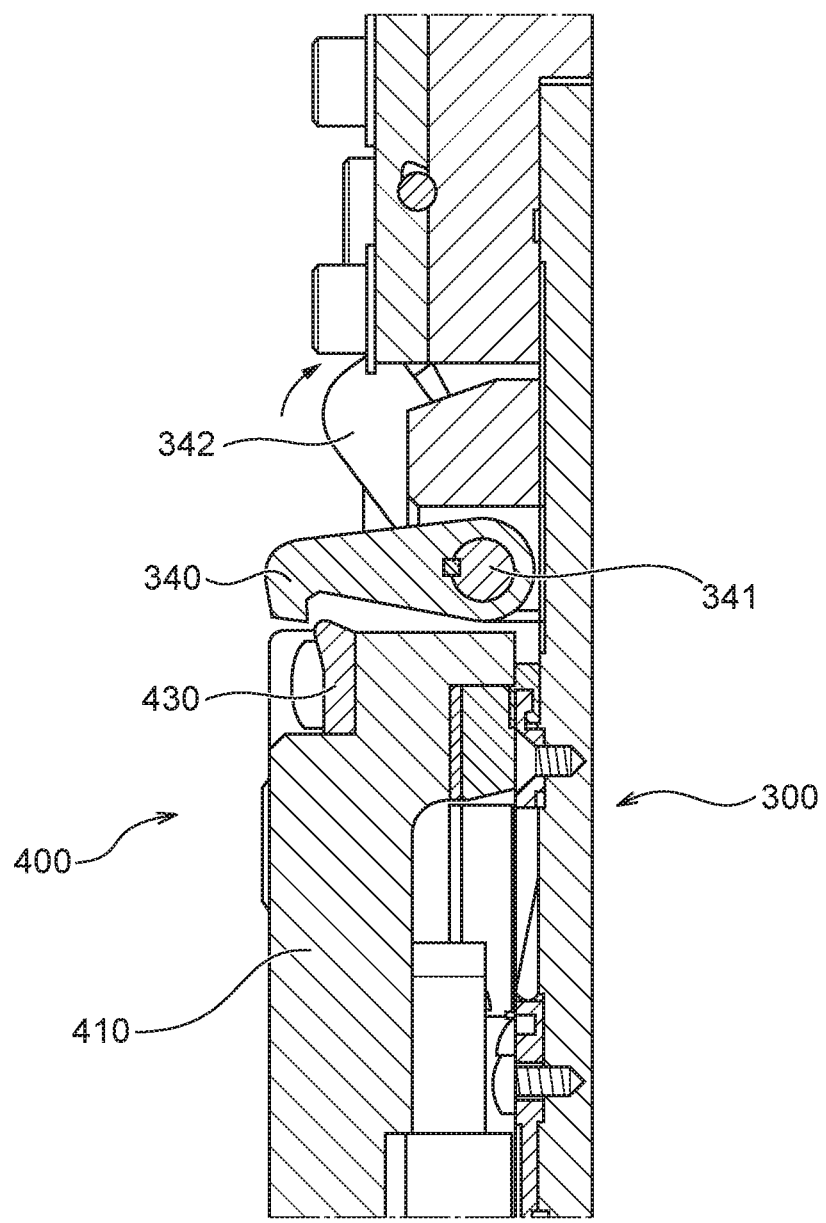
FIG. 11B is a sectional view showing configuration of the clamp in the unclamping position.

FIG. 8A is a perspective view of the clamp in a clamping position. FIG. 8B is a side view of the clamp in the clamping position. FIG. 9A is a sectional perspective view of the clamp in the clamping position. FIG. 9B is a sectional view of the clamp in the clamping position. FIG. 10A is a perspective view showing configuration of the clamp in an unclamping position. FIG. 10B is a side view of the clamp in the unclamping position. FIG. 11A is a sectional perspective view of the clamp in the unclamping position. FIG. 11B is a sectional view showing configuration of the clamp in the unclamping position.

As already stated, the clamp 340 is of a normally-closed type. When the lever 342 is not applied with pressure, the clamp 340 is in a closed position as shown in FIGS. 8A, 8B, 9A, and 9B. At the time of fitting the back plate 400 onto the front plate 300, the lever 342 of the front plate 300 is first applied with pressure by the actuator AR1 (FIG. 10B) to rotate the clamp 340 in the opening direction against a biasing force of the compression spring 343 as shown in FIGS. 10A, 10B, 11A, and 11B. The back plate 400 is placed in a predetermined position in the rear face 302 of the front plate 300 with the clamp 340 opened. At this time, the positioning pins 390 of the front plate 300 are engaged with the through-holes 490a of the positioning pieces 490, thereby positioning the back plate 400 in a predetermined position of the front plate 300.

Secondly, the pressure of the actuator AR1 is removed from the levers 342 of the front plate 300. This causes the levers 342 to rotate toward initial positions due to the biasing force of the compression springs 343, and the clamps 340 rotate in the closing direction. In the result, the engaging parts 340a of the clamps 340 are engaged with the engaging receiving parts 430 of the back plate 400, and the back plate 400 is fastened to the front plate 300 (FIGS. 8A, 8B, 9A, and 9B).

To remove the back plate 400, pressure is applied to the levers 342 of the front plate 300 by actuator, not shown, to rotate the clamps 340 in the opening direction against the biasing force of the compression springs 343 as discussed above (FIGS. 10A, 10B, 11A, and 11B). The clamps 340 are then released from the engaging receiving parts 430, and the back plate 400 can be removed from the front plate 300.

(Attachment Structure for Attaching the Substrate to the Back Plate)

Figure 12A:
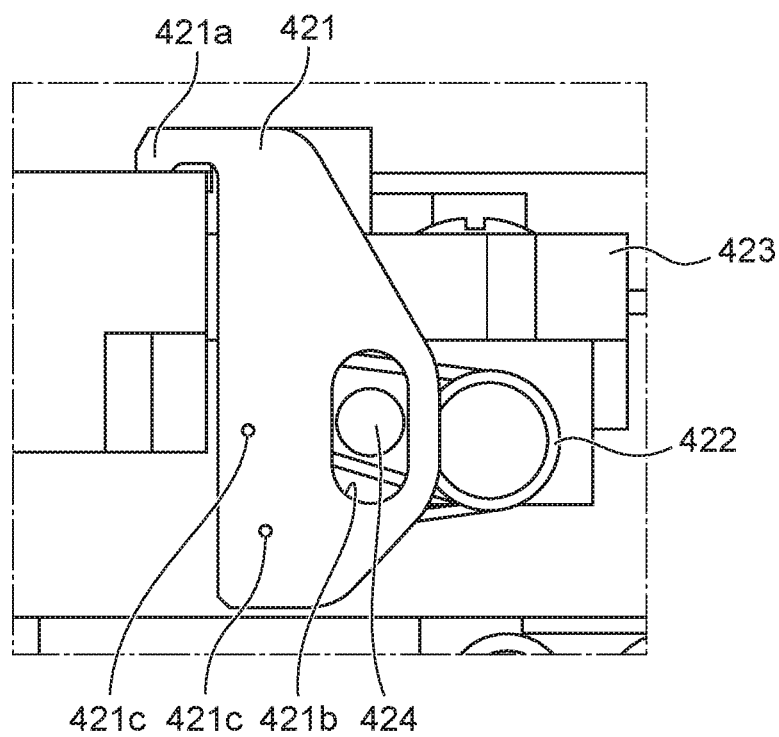
FIG. 12A is a partially-cutaway side view of a clip of the back plate.
Figure 12B:
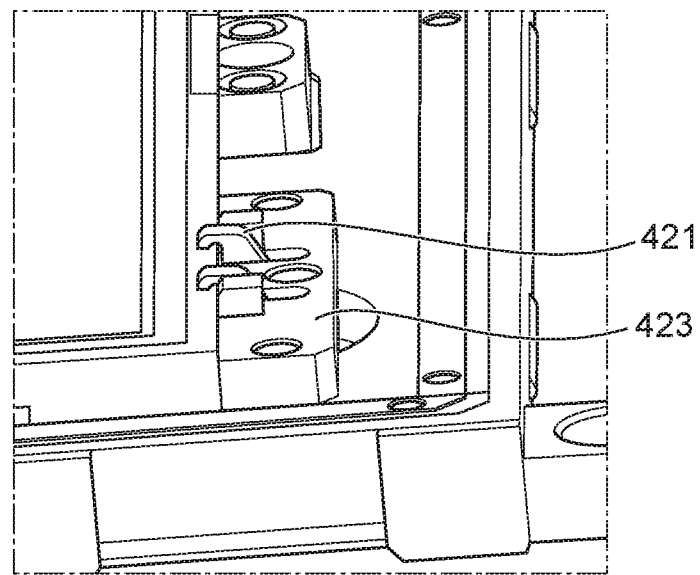
FIG. 12B is a partially-enlarged perspective view of the clip of the back plate.
Figure 13A:
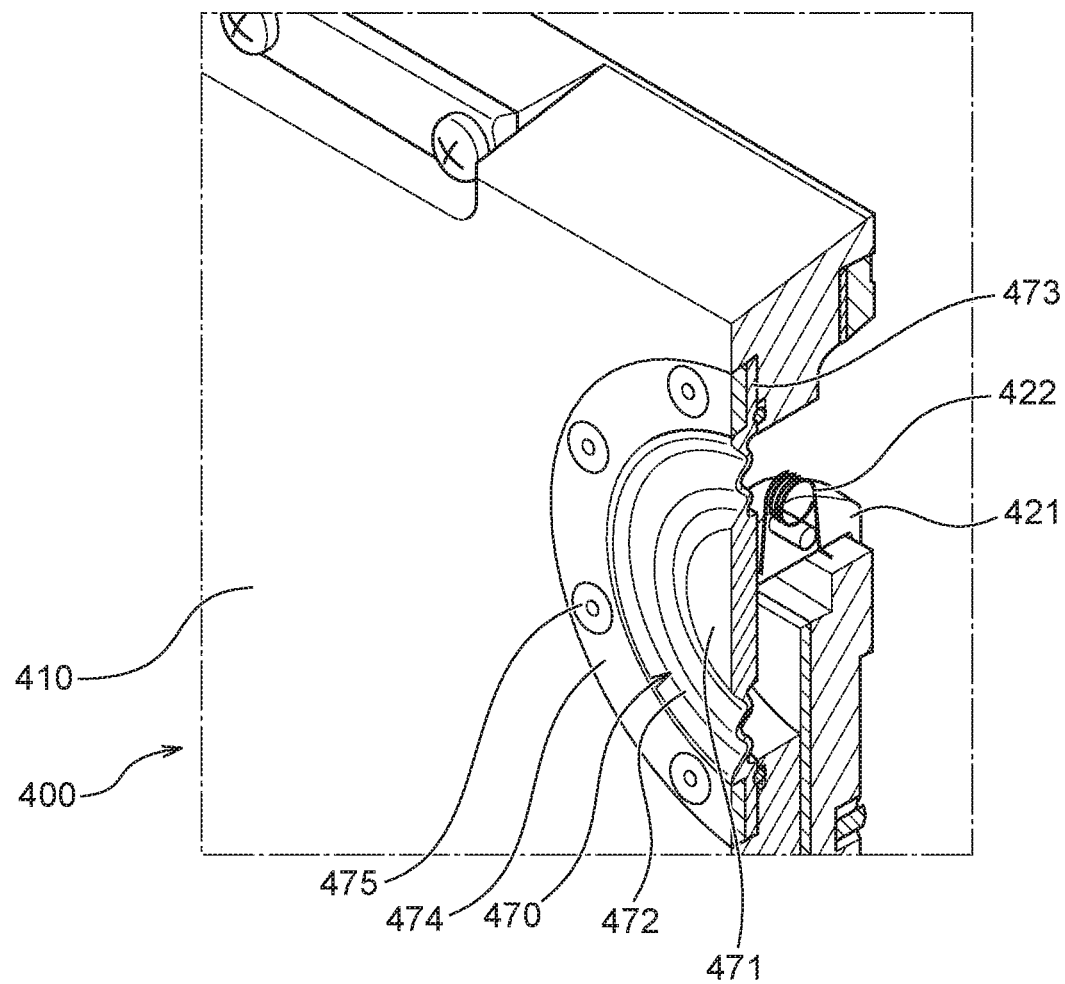
FIG. 13A is a partially-cutaway perspective view showing a state of the clip in a closed position.
Figure 13B:
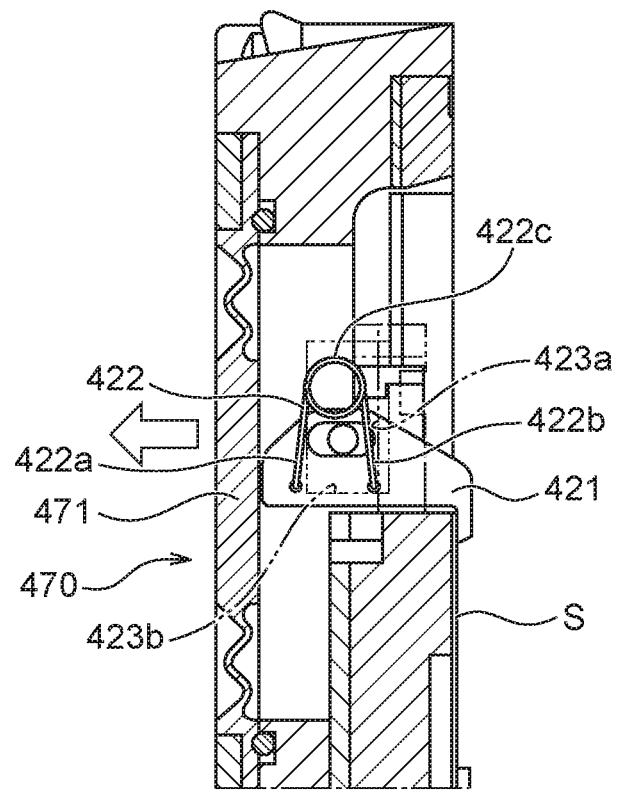
FIG. 13B is a partially-cutaway sectional view showing the state of the clip in the closed position.
Figure 14A:
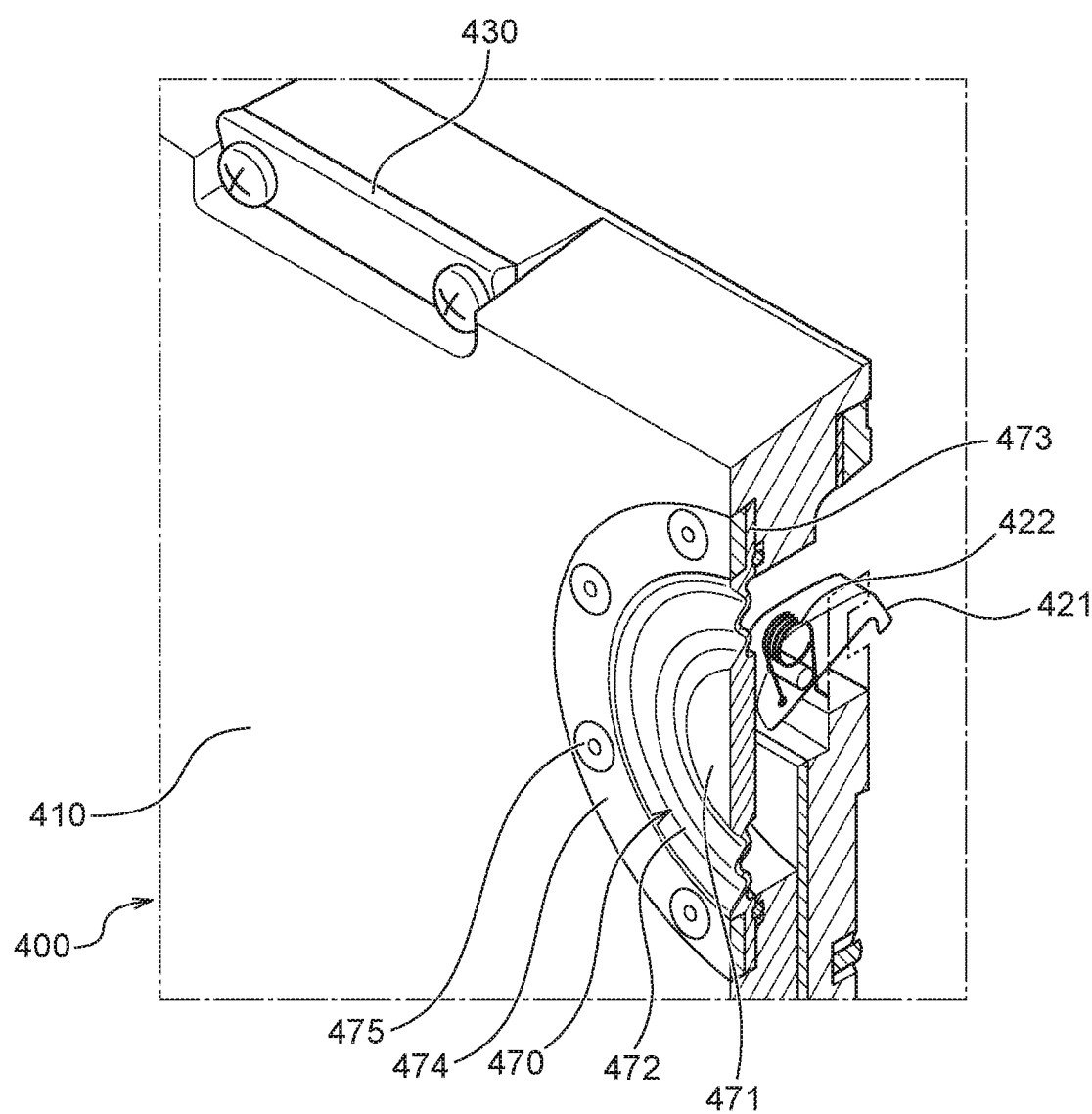
FIG. 14A is a partially-cutaway perspective view showing the state of the clip in an open position.
Figure 14B:
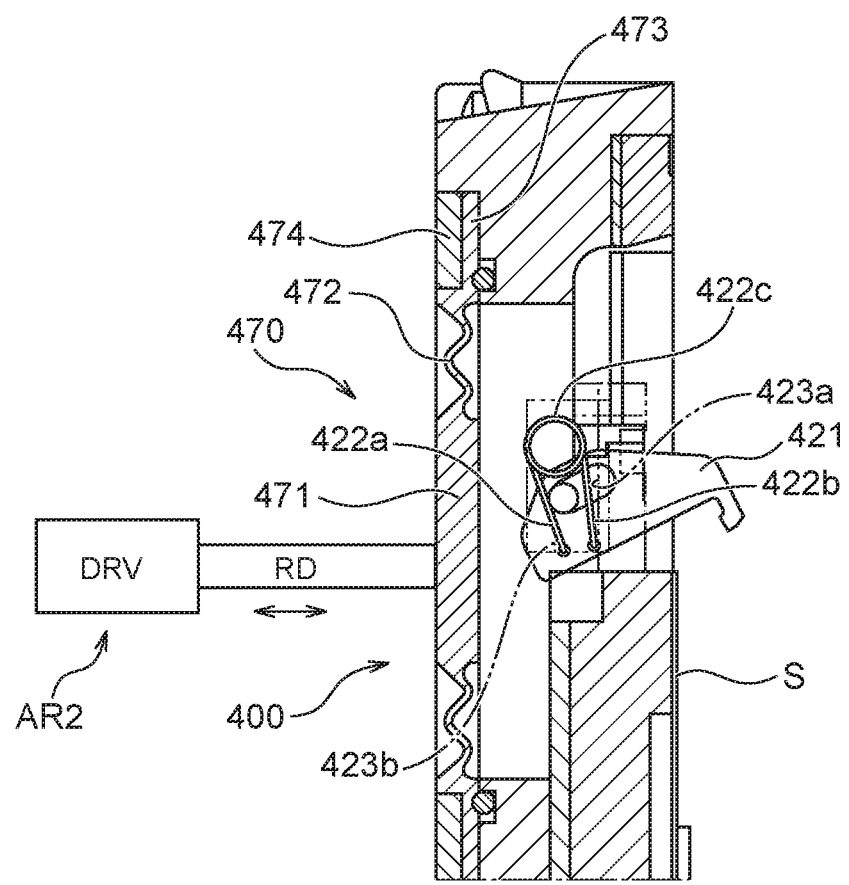
FIG. 14B is a partially-cutaway sectional view showing the state of the clip in the open position.

FIG. 12A is a partially-cutaway side view of a clip of the back plate. FIG. 12B is a partially-enlarged perspective view of the clip of the back plate. FIG. 13A is a partially-cutaway perspective view showing a state of the clip in a closed position. FIG. 13B is a partially-cutaway sectional view showing the state of the clip in the closed position. FIG. 14A is a partially-cutaway perspective view showing the state of the clip in an open position. FIG. 14B is a partially-cutaway sectional view showing the state of the clip in the open position.

The front face 401 of the back plate 400 is provided with eight clip parts 420 to correspond to sides of the substrate S (see FIG. 5A). The rear face 402 of the back plate 400 is provided with buttons 470 in corresponding positions to the clip parts 420 (see FIG. 5B). When the button 470 is not applied with force, a face of the button 470, Which is on the front face 401 side, is located away with a predetermined clearance from proximal ends of the two clips 421 (FIG. 13B). The button 470 has a force receiving part 471, an elastic portion 472 which displaceably supports the force receiving part 471 against the back plate main body 410, and an attachment part 473 which is disposed in an outer periphery of the elastic portion 472. The button 470 is secured in the attachment part 473 by a pressing member 474 and a fastening member 475. The fastening member 475 is, for example, a stud, a bolt or the like.

As shown in FIGS. 12A and 12B, the clip part 420 includes a fixed part 423 which is fixed to the front face 401 of the back plate 410, a fixed shaft 424 which is fixed to the fixed part 423 so as not to be rotatable, two clips 421 supported on the fixed shaft 424 such that the clips 421 are rotatable while moving translationally, and a spiral spring 422 provided to the clip 421 to bias the clip 421 in a closing direction.

The clip 421 has a claw 421a in a distal end thereof. An elongate hole 421b and two circular holes 421c are formed in a proximal end of the clip 421. The clip 421 is mounted by inserting the fixed shaft 424 in the elongate hole 421b. As shown in FIG. 13B, the spiral spring 422 has a spiral part 422c and legs 422a and 422b extending from the spiral part 422c. The spiral spring 422 is formed by coiling a wire or the like in a circle more than once, and leaving predetermined-length portions of the wire as the legs 422a and 422b. The leg 422a has a bent part in a distal end thereof. The bent part is bent substantially at a right angle. The bent part is inserted and fitted into the circular hole 421c formed in one of the two circular holes 421c of the clip 421, which is located close to the proximal end of the clip 421. The other leg 422b has a bent part in a distal end thereof. The bent part of the leg 422b is not fixed to the clip 421 and bent substantially at a right angle. The bent part of the leg 422b is supported in contact with a regulation face 423a which is provided to the fixed part 423. The leg 422a is guided by a guide face 423b provided to the fixed part 423 (FIGS. 13B and 14B).

The foregoing configuration enables the clip 421 to move in a direction away from the back plate main body 410 and simultaneously rotate toward the outside of the back plate main body 410 (from FIG. 13B to FIG. 14B). In the result, the clip 421 conies into the open position. The clip 421 is further allowed to move, conversely, in a direction approaching the back plate main body 410 and simultaneously rotate toward the inside of the back plate main body 410 (from FIG. 149 to FIG. 13B). The clip 421 then comes into the closed position (FIGS. 13A and 13B). In the present embodiment, when not applied with force from outside, the clip 421 is biased in the closing direction by the spiral spring 422, so that the clip 421 is of a normally-closed type (FIGS. 13A and 13B). To avoid complication of the figure, 14B shows a state in which the force receiving part 471 of the button 470 is not displaced. In practice, however, the force receiving part 471 is displaced toward the clip 421 to press the clip 421, and the clip 421 is in the open position due to the pressure.

When the substrate S is placed on the back plate 400, the eight buttons 470 (force receiving parts 471) of the back plate 400 are applied with pressure from outside using an actuator AR2 (FIG. 14B). This causes the force receiving part 471 to be displaced to the front face 401 side and come into contact with the proximal ends of the two clips 421 as shown in FIGS. 14A and 14B. Due to the force from the force receiving part 471, the clips 421 move in a direction away from the back plate main body 410 and simultaneously rotate toward the outside of the back plate main body 410, thereby coming into the open position (FIG. 14B). As schematically shown in FIG. 14B, the actuator AR2 includes, for example, a drive DRY such as an air cylinder and a motor, and a rod-like member RD which is driven by the drive DRV. The actuator AR2 comprises eight actuators AR2 to correspond to the eight buttons 470. Preferably, the eight actuators AR2 are simultaneously driven to push the buttons 470. However, the eight actuators AR2 may be separately driven and do not necessarily have to be driven at the same time.

The substrate S is placed in a predetermined position in the front face 401 of the back plate 400 with the clip 421 opened. Pressure applied by the actuators AR2 is released from the buttons 470. Due to the basing force of the spiral spring 422, the clip 421 moves in a direction approaching the back plate main body 410 and simultaneously rotates toward the inside of the back plate main body 410 to come into the closed position (from FIG. 14B to FIG. 13B). At this time, the claw 421a in the distal end of the clip 421 is engaged with a rim of the substrate S, which enables the substrate S to be fixed to the front face 401 of the back plate 400.

The back plate 400 mounted with the substrate S in the above-described manner is attached to the front plate 300 as explained with reference to FIGS. 5 to 13, and the attachment of the substrate S to the substrate holder 1 is completed. The substrate S can be removed from the back plate 300 by applying pressure from outside to the eight buttons 470 (force receiving part 471) of the back plate 400 by the actuator AR2 as already stated (FIGS. 14A and 14B).

In the present embodiment, the clip 421 is configured to rotate around the fixed shaft 424 parallel to the faces 401 and 402 of the back plate main body 410. However, the clip 421 may be configured to reciprocate in a perpendicular direction to the faces 401 and 402 of the back plate main body 410 to clamp the substrate S.

(Configuration of Seals)

Figure 15:
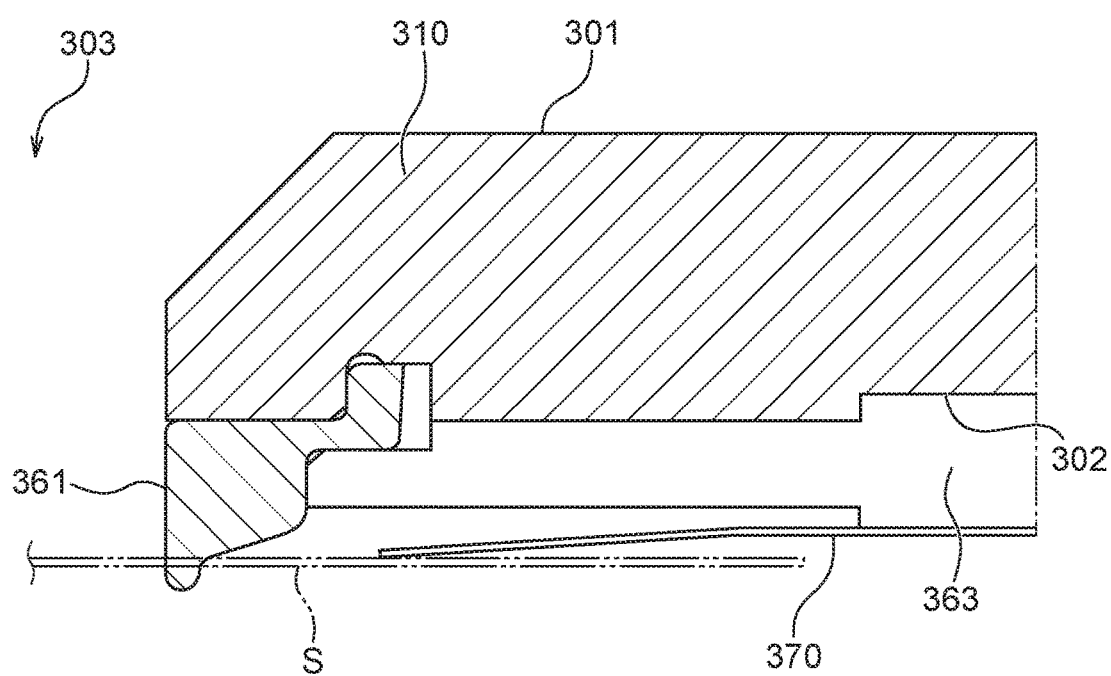
FIG. 15 is a sectional view of an inner seal of a front plate.
Figure 16:
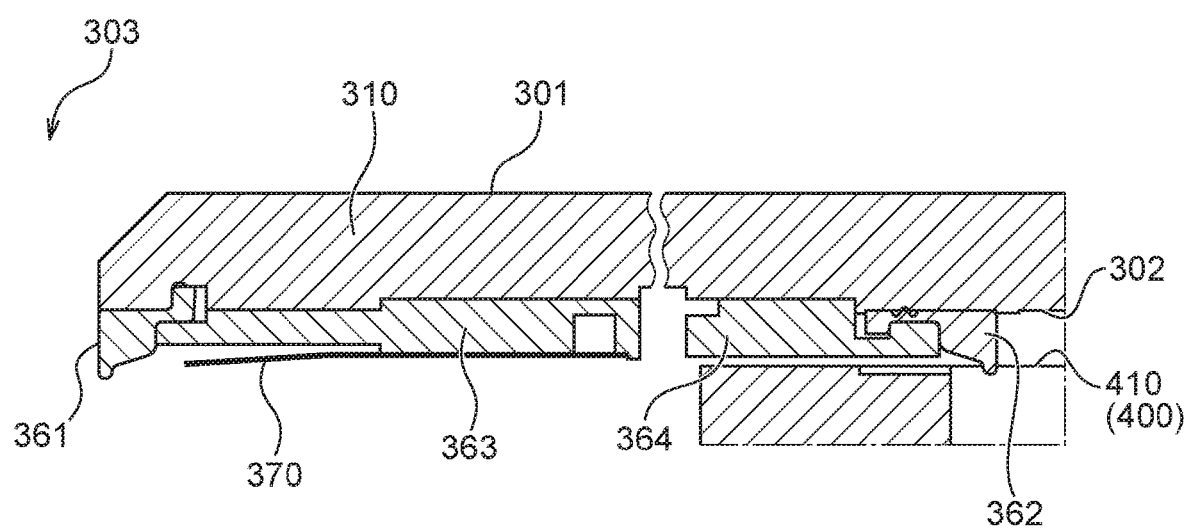
FIG. 16 is a sectional view showing the inner seal and an outer seal of the front plate.

FIG. 15 is a sectional view of an inner seal of the front plate. FIG. 16 is a sectional view showing the inner seal and an outer seal of the front plate.

The rear face 302 of the front plate 300 is provided with an inner seal 361 adjacent to the opening 303. The inner seal 361 is attached to the rear face 302 of the front plate 300 by a seal holder 363. The inner seal 361 seals a gap between the substrate S and the front plate 300 to prevent the plating liquid from entering an edge portion of the substrate S. The seal holder 363 is attached with a contact 370 for supplying potential to the substrate S.

As shown in FIG. 16, an outer seal 362 is attached to the rear face 302 of the front plate 300 by the seal holder 364 to be located outside the inner seal 361. The outer seal 362 comes into contact with the back plate 400 to seal a gap between the front plate 300 and the back plate 400.

In the present embodiment, the seal holders 363 and 364 for attaching the inner seal 361 and the outer seal 362 are formed of different members, so that the inner seal 361 and the outer seal 362 can be separately replaced.

Figure 17:
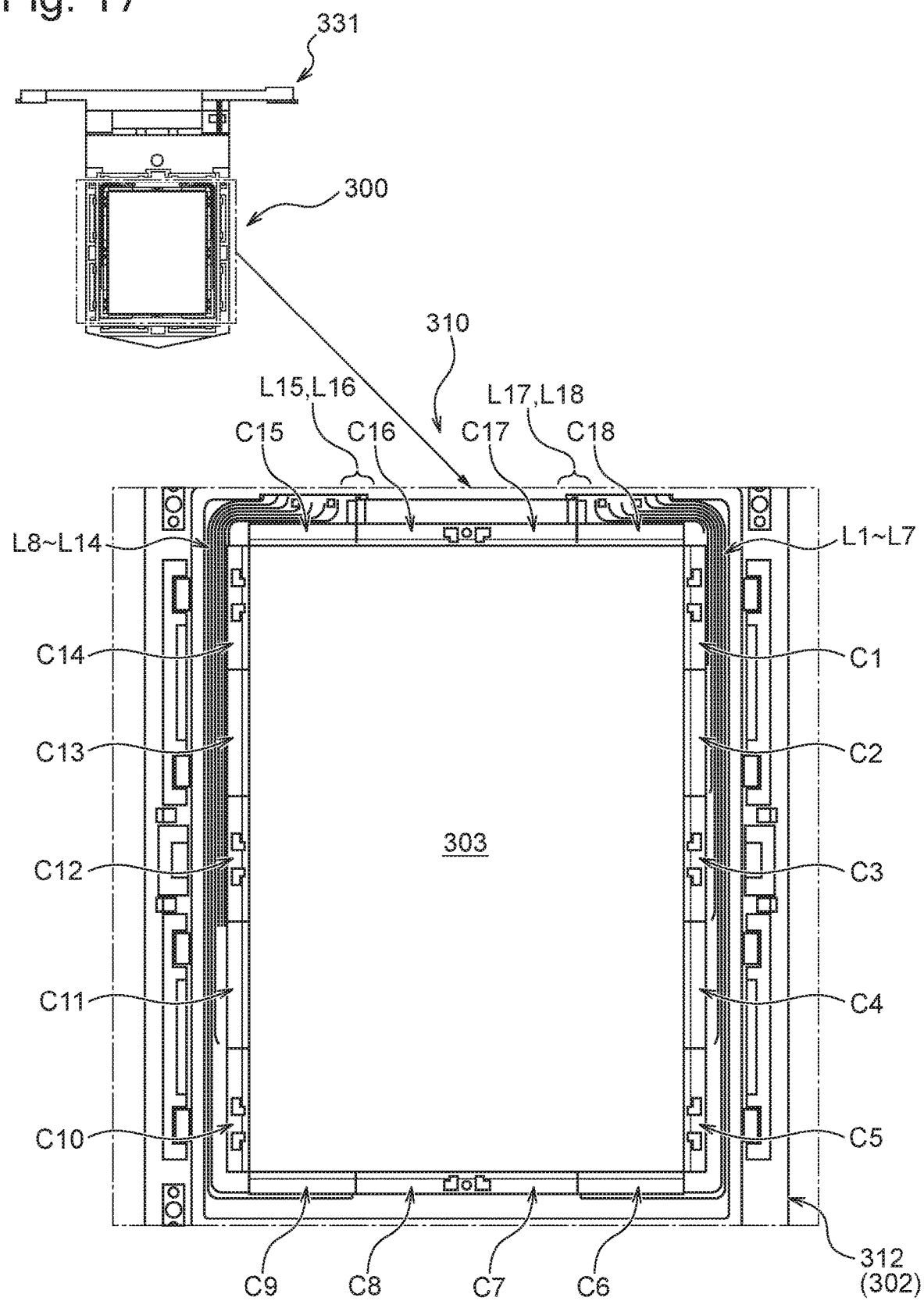
FIG. 17 is a rear view of a front plate main body.
Figure 18:
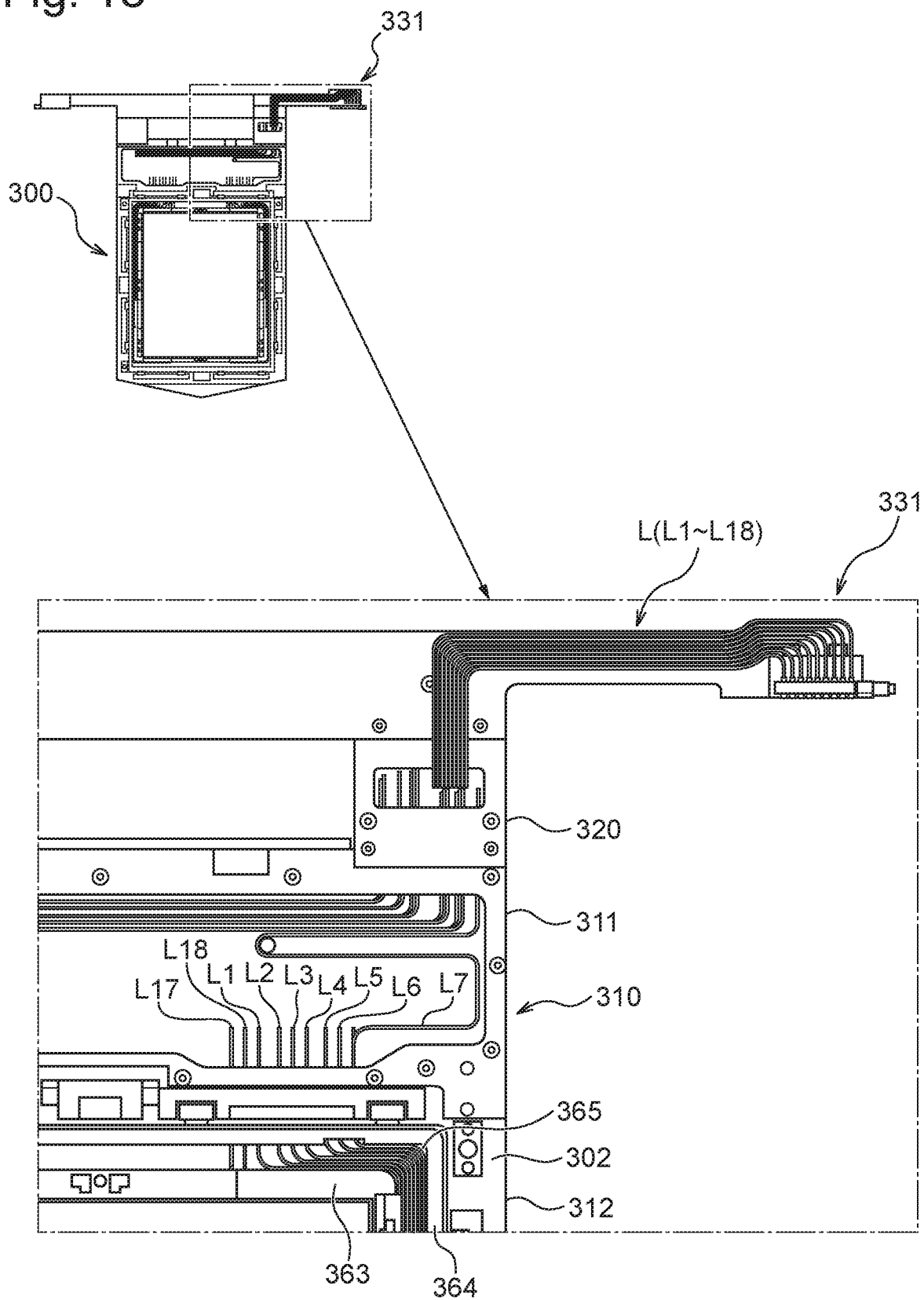
FIG. 18 is a partially-enlarged plan view of an area including a connector of the front plate.
Figure 19A:
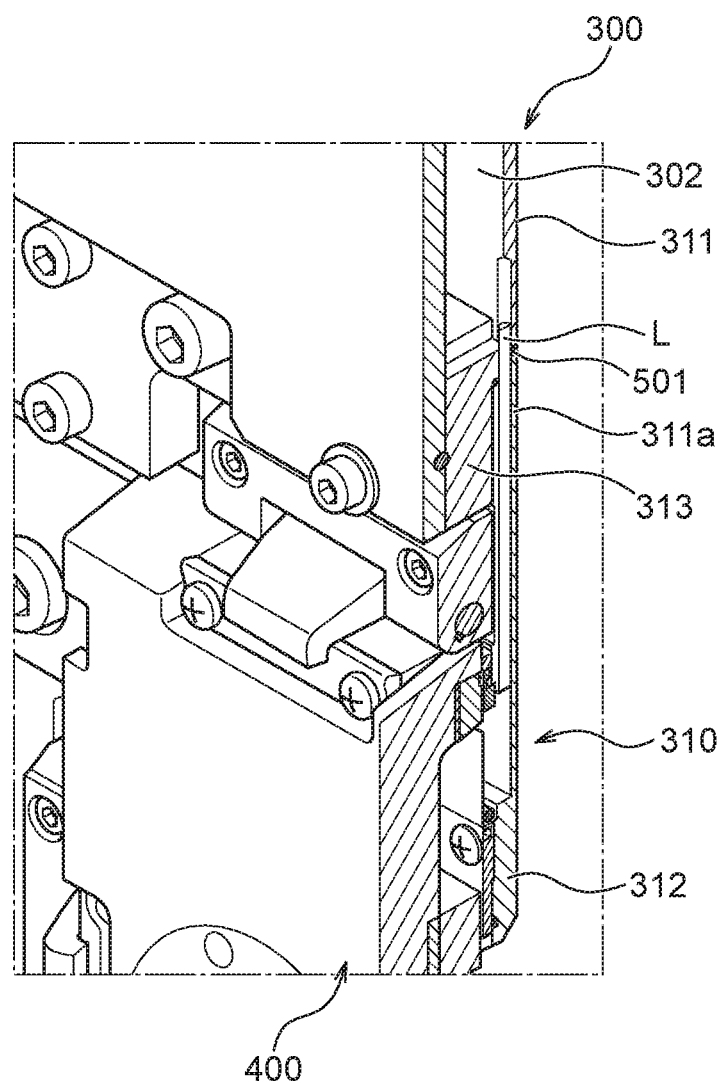
FIG. 19A is a sectional perspective view of a front panel.
Figure 19B:
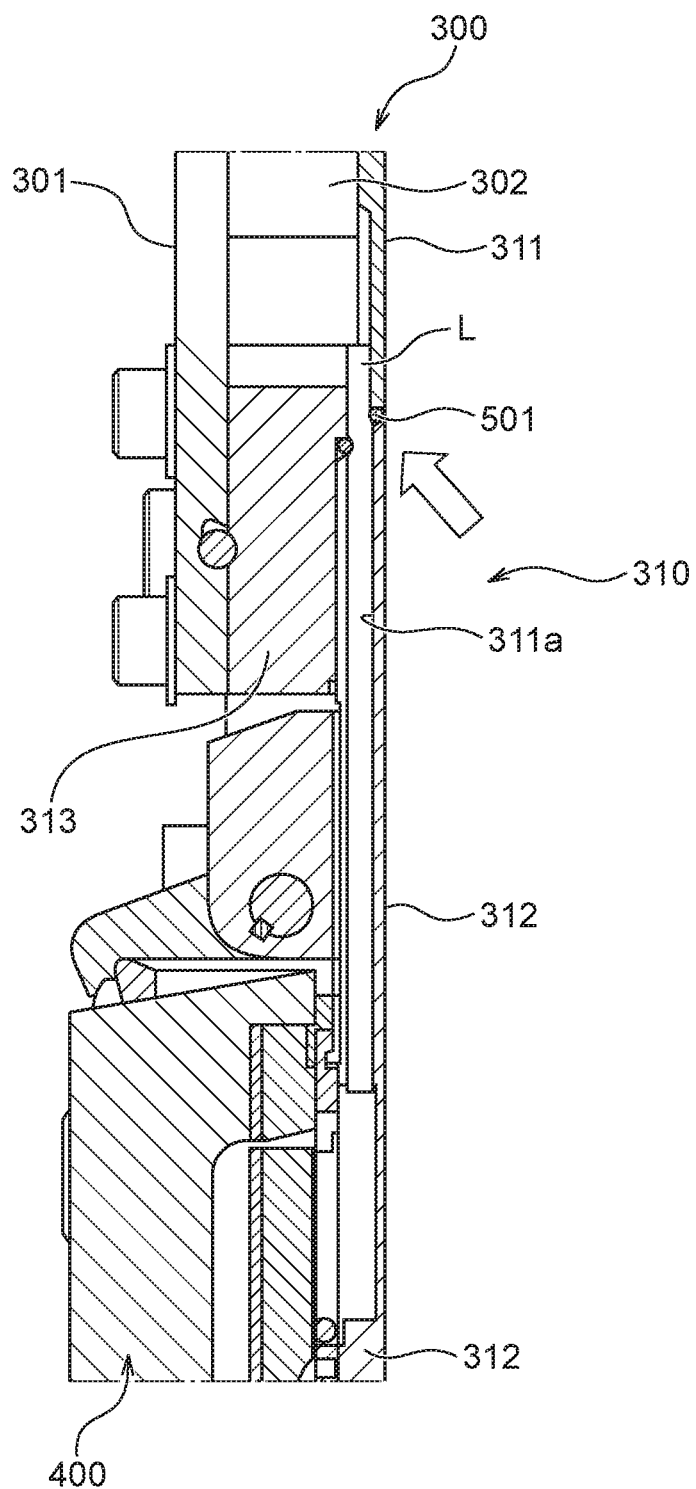
FIG. 19B is a sectional view of the front panel.
Figure 19C:
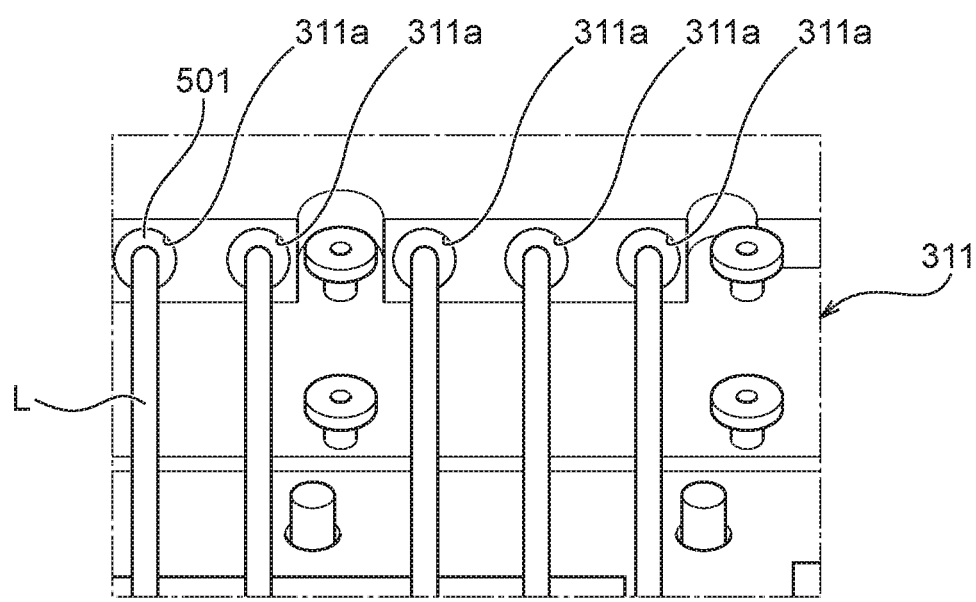
FIG. 19C is a partially-enlarged perspective view of the front panel, which shows cable layout.
Figure 20A:
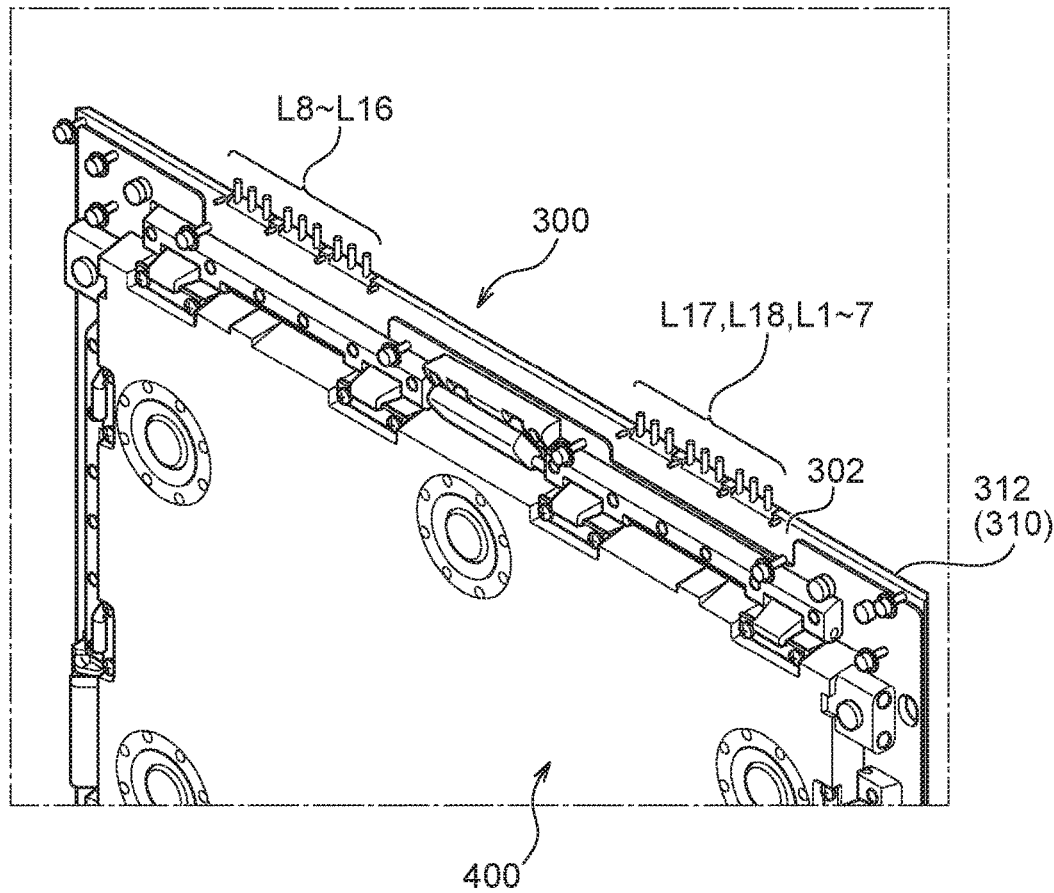
FIG. 20A is a perspective view showing cable entry positions in a face part and the vicinity thereof with a wiring buffer part omitted from the figure.
Figure 20B:
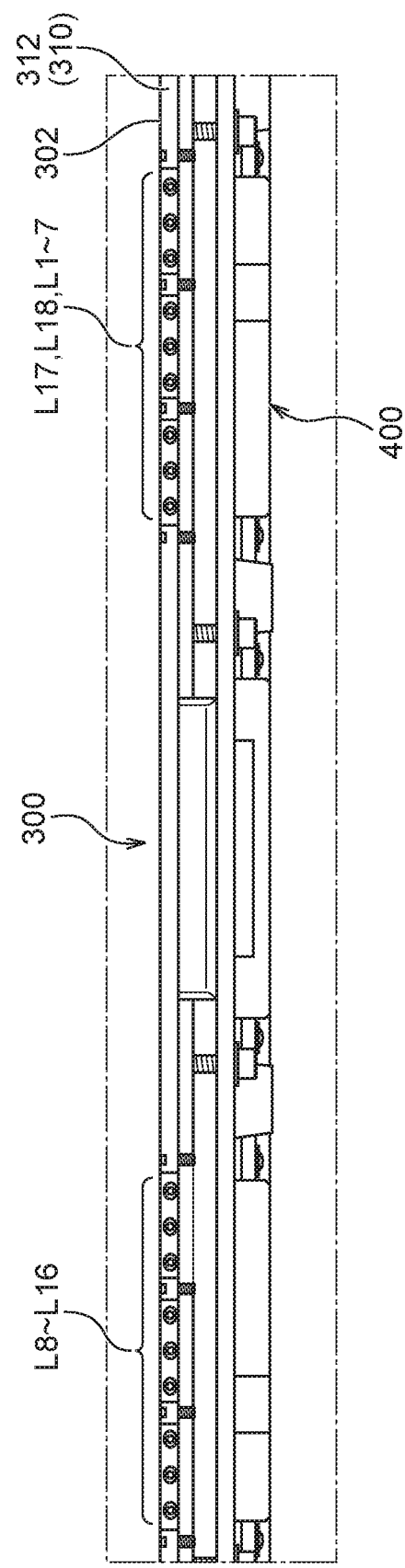
FIG. 20B is a top view of the cable entry positions in the face part and a vicinity of the cable entry positions with the wiring buffer part omitted from the figure.
Figure 20C:
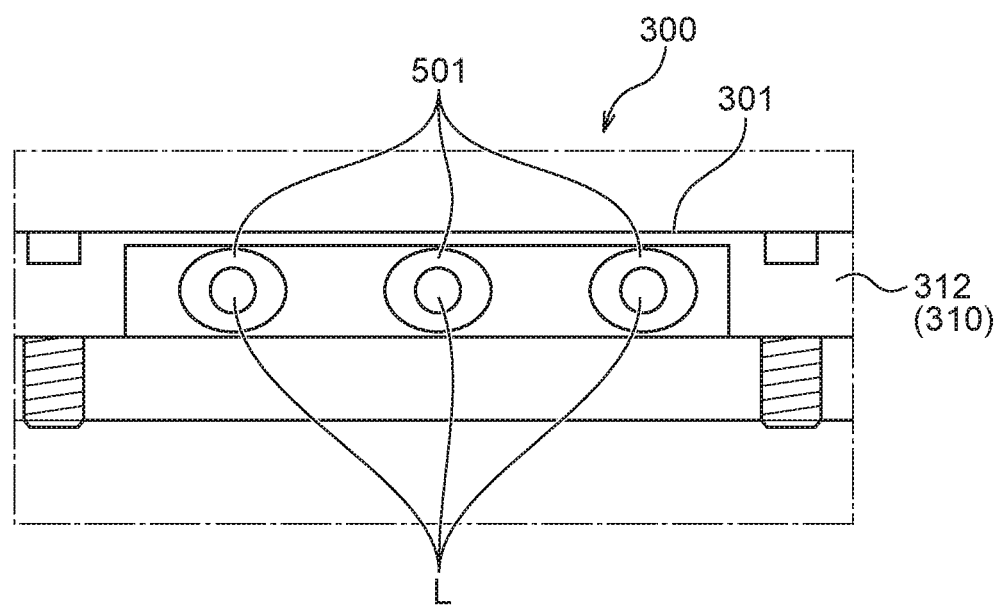
FIG. 20C is an enlarged view of the top view of the cable entry positions in the face part and the vicinity thereof with the wiring buffer part omitted from the figure.

FIG. 17 is a rear view of the front plate main body. FIG. 18 is a partially-enlarged plan view of an area including the connector of the front plate. FIG. 19A is a sectional perspective view of the front panel. FIG. 19B is a sectional view of the front panel. FIG. 19C is a partially-enlarged perspective view of the front panel, which shows cable layout. FIG. 20A is a perspective view showing cable entry positions in the face part and the vicinity thereof with the wiring buffer part omitted from the figure. FIG. 20B is a top view of the cable entry positions in the face part and a vicinity of the cable entry positions with the wiring buffer part omitted from the figure. FIG. 20C is an enlarged view of the top view of the cable entry positions in the face part and the vicinity thereof with the wiring buffer part omitted from the figure.

The rear face 302 of the front plate main body 310 has 18 contact zones C1 to C18. The contact zones C1 to C7, C17 and C18 are disposed in a half zone (first zone, that is, a right-side zone in FIG. 17) of the face part 312, which is located close to the connector 331 side. The contact zones C8 to C16 are disposed in a half zone (second zone, that is, a left-side zone in FIG. 17) of the face part 312, which is located far from the connector 331. For convenience, the cables disposed in the first zone may be referred to as first group cables, and the cables disposed in the second group may be referred to as second group cables, in the following explanation.

The contact zones C1 to C18 each include a contact (contact member) 370, shown in FIGS. 15 and 16, for feeding power to the substrate S. The contacts 370 of the contact zones C1 to C18 are fed with power from outside through cables L1 to L18. In the following explanation, the cables L1 to L18 may be collectively referred to as cables L if it is not necessary to distinguish the cables from one another. Furthermore, any of the cables may be referred to as a cable L.

The cables L1 to L18 each have a first end which is connected to the connector 331 disposed in the one end of the arm 330. More specifically, in the connector 331, the cables L1 to L18 are electrically connected to respective contacts or divided into bundles consisting of a plurality of the cables L and electrically connected to common external connection contacts 331a1 and 331a2. The cables L1 to L18 are electrically connectable to an external power source (power circuit, power-supply unit, etc.) through each contact of the connector 331.

Figure 27A:
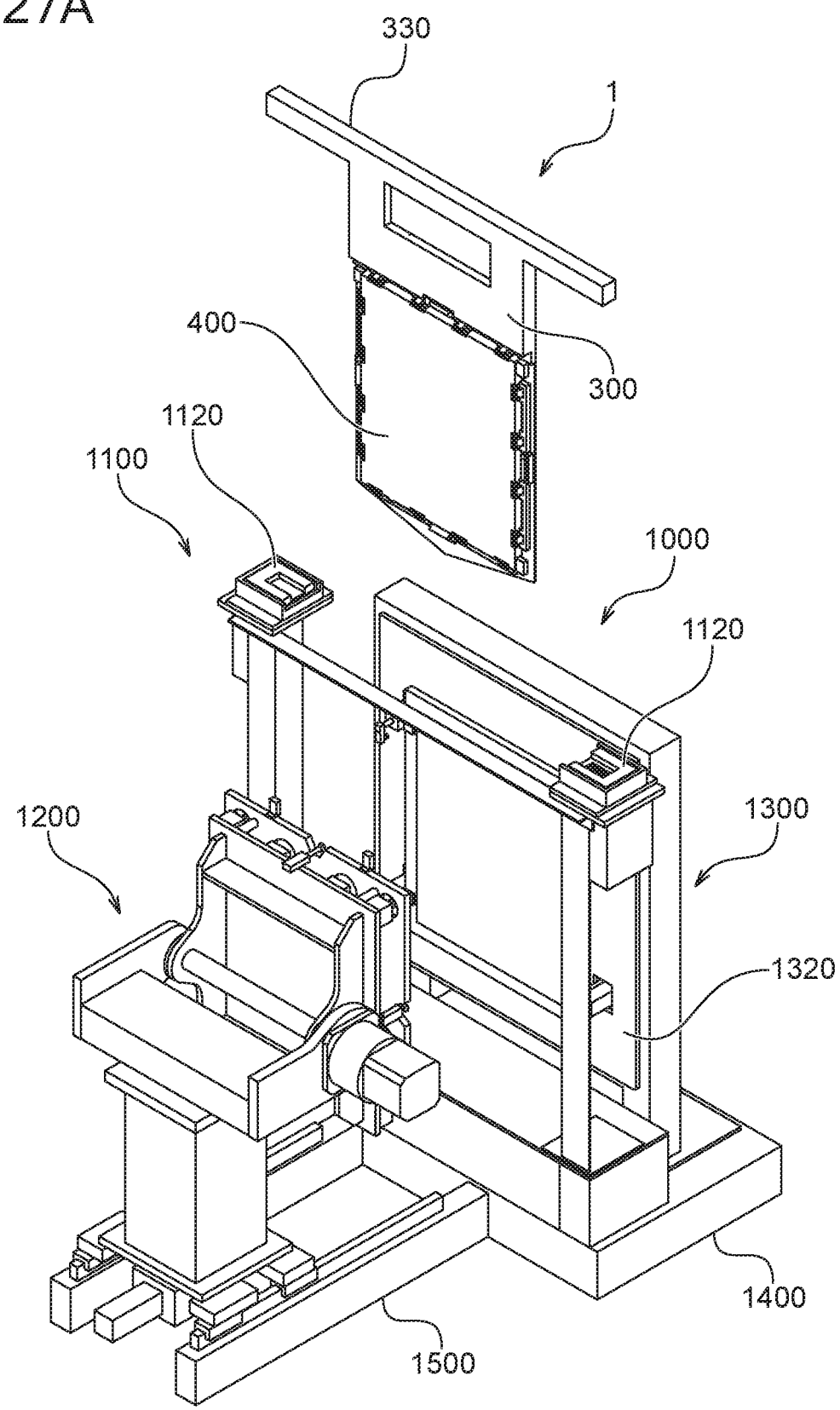
FIG. 27A is a perspective view of the substrate attachment/detachment device before receiving the substrate holder.
Figure 27B:
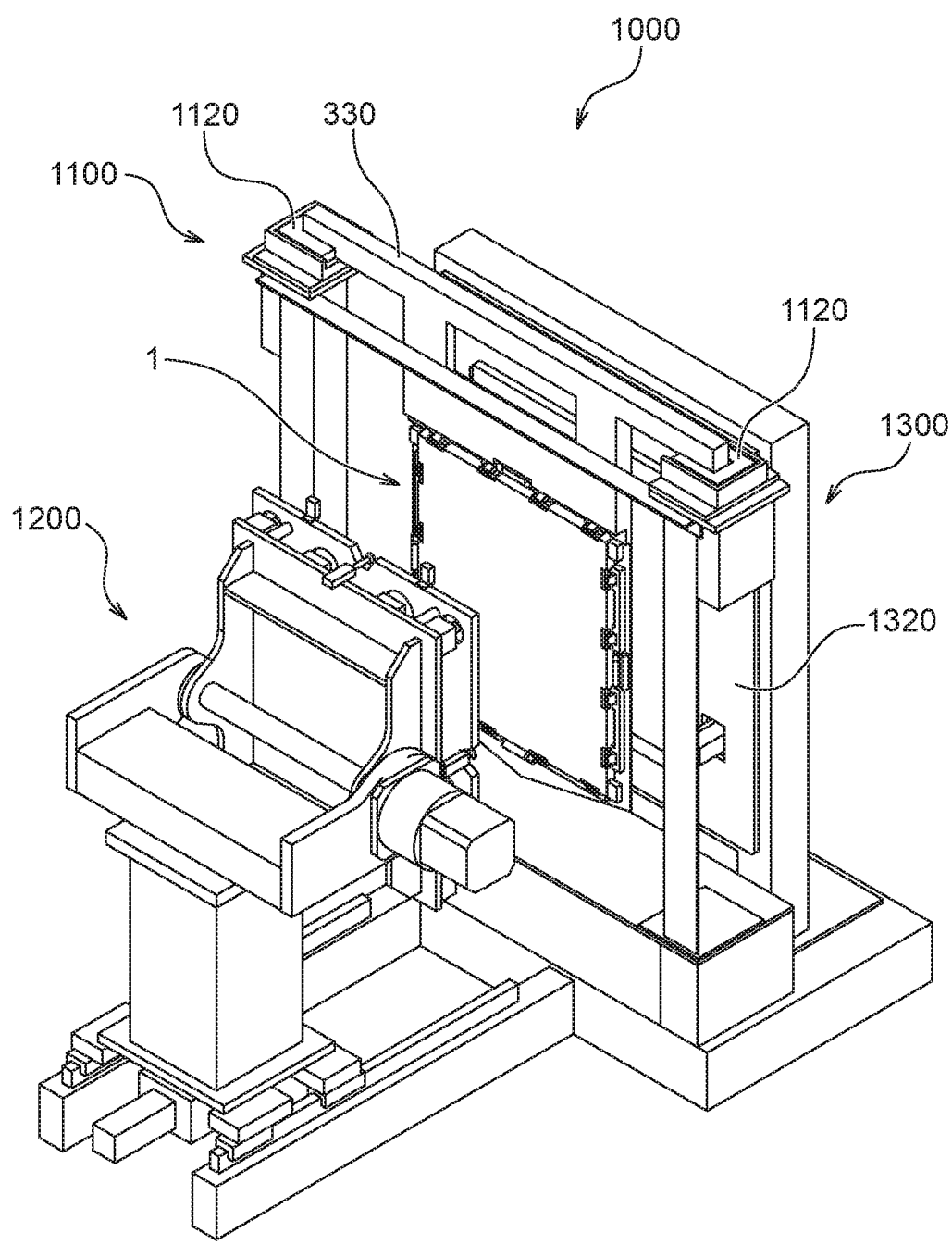
FIG. 27B is a perspective view of the substrate attachment/detachment device after receiving the substrate holder.
Figure 27C:
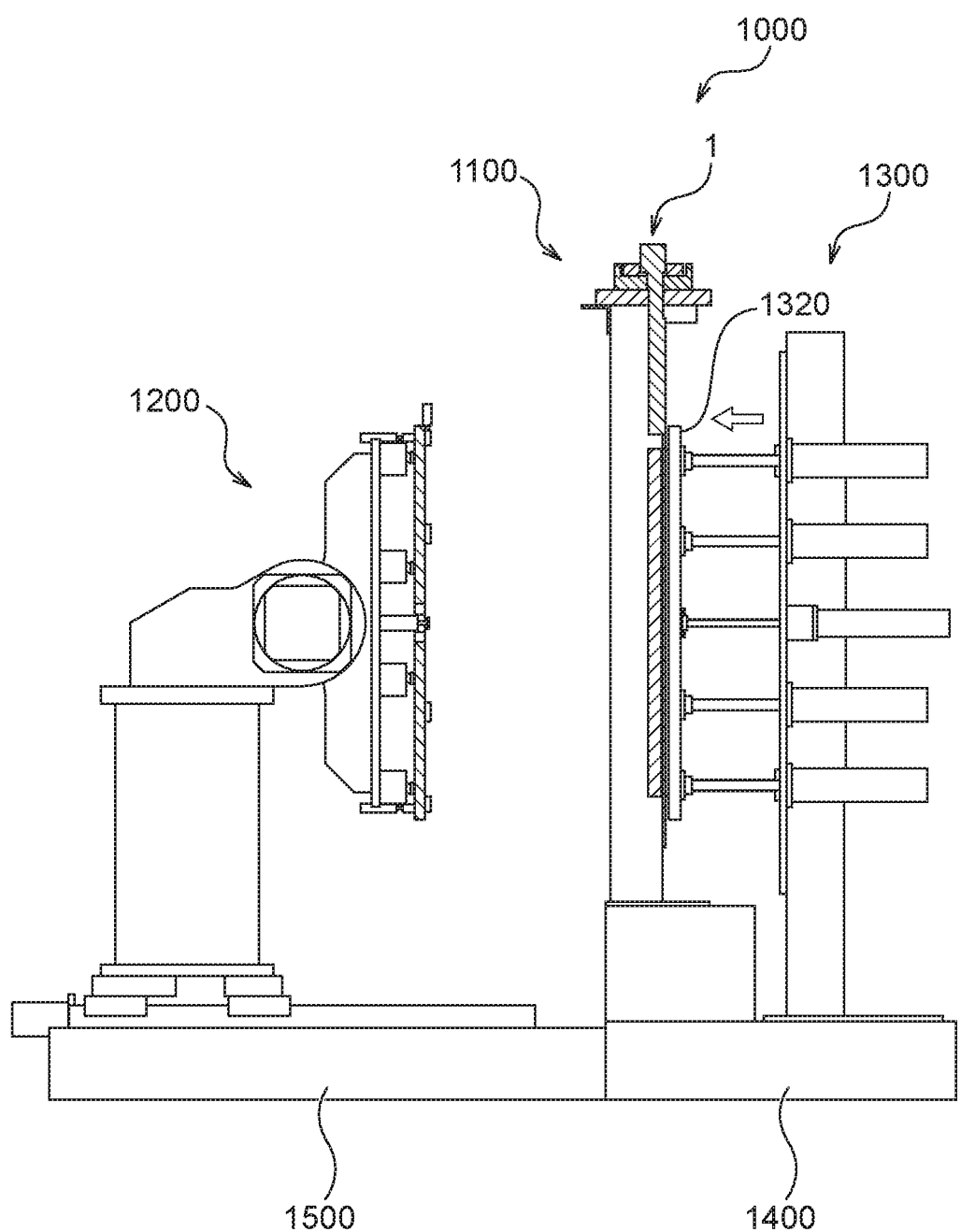
FIG. 27C is a side view of the substrate attachment/detachment device with the substrate holder supported and fixed by the supporting device.
Figure 27D:
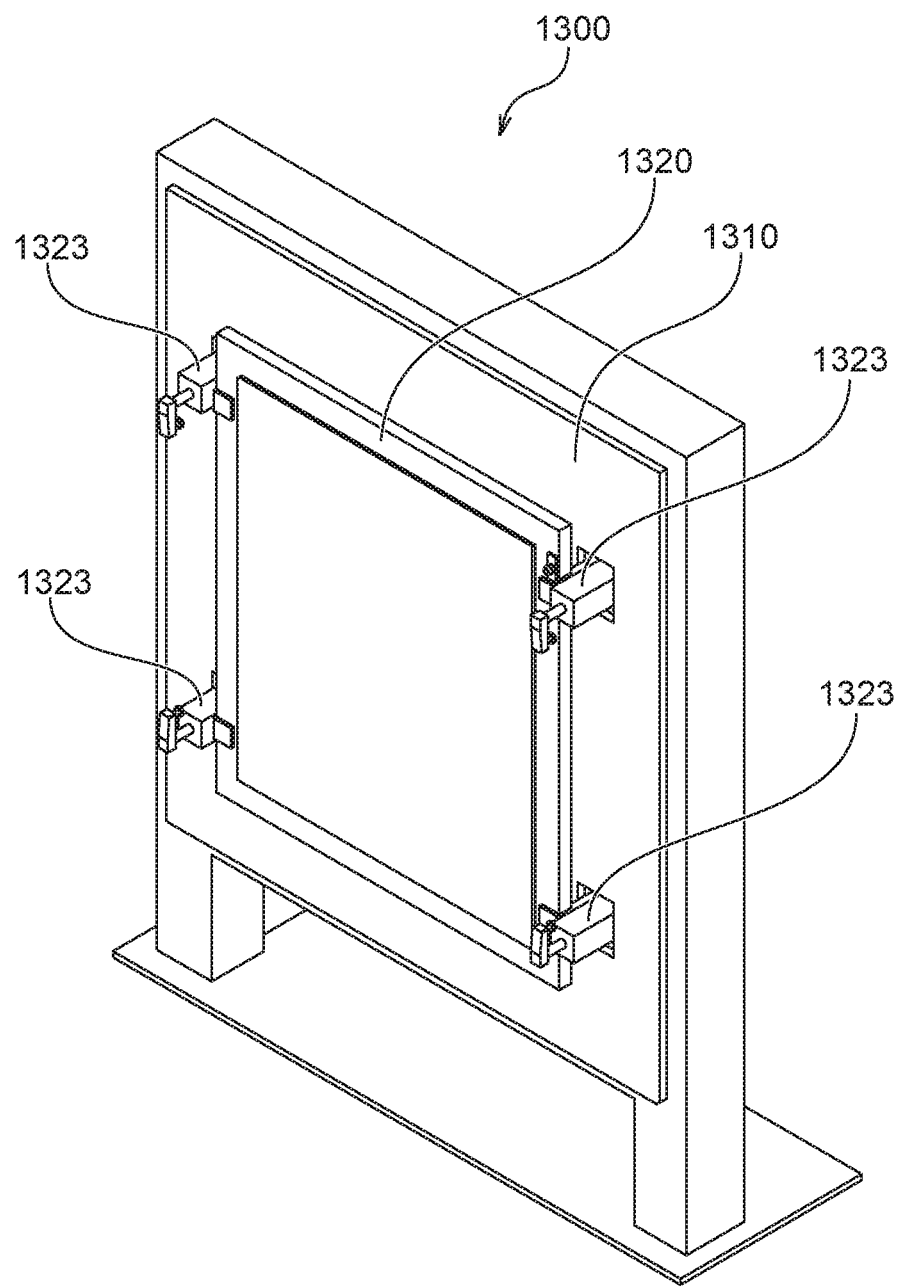
FIG. 27D is a perspective view of the supporting device in a state where the support plate is retracted.
Figure 27E:
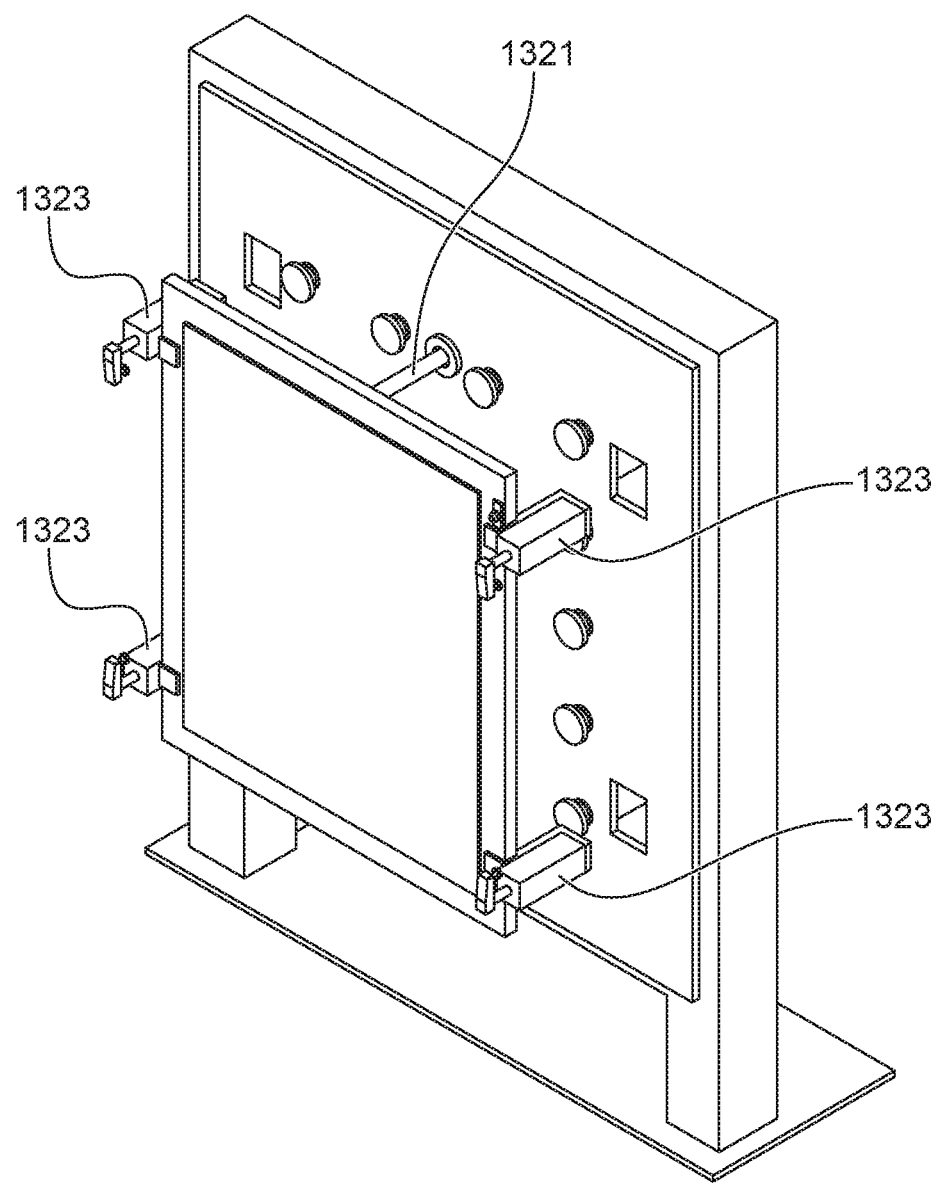
FIG. 27E is a perspective view of the supporting device in a state where the support plate shifts forward.
Figure 27F:
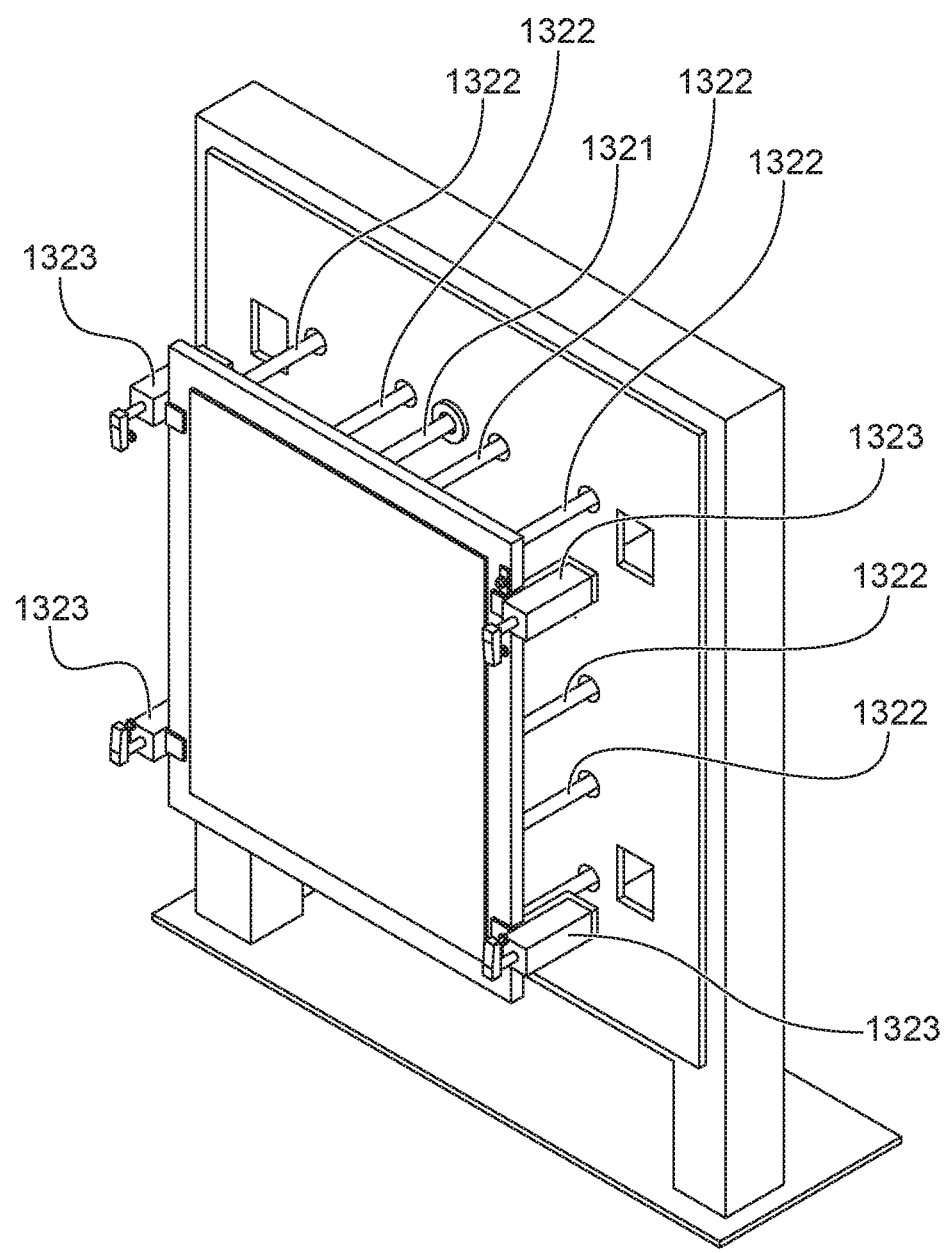
FIG. 27F is a perspective view of the supporting device in a state where the support plate is further supported by an auxiliary rod.
Figure 27G:
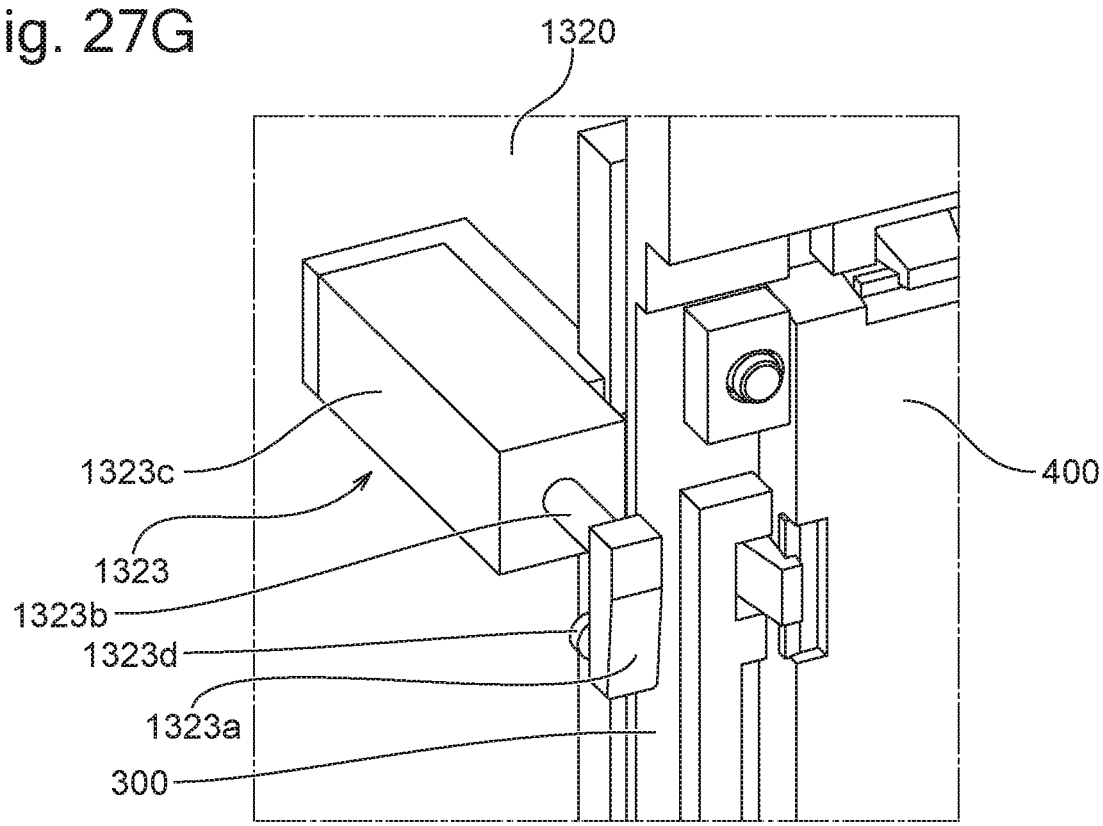
FIG. 27G is a perspective view of a locking device before being activated.
Figure 27H:
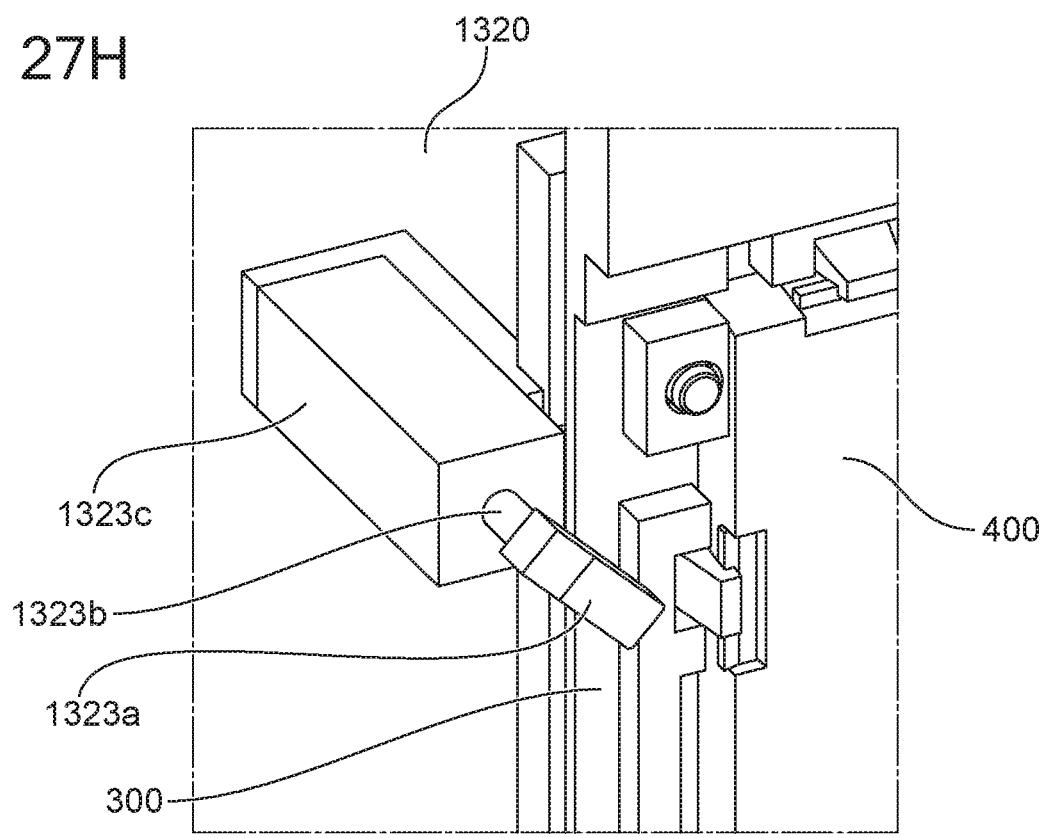
FIG. 27H is a perspective view of the locking device during rotation of a pressing member.
Figure 27I:
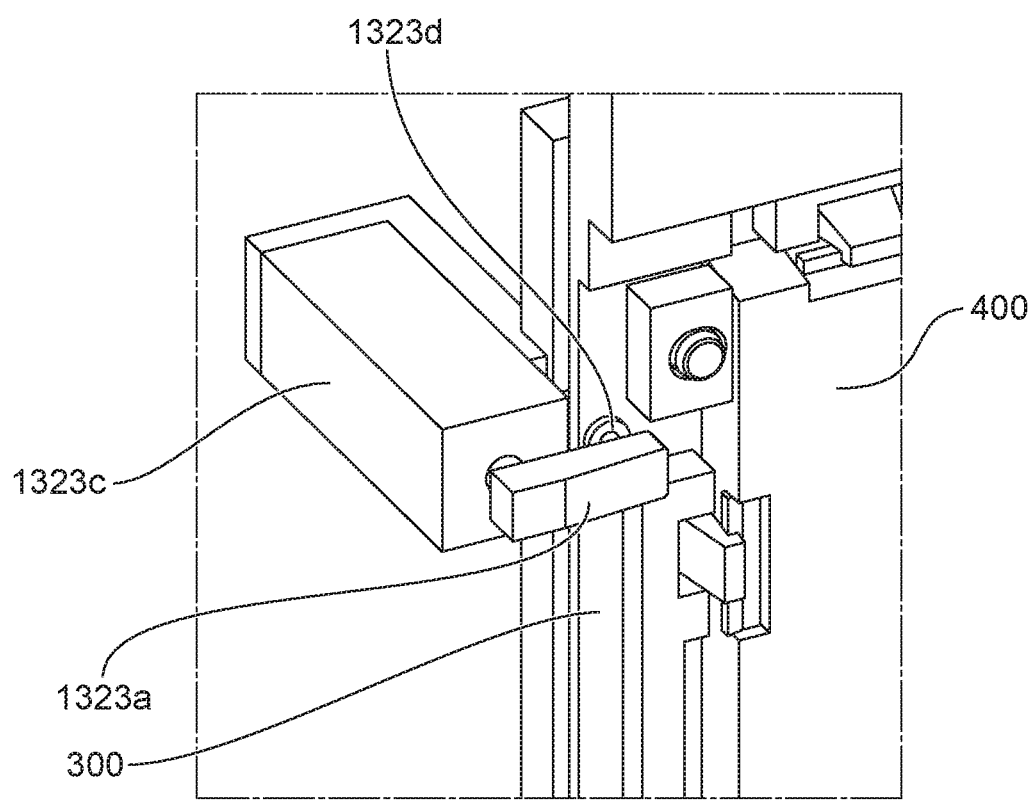
FIG. 27I is a perspective view of the locking device with a rod retracted.
Figure 27J:
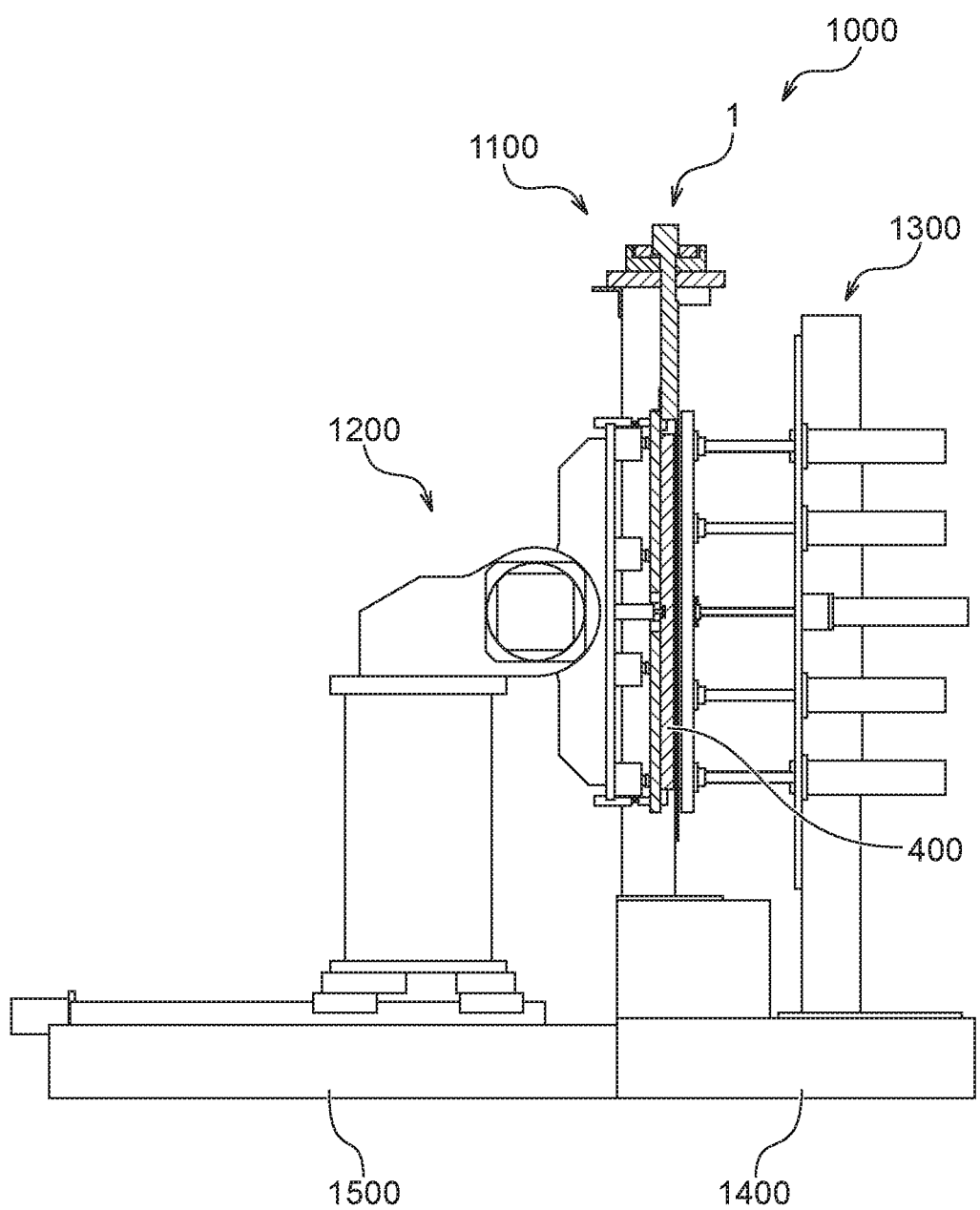
FIG. 27J is a side view of the substrate attachment/detachment device with the substrate holder pushed and adsorbed by the support plate of the turning device.
Figure 27K:
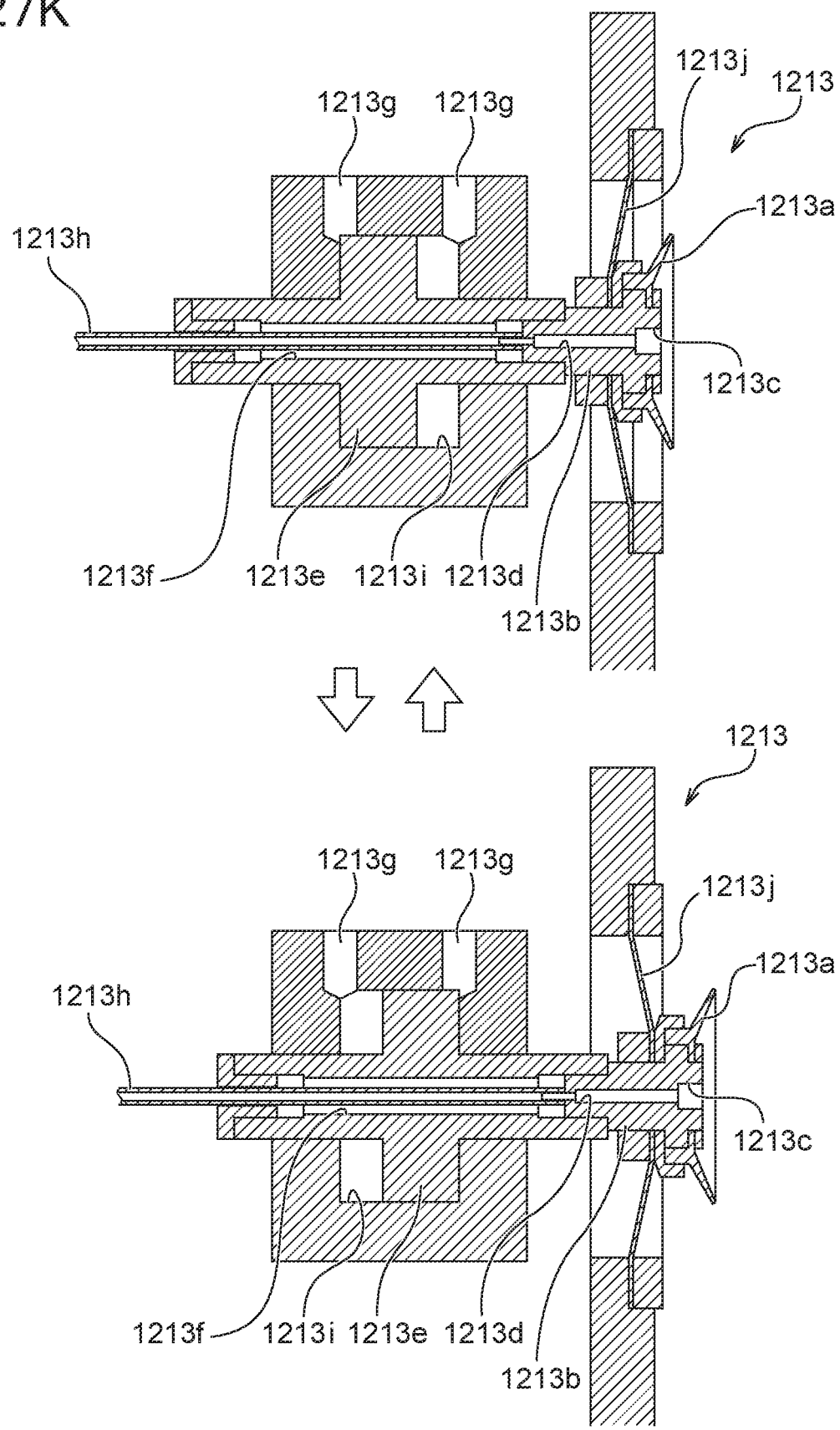
FIG. 27K is a sectional view of a pressure adsorption cylinder.
Figure 27L:
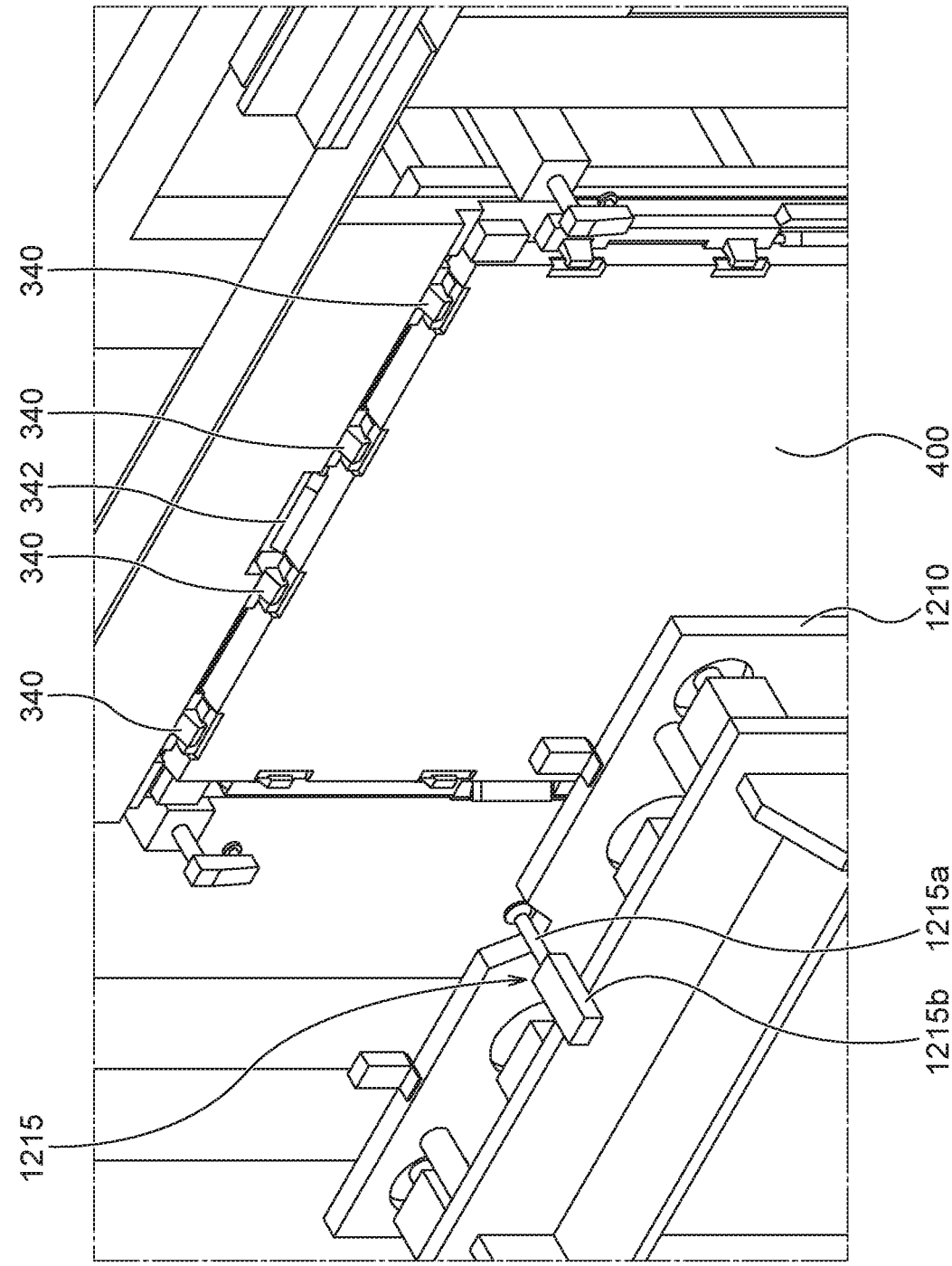
FIG. 27L is a partially-enlarged view of the substrate attachment/detachment device, which explains that the clamp for locking the back plate is released.
Figure 27M:
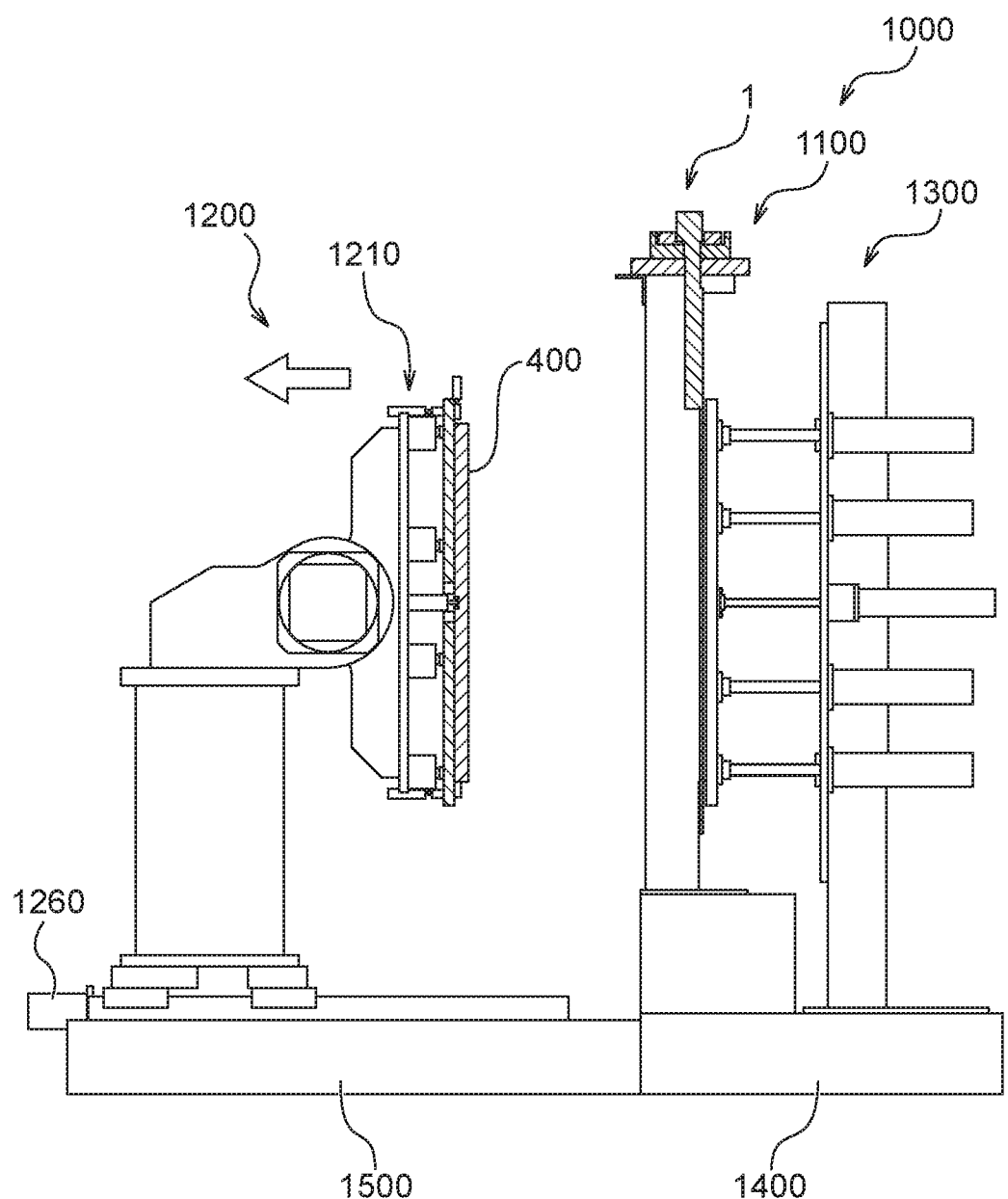
FIG. 27M is a side view of the substrate attachment/detachment device with the back plate removed by the turning device.
Figure 27N:
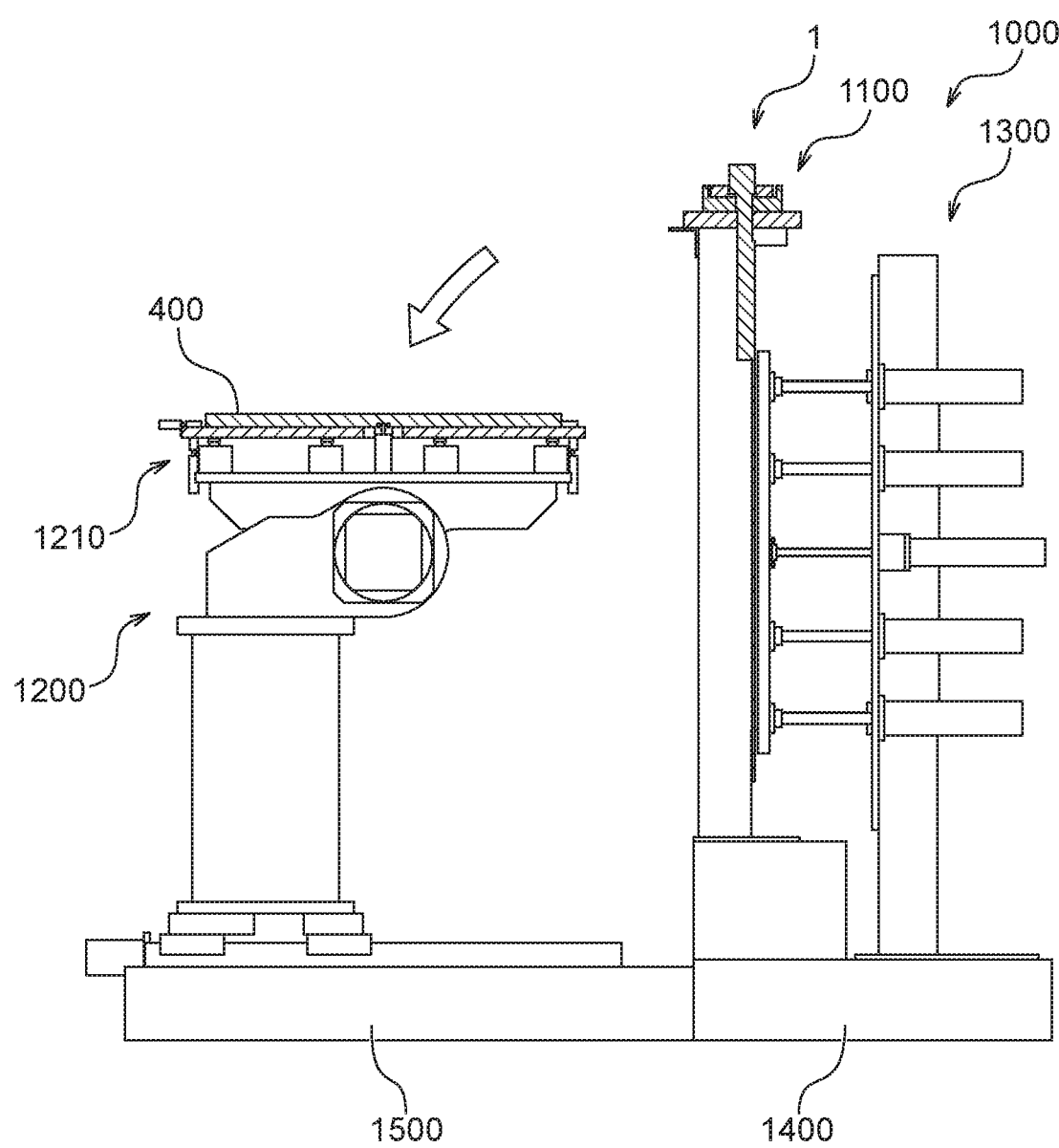
FIG. 27N is a side view of the substrate attachment/detachment device with the turning device turned into the second posture.
Figure 270:
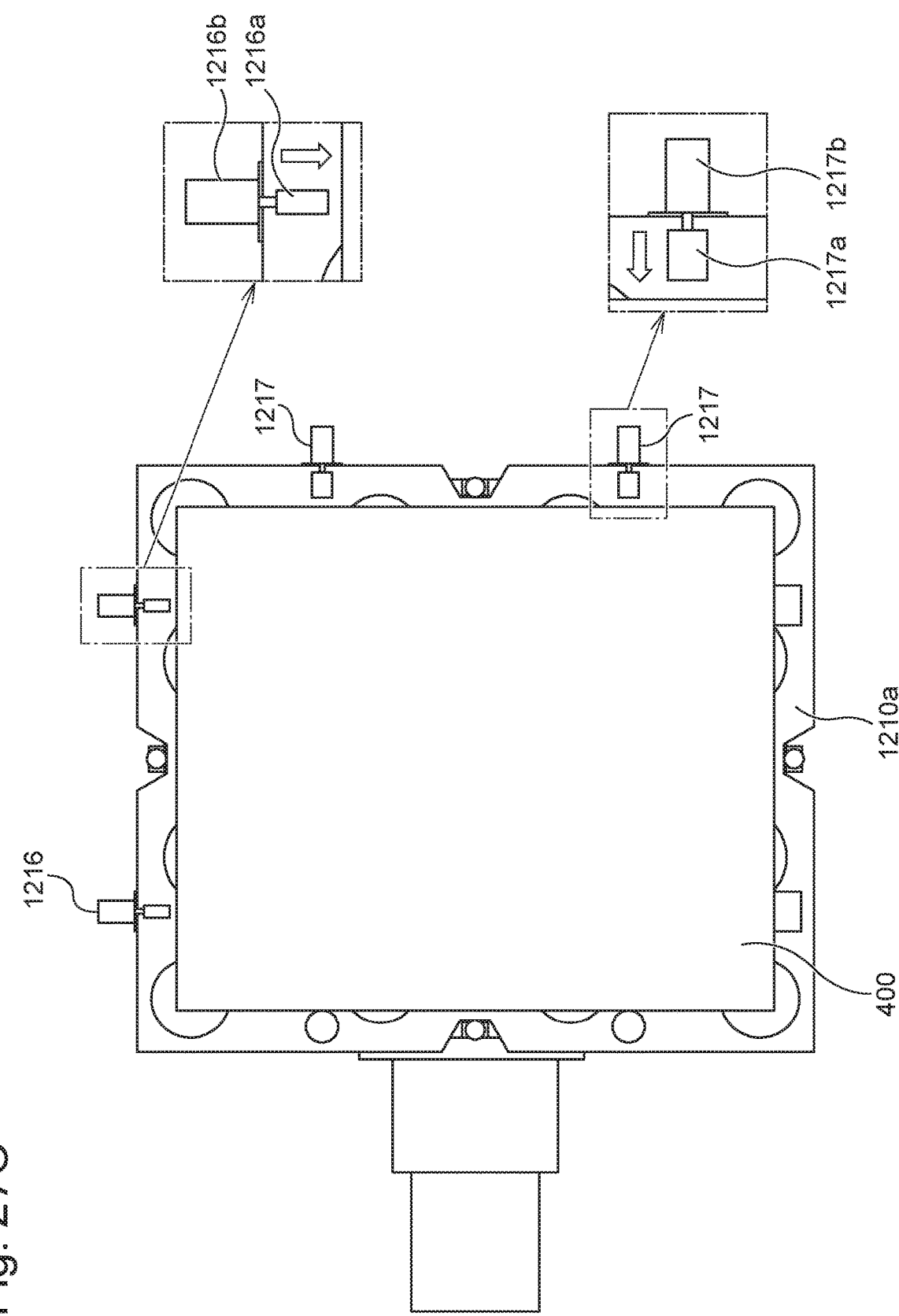
Figure 27P:
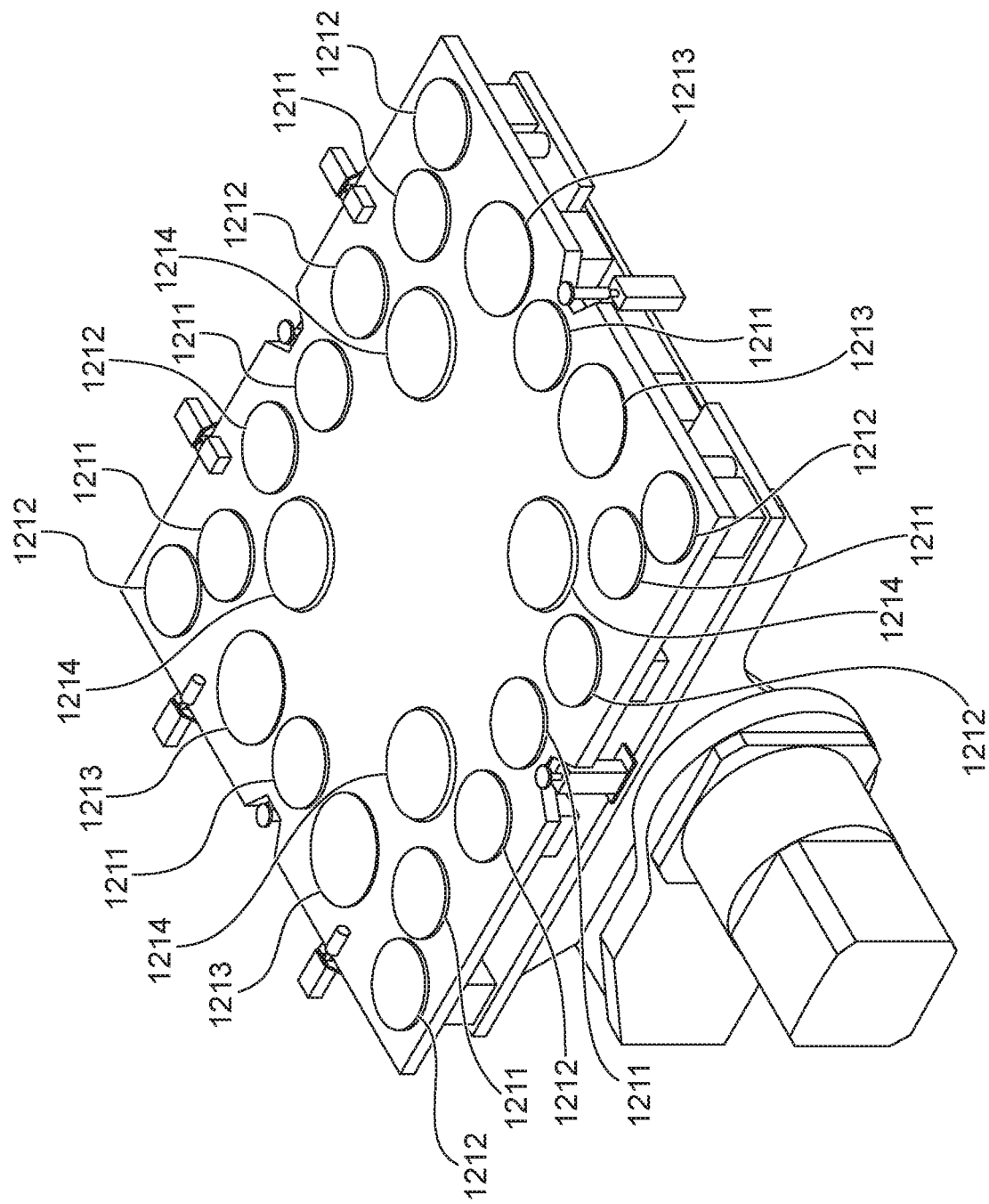
FIG. 27P is a perspective view of the support plate part of the turning device in the second posture.
Figure 27Q:
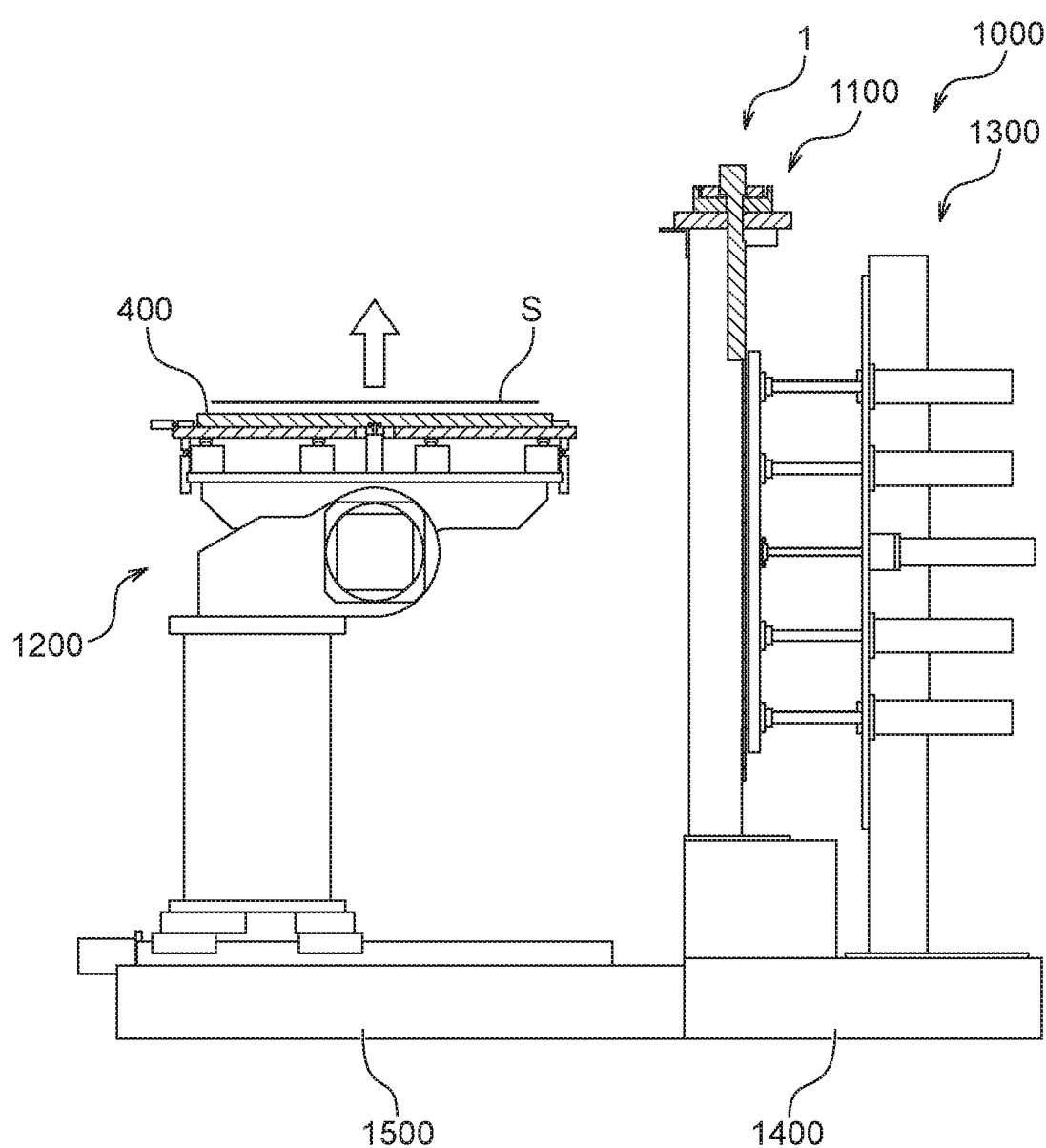
FIG. 27Q is a side view of the substrate attachment/detachment device at the time of detaching a substrate.
Figure 27R:
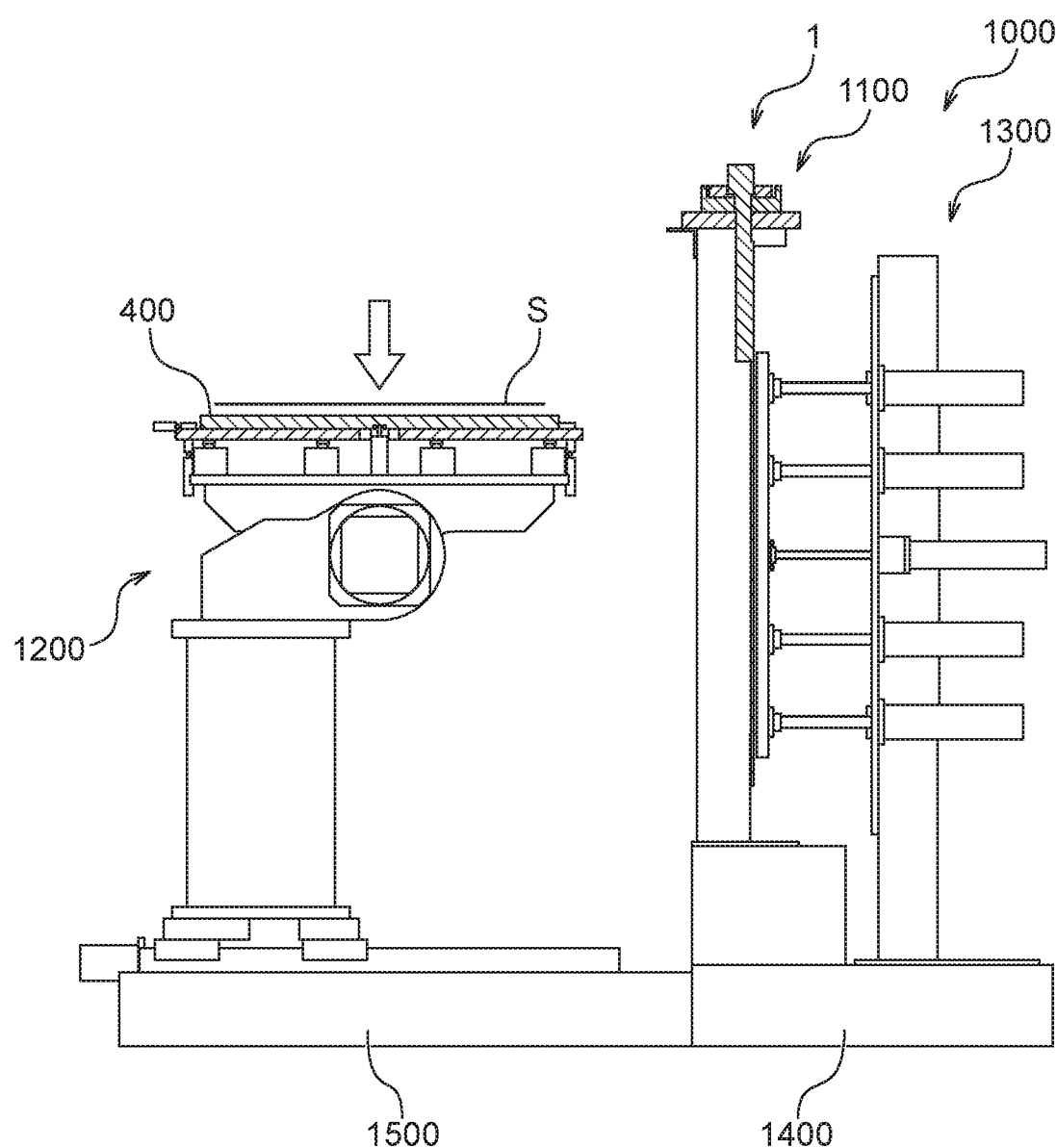
FIG. 27R is a side view of the substrate attachment/detachment device at the time of attaching a substrate.
Figure 27S:
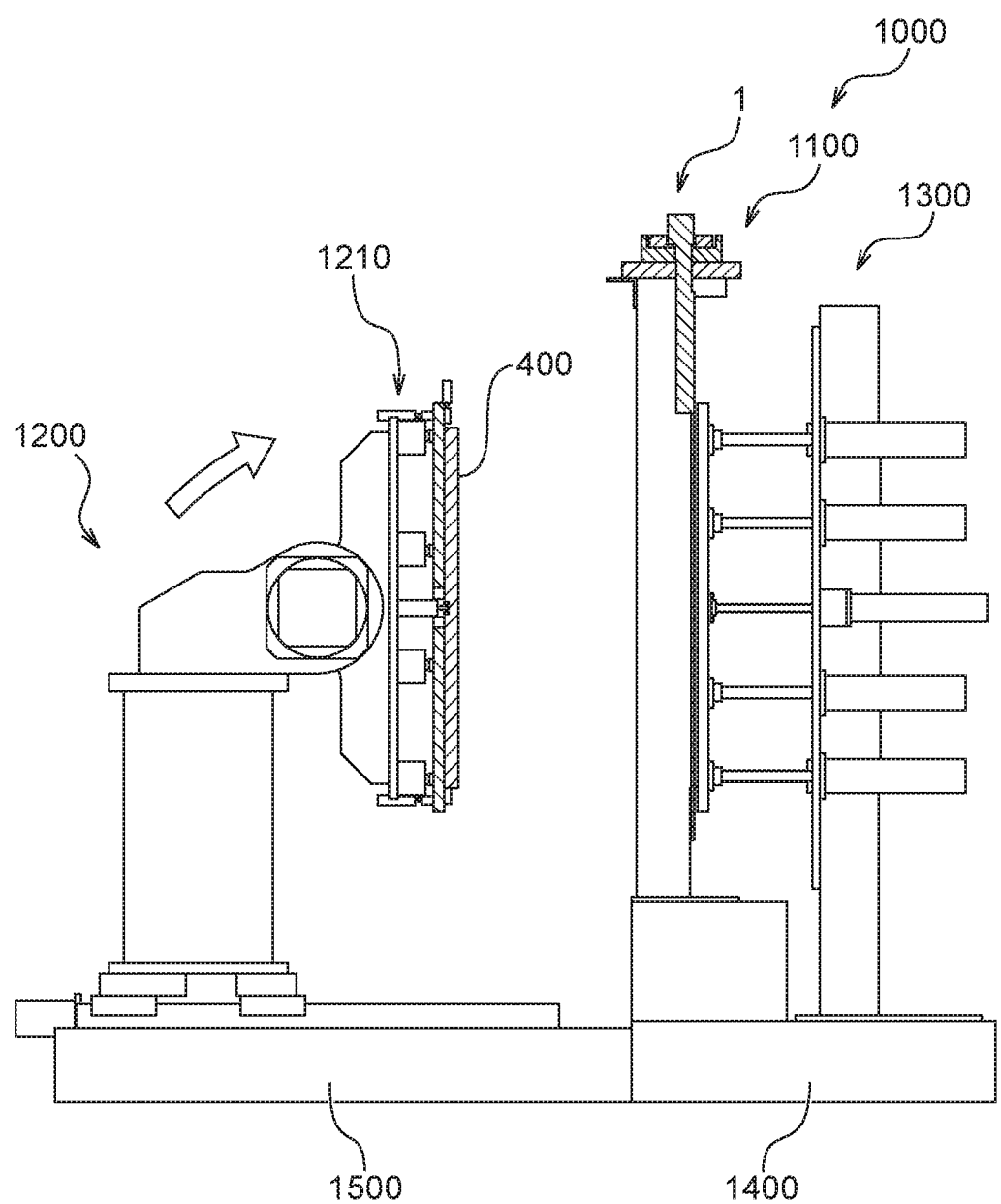
FIG. 27S is a side view of the substrate attachment/detachment device after returning from the second posture to the first posture.
Figure 27T:
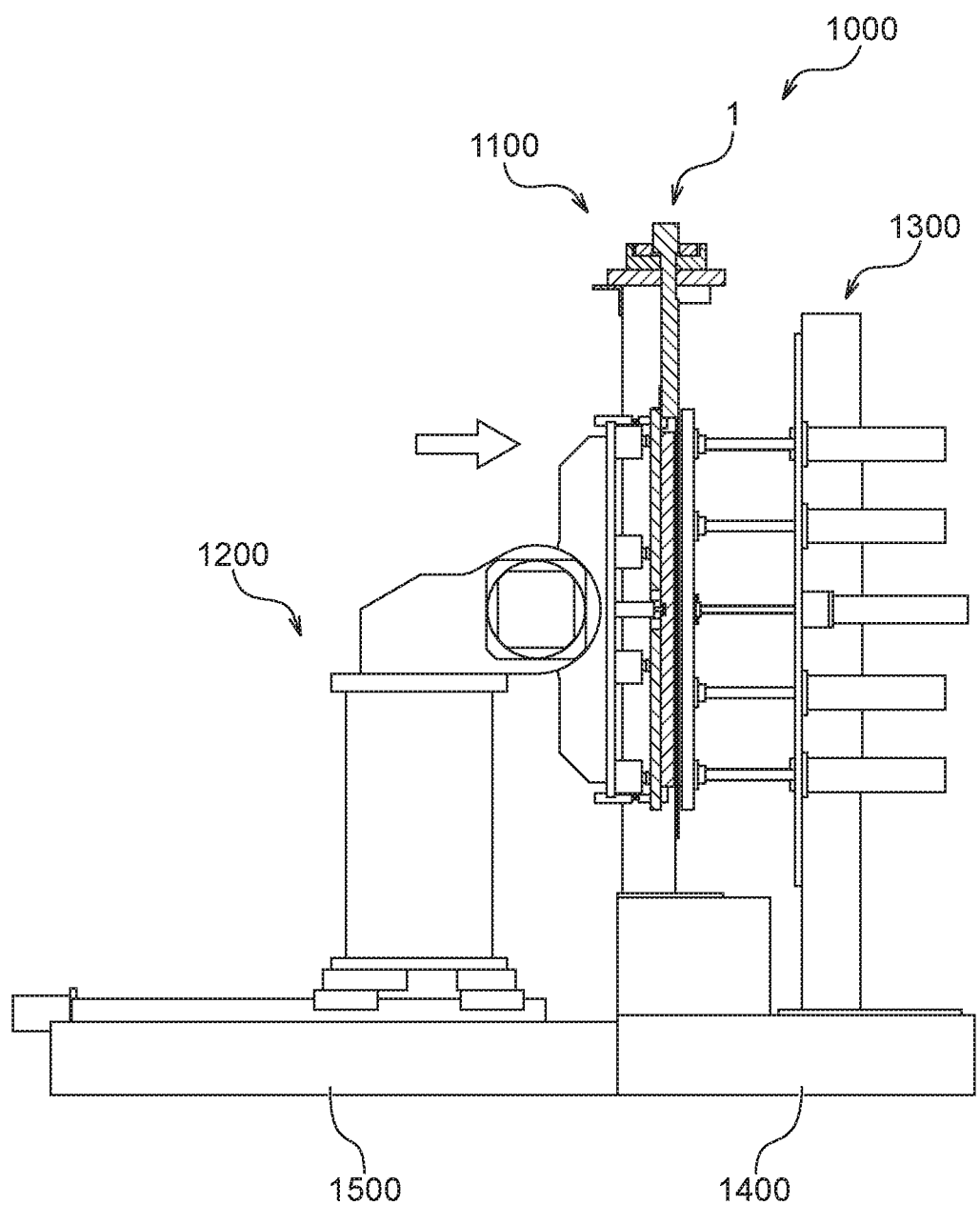
FIG. 27T is a side view of the substrate attachment/detachment device with the back plate pushed against a front plate of the holder station by the turning device.
Figure 27U:
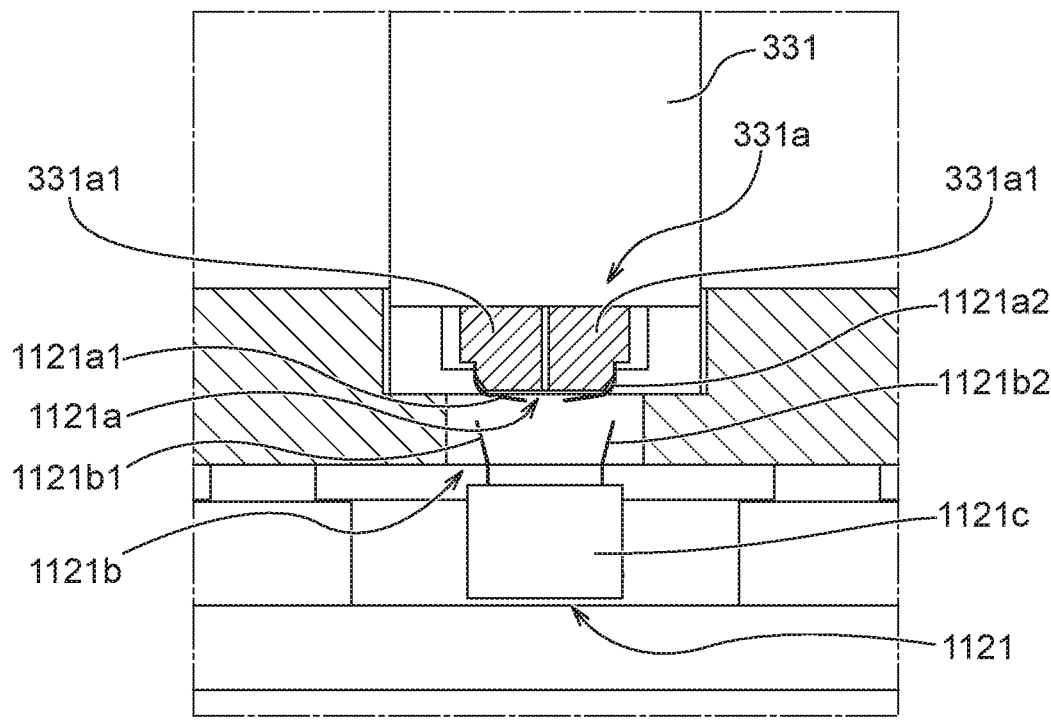
FIG. 27U is a sectional view of an energization determining device before being operated.
Figure 27V:
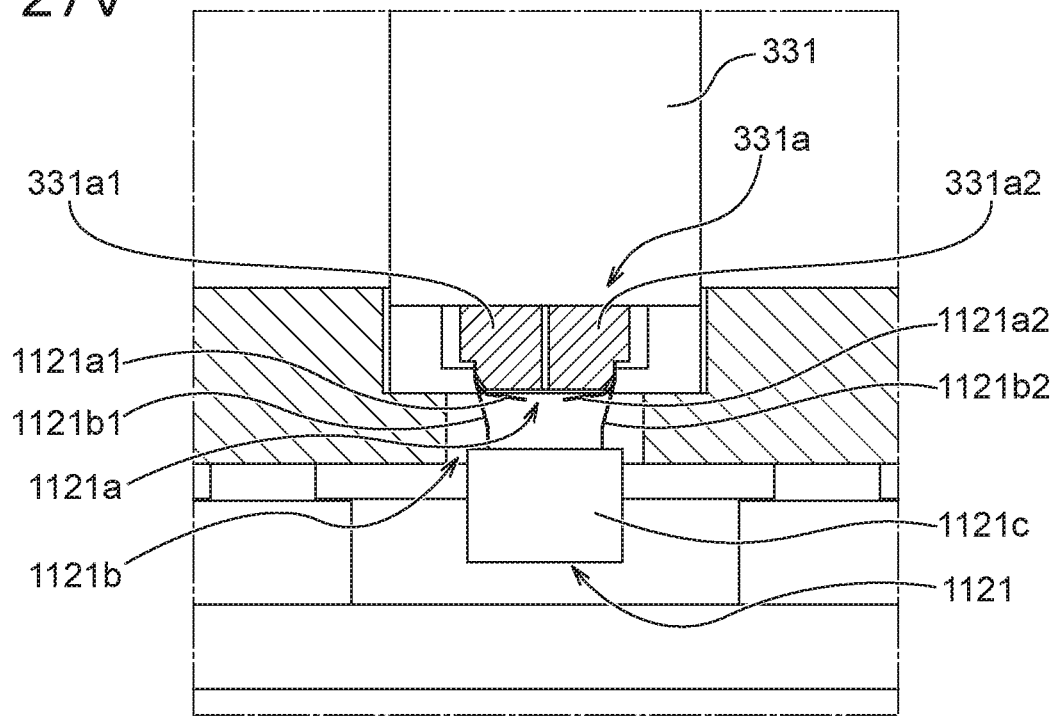
FIG. 27V is a sectional view of the energization determining device after being operated.
Figure 28:
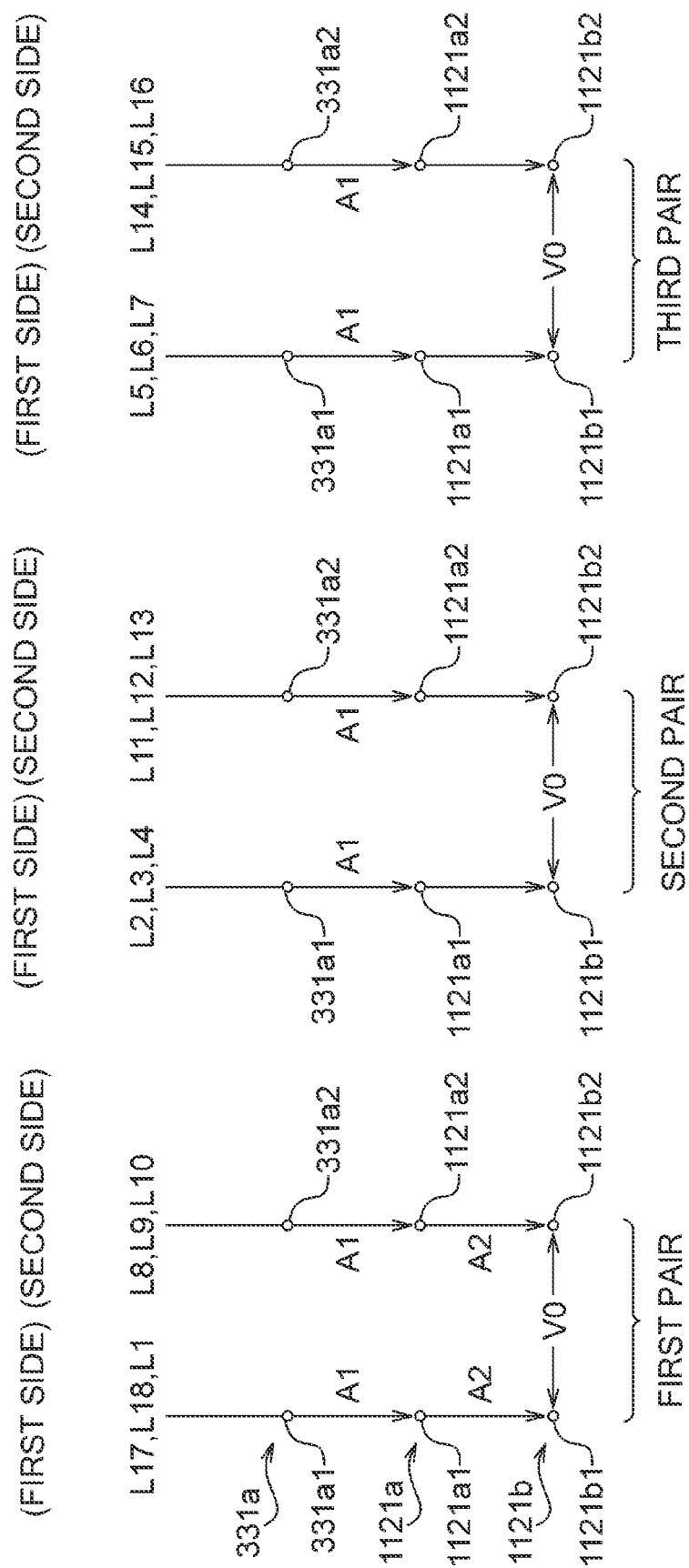
FIG. 28 is an explanatory view showing correspondence relationship between a connector contact and a contact of the energization determining device.

In the connector 331, the cables L1 to L18 are connected to the external connection contacts 331a1 and 331a2 (see FIGS. 27U, 27V and 28). Connected to the external connection contacts 331a1 and 331a2 are feed terminals from the external power source. For example, three of the first group cables (L1 to L7, L17 and L18) are connected to the common external connection contact 331a1 on a first side, and three of the second group cables (L8 to L16) are connected to the common external connection contact 331a2 on a second side. The first-side external connection contact 331a1 and the second-side external connection contact 331a2 are formed into an external connection contact pair 331a (corresponding to the contacts 331a1 and 331a2 on right and left sides in FIGS. 27U and 27V). More specifically, the external connection contact is configured as below.

The cables L17, L18, and L1 are connected to the first-side connection contact 331a1 which is a common contact among the cables L17, L18, and L1. The cables L8, L9, and L10 are connected to the second-side external connection contact 331a2 which is a common contact among the cables L8, L9, and L10. The first-side external connection contact 331a1 and the second-side external connection contact 331a2 are formed into a pair (first pair or first external connection contact pair 331a).

The cables L2, L3, and L4 are connected to another first-side external connection contact 331a1, and the cables L11, L12, and L13 are connected to another second-side external connection contact 331a2. The first-side external connection contact 331a1 and the second-side external connection contact 331a2 are formed into a pair (second pair or second external connection contact pair 331a).

The cables L5, L6, and L7 are connected to still another first-side external connection contact 331a1, and the cables L14, L15, and L16 are connected to still another second-side external connection contact 331a2. The first-side external connection contact 331a1 and the second-side external connection contact 331a2 are formed into a pair (third pair or third external connection contact pair 331a).

In the connector 331, the first-side external connection contact 331a1 and the second-side external connection contact 331a2 of each of the external connection contact pairs 331a are disposed opposite each other. The first-side external connection contact 331a1 and the second-side external connection contact 331a2 of the first external connection contact pair 331a are disposed opposite each other. The first-side external connection contact 331a1 and the second-side external connection contact 331a2 of the second external connection contact pair 331a are disposed opposite each other. The first-side external connection contact 331a1 and the second-side external connection contact 331a2 of the third external connection contact pair 331a are disposed opposite each other.

In the substrate attachment/detachment mechanism 29, after the substrate S is held by the substrate holder 1 (after the back plate 400 is fastened by the clamp 340 of the front plate 300), resistance meters, not shown, are connected to the first to fifth pairs of the connector 331. A predetermined checking voltage is applied between the first-side external connection contact 331a1 and the second-side external connection contact 331a2 in each of the pairs. In this manner, electrical resistance between the first-side external connection contact 331a1 and the second-side external connection contact 331a2 in each of the pairs. If the electrical resistance in each of the external connection contact pairs 331a does not exceed a predetermined value and falls within a predetermined range (there is no variability among the electrical resistances of the external connection contact pairs, and no troubles such as disconnection), it is determined that energization of the substrate holder 1 is favorable.

A second end which is the other end of each of the cables L1 to L18 is electrically connected to the corresponding contact 370 of each of the contact zones C1 to C18, as described later. The cables L1 to L18 extend from the connector 331 through the arm 330 and pass through one of the two attachment parts 320 to enter the wiring buffer part 311 (FIG. 18). In the wiring buffer part 311, the cables L17, L18, and L1 to L7 of the cables L1 to L18 extend to the first zone (connector-side zone), whereas the cables L8 to L16 extend to the second zone (zone located on a side far from the connector). FIG. 18 mainly shows the first group cables L17, L18, and L1 to L7 disposed in the first zone. As shown in FIG. 18, the first group cables L17, L18, and L1 to L7 extend through the wiring buffer part 311 to be guided to a cable conduit 365 located between seal holders 363 and 364 in the face part 312. Although not shown, the second group cables L8 to L16 also extend through the second zone (zone located on the side far from the connector) of the wiring buffer part 311 to be guided to the cable conduit 365 in the second zone of the face part 312. In FIG. 18, lengths of some of the cables are partially omitted for simplicity of the drawing.

On the face part 312 side of the wiring buffer part 311, there is disposed a wall thickness part 313 (FIGS. 19A and 19B). A wiring hole 311a, which is compatible with the cables L1 to L18, is formed in the wall thickness part 313 of the wiring buffer part 311 and the face part 312 to extend to the cable conduit 365 between the seal holders 363 and 364 (FIGS. 19A and 19B). The wiring hole 311a is a drilling hole with a diameter that allows the cables to pass through. FIG. 19A shows only one wiring hole 311a. However, the wiring hole 311a actually comprises a plurality of wiring holes 311a disposed correspondingly to the respective cables as shown in FIG. 19C. There are at least the same number of the wiring holes 311a as the number of the cables.

In the present embodiment, as shown in FIGS. 19A and 19B, the wiring buffer part 311 is disposed separately from the face part 312 of the front panel main body 310 and is attached to the front panel main body 310. In a boundary between the wiring buffer part 311 and the face part 312, an O-ring 501 for tight sealing of the wiring hole 311a and the cables L is disposed around the cables. The wiring hole 311a and the cables L are then protected from plating solution and foreign matters from outside.

Figure 21A:
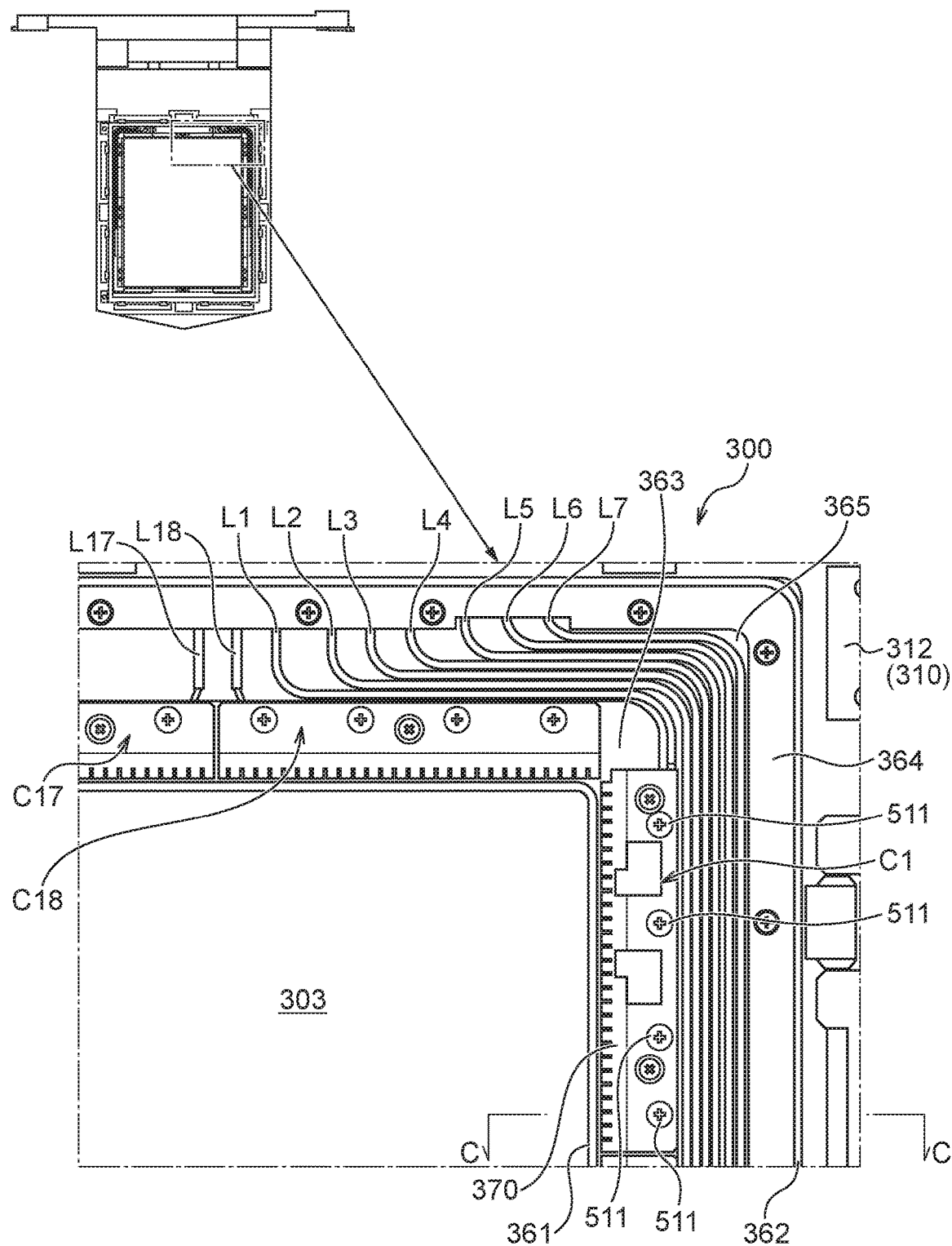
FIG. 21A is a rear view of a corner of the face part, which is located on a side closer to the connector, and a vicinity of the corner.
Figure 21B:
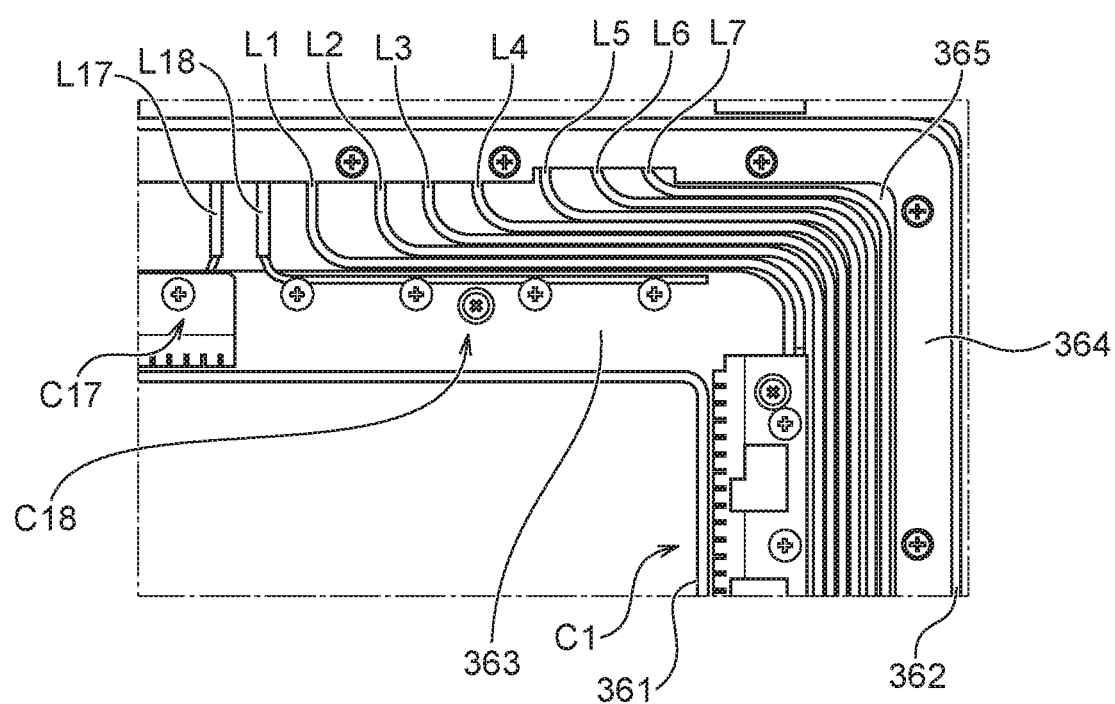
FIG. 21B is a rear view showing, in a further enlarged manner, the corner of the face part, which is located on the side closer to the connector, and the vicinity of the corner.
Figure 21C:
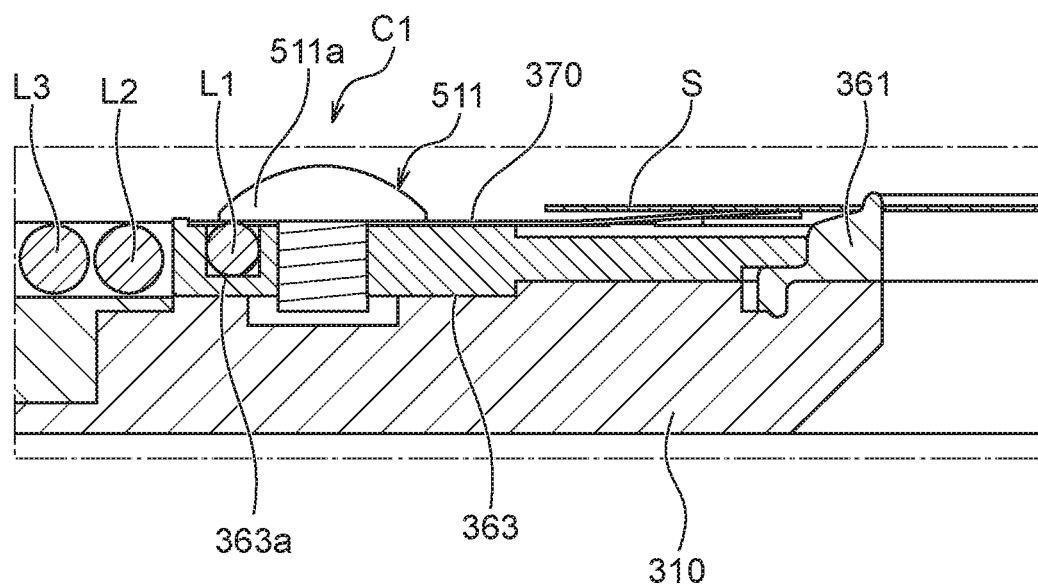
FIG. 21C is a sectional view taken along line C-C in FIG. 21A.
Figure 21D:
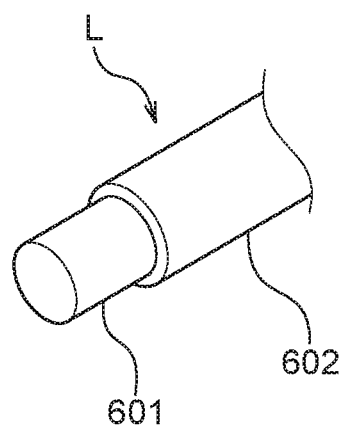
FIG. 21D is a perspective view of a portion that is seen after a jacket of a cable is removed.

FIG. 21A is a rear view of a corner of the face part, which is located on a side closer to the connector, and a vicinity of the corner. FIG. 21B is a rear view showing, in a further enlarged manner, the corner of the face part, which is located on the side closer to the connector, and the vicinity of the corner. FIG. 21C is a sectional view taken along line C-C in FIG. 21A. FIG. 21D is a perspective view of a portion that is seen after a jacket of a cable is removed.

The cables L1 to L7 are introduced into the cable conduit 365 to lie side by side in the same plane as shown in FIGS. 1A and 21B and disposed along a side of the opening 303, which is close to the connector 331. The cables do not overlap with one another in a thickness direction of the face part 312, reducing thickness of the face part 312 and the front panel 300.

As shown in FIGS. 21A and 21B, the contact 370 made of conductive material is disposed in each of the contact zones C1 to C18 along each side of the opening 303. The contact 370 is disposed next to the inner seal 361 although the contact 370 does not come into contact with the inner seal 361. The contact 370 is disposed on the seal holder 363 and fastened to the seal holder with a plurality of screws 511. The seal holder 363 is provided with a wiring gutter 363a for drawing in the cables, which extends from the cable conduit 365 to connection positions (where the screws 511 are located). As shown in FIG. 21D, the cables L each include a core wire or conductive wire 601 made of an electrical conductor, and a jacket 602 for insulating the conductive wire 601. The jacket 602 is removed from the end (second end) of the cable L, in which the core wire or conductive wire 601 are exposed. The core wire 601 of the cable L is drawn into the wire gutter 363a. The cables L drawn in the contact zones allocated to the cables L are terminated within the allocated contact zones.

For example, the wire gutter 363a (FIG. 21C) is formed in the contact zone C1, the wire gutter 363a opening in a direction of the cable conduit 365 located in the vicinity of the contact zone C1. The wire gutter 363a extends so as to pass under the four screws (fastening members) 511 disposed in the contact zone C1, and is then terminated (FIG. 21A). Likewise, the wire gutter 363a is formed in the contact zone C2, the wire gutter 363a opening in a direction of the cable conduit 365 located in the vicinity of the contact zone C2. The wire gutter 363a extends so as to pass under the four screws 511 disposed in the contact zone C2, and is then terminated. Position relationship between the screw 511 and the wire gutter 363a is illustrated in FIG. 21C. When the cable L (L1 in FIG. 21C) is disposed inside the wire gutter 363a, the contact 370 and the cable (core wire) are pressed by a flange part 511a of the screw 511.

Electrical connection between the cable L and the contact 370 in each contact zone is carried out as explained below. The explanation will be given using the cable L1 as an example. The jacket 602 is removed from the end (second end) of the cable L1 to expose the core wire (conductive wire) 601 (FIGS. 21A to 21D). The end of the cable L1 is introduced into the wire gutter 363a of the seal holder 363 in the vicinity of the contact zone C1, and is pressed within the contact zone C1 by the four screws (fastening members) 511 together with the contact 370. In other words, the screws (fastening members) 511 and the seal holder 363 together clamp the core wire 601 of the cable L1 with the contact 370. In the result, the cable L1 is electrically connected to the contact 370. When the substrate holder 1 holds the substrate S, the contact 370 contacts the substrate S, and power is supplied from the external power source to the substrate S through the cable L1 and the contact 370. The other contact zones C2 to C18 are formed in the same manner. The substrate S is supplied with power from the contacts 370 located in 18 places.

Since the cables L2 to L7 are not drawn into the contact zone C1, the cables L2 to L7 are disposed side by side between the contact zone C1 and the contact zone C2. In the contact zone C2, the cable L2 is drawn in the wire gutter 363a of the seal holder 363, pressed by the four screws 511 together with the contact 370, and electrically connected to the contact 370, as in the contact zone C1. The cables L3 to L7 are then disposed side by side between the contact zone C2 and the contact zone C3. The cables L3 to L7 are electrically connected to the contacts 370 in the contact zones C3 to C7. The cable L4 to L7 are disposed side by side between the contact zones C3 and C4. The cables L5 to L7 are disposed side by side between the contact zones C4 and C5. The cables L6 and L7 are disposed side by side between the contact zones C5 and C6. The cable L7 is disposed between the contact zones C6 and C7.

The cables L17 and L18 are also electrically connected to the contacts 370 in the contact zones C17 and C18 in the same manner. Likewise, in the zone located on the side far from the connector (second zone), the cables L8 to L16 are electrically connected to the contacts 370 in the contact zones C8 to C16 similarly to the cables of the first zone.

In the present embodiment, the cable L is clamped with the contact 370, and the cable L and the contact 370 are directly, electrically connected to each other. However, another conductive member (second conductive member) may be interposed between the cable L and the contact 370.

[Substrate Attachment/Detachment Device]

Figure 22A:
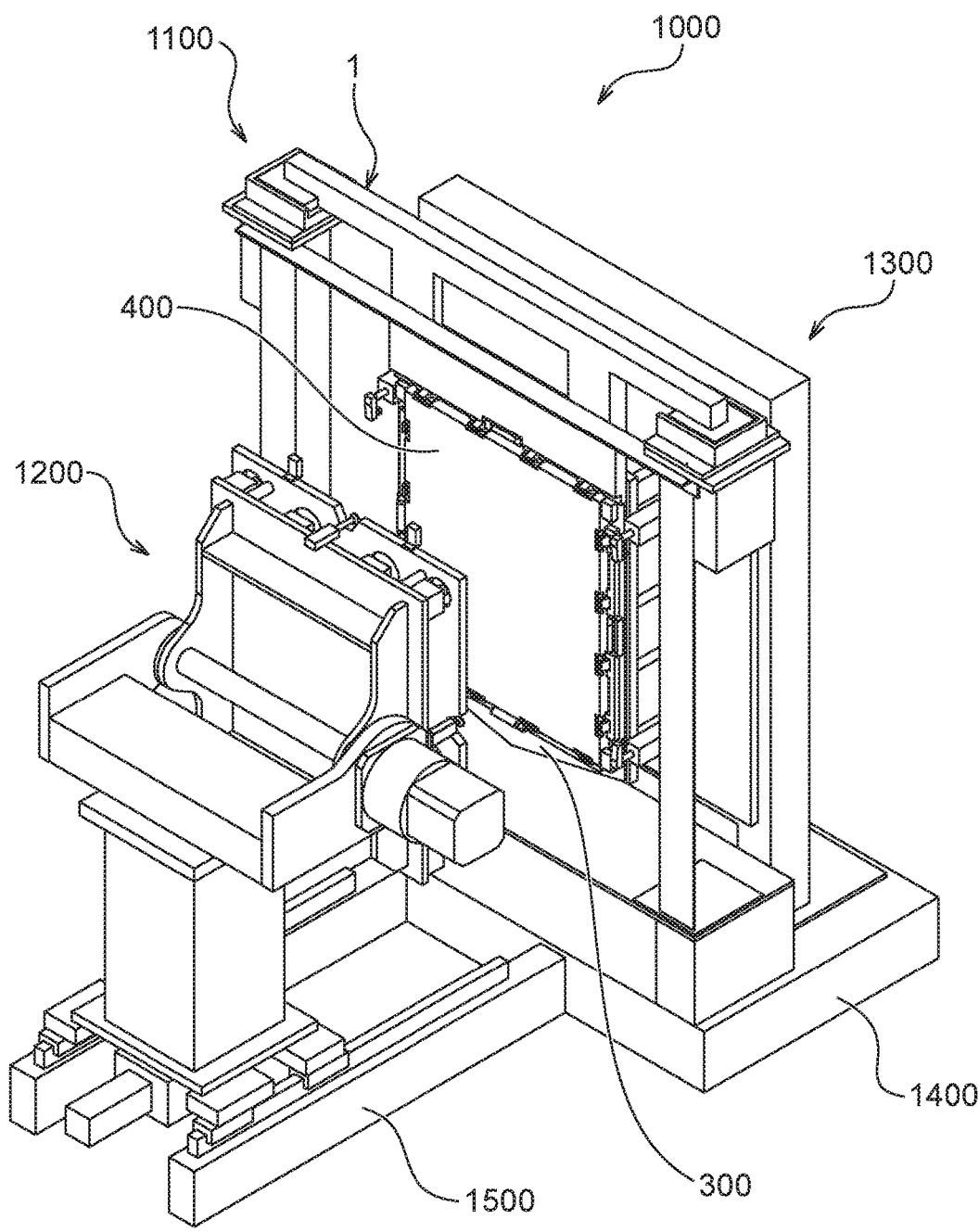
FIG. 22A is a perspective view of a substrate attachment/detachment device.
Figure 22B:
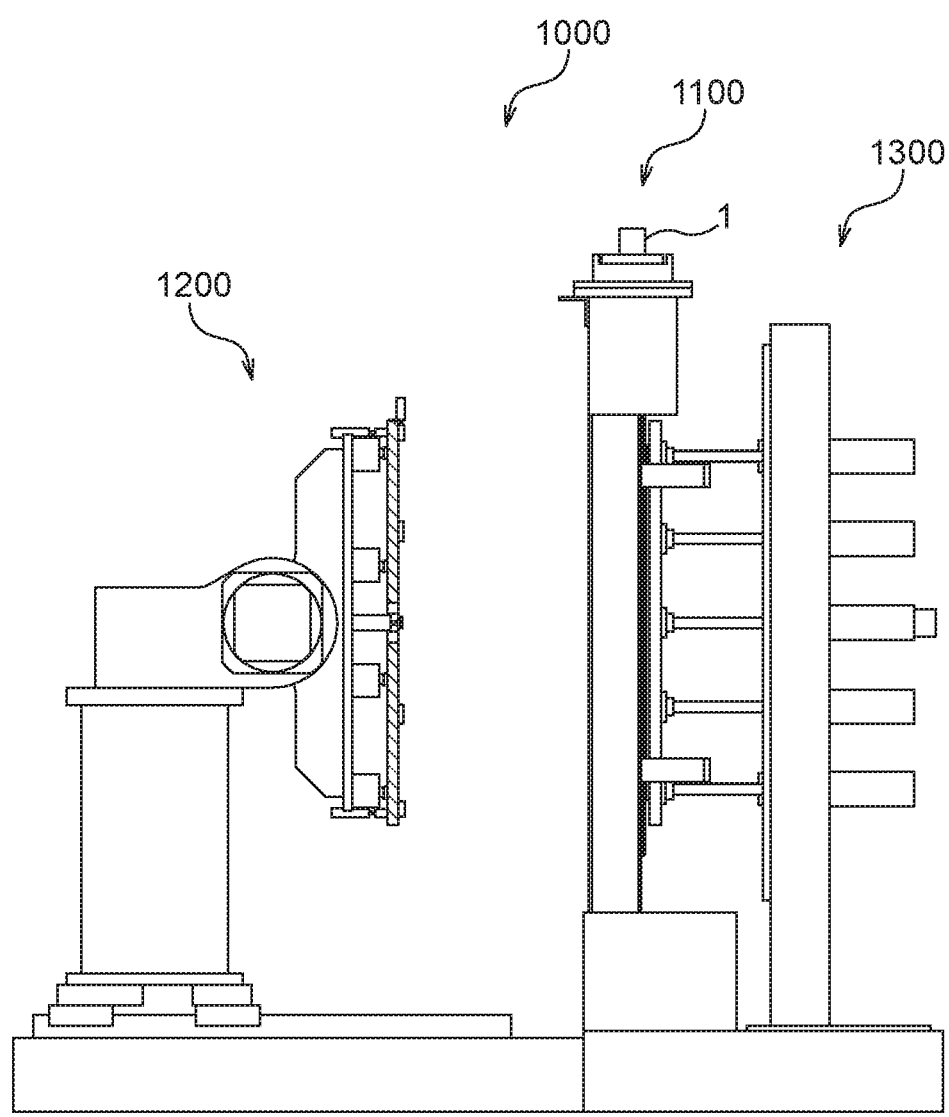
FIG. 22B is a side view of the substrate attachment/detachment device.
Figure 22C:
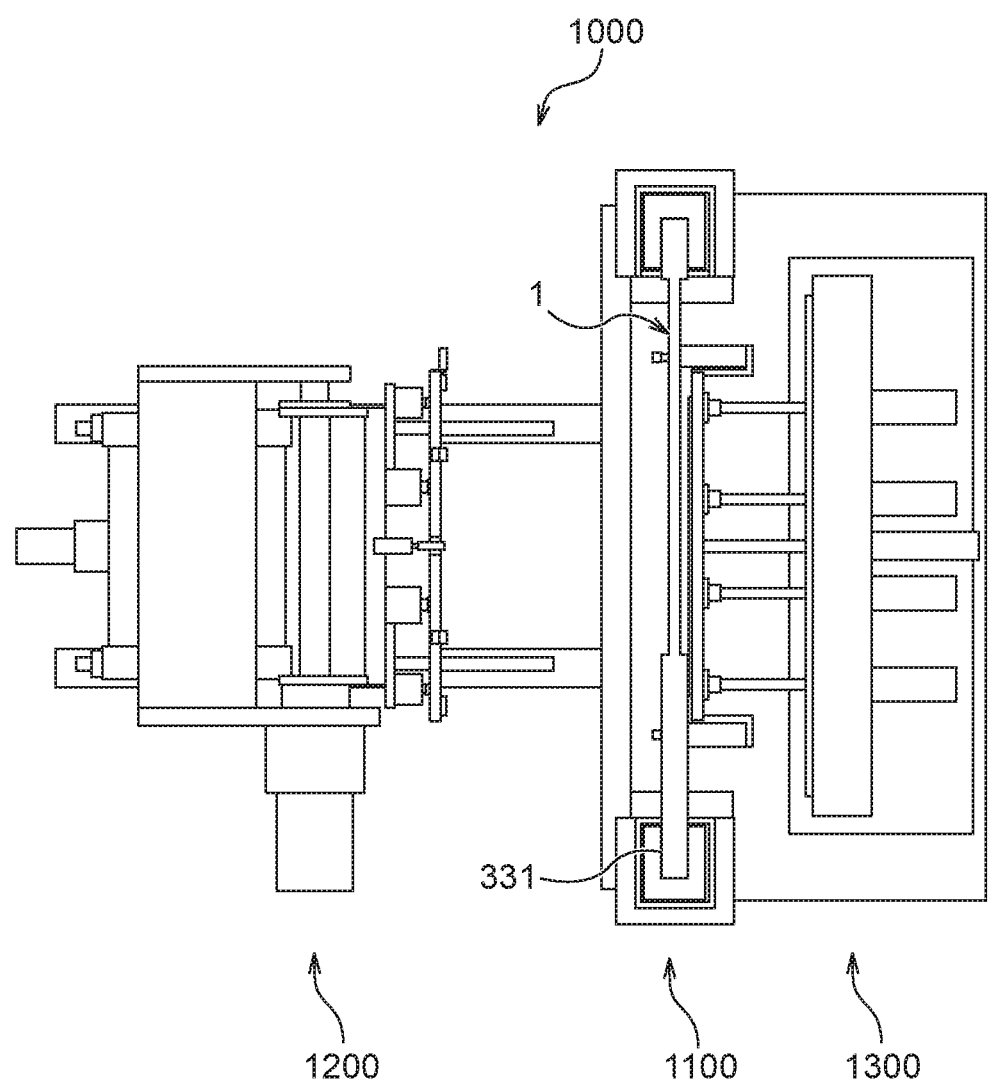
FIG. 22C is a plan view of the substrate attachment/detachment device.
Figure 22D:
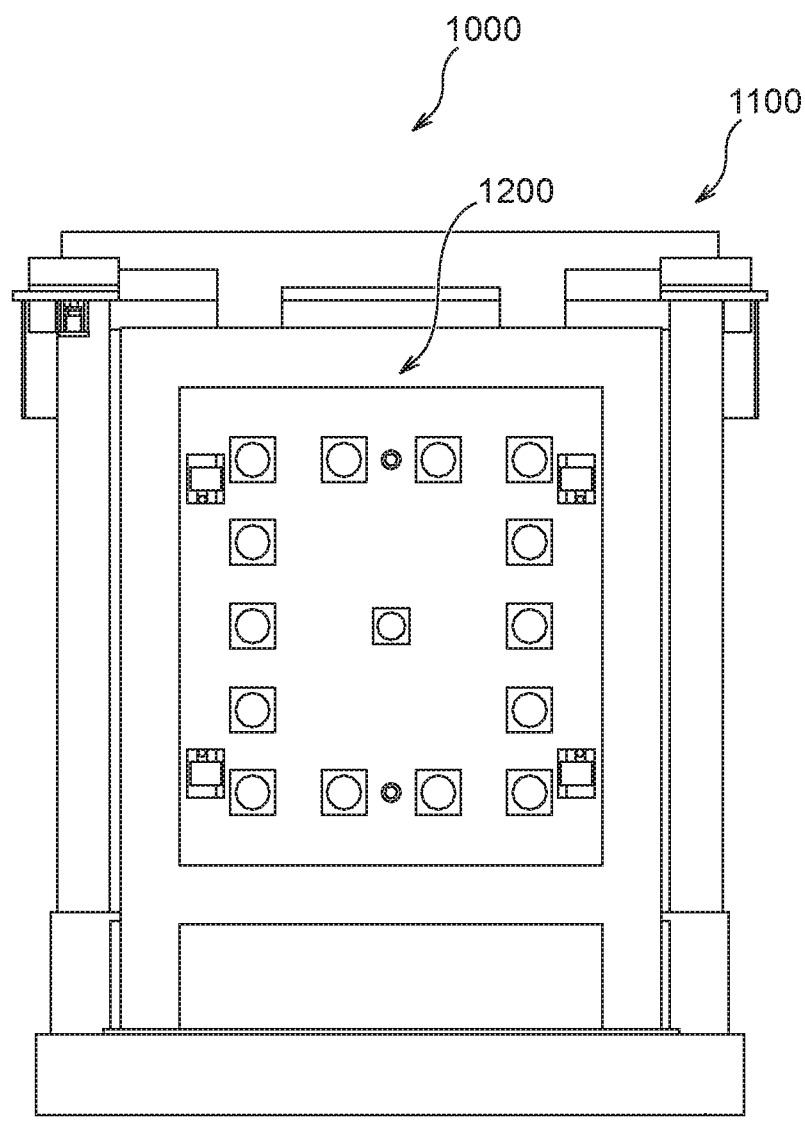
FIG. 22D is a rear view of a holder station and a supporting device of the substrate attachment/detachment device.

FIG. 22A is a perspective view of a substrate attachment/detachment device. FIG. 22B is a side view of the substrate attachment/detachment device. FIG. 22C is a plan view of the substrate attachment/detachment device. FIG. 22D is a rear view of a holder station and a supporting device of the substrate attachment/detachment device.

A substrate attachment/detachment device 1000 is included in the substrate attachment/detachment mechanism 29 shown in FIG. 1. As shown in FIGS. 22A to 22D, the substrate attachment/detachment device 1000 includes a holder station 1100, a turning device 1200, and a support device 1300. The holder station 1100 and the support device 1300 are fixed on a base 1400 that is fixed on an installation surface. The turning device 1200 is mounted on constituent components (rails) 1500 and capable of linearly reciprocating so as to move toward and away from the holder station 1100 along the constituent components 1500. The constituent components 1500 are attached to a lateral face of the base 1400 and have substantially the same height as the base 1400. The turning device 1200 is disposed on a first side of the holder station 1100. The support device 1300 is disposed on a second side of the holder station 1100. In the support attachment/detachment device 1000, the substrate holder 1 is suspended by the holder station 1100. The back plate 400 of the substrate holder 1 is attached/detached using the turning device 1200, with the substrate holder 1 supported and fixed by the support device 1300, and the substrate S is attached to/detached from the back plate 400 removed by the turning device 1200. If the substrate holder 1 is not supported by the support device 1300, the support device 1300 may be omitted.

In the following explanation, the turning device 1200 side of the holder station 1100 and the support device 1300 may be referred to as a first or front side, and the opposite side of the holder station 1100 and the support device 1300 may be referred to as a second or rear side. The holder station 1100 side of the turning device 1200 may be referred to as a first or front side, and the opposite side of the turning device 1200 may be referred to as a second or rear side.

(Turning Device)

Figure 23A:
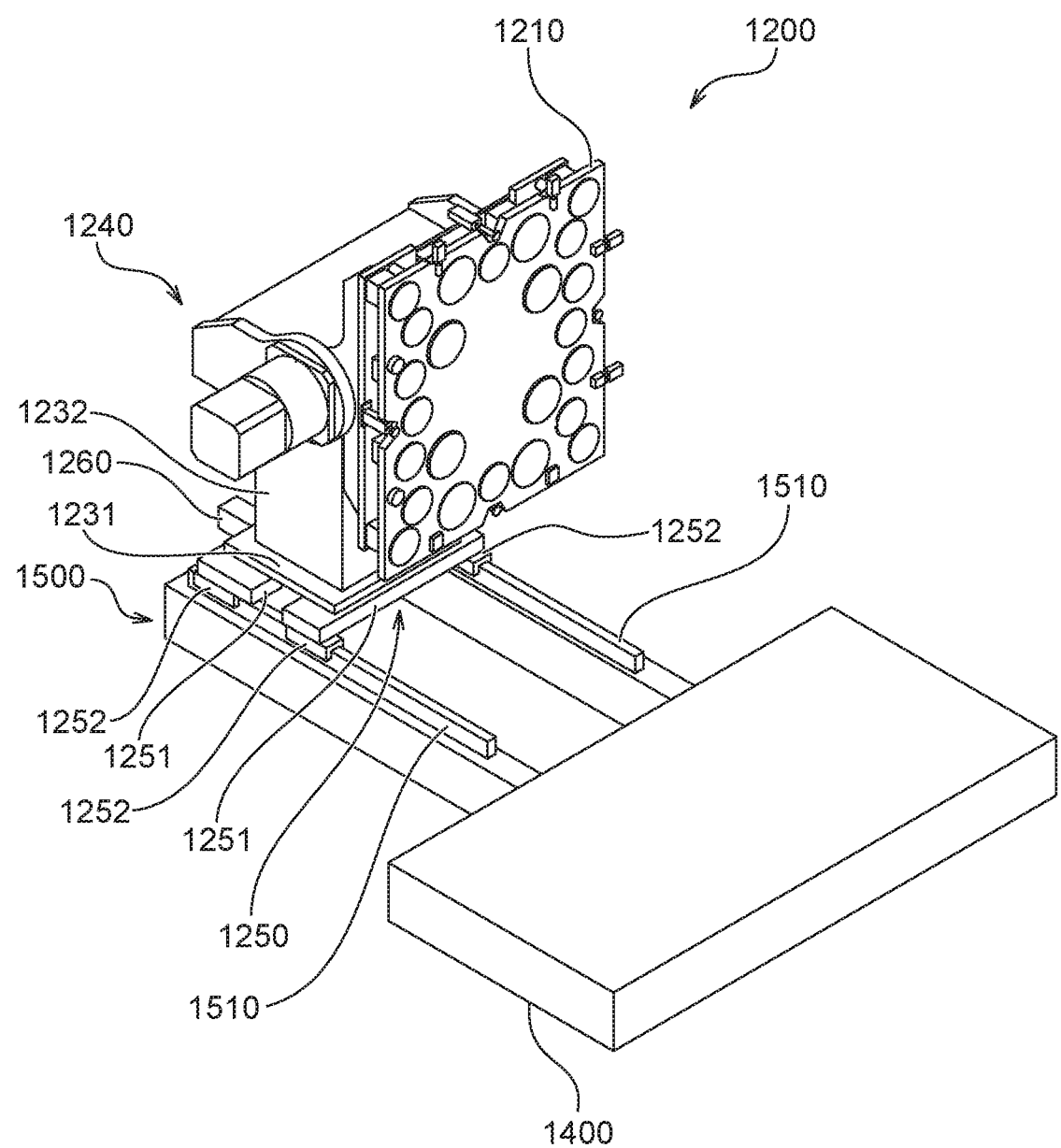
FIG. 23A is a perspective view of a turning device in a first posture.
Figure 23B:
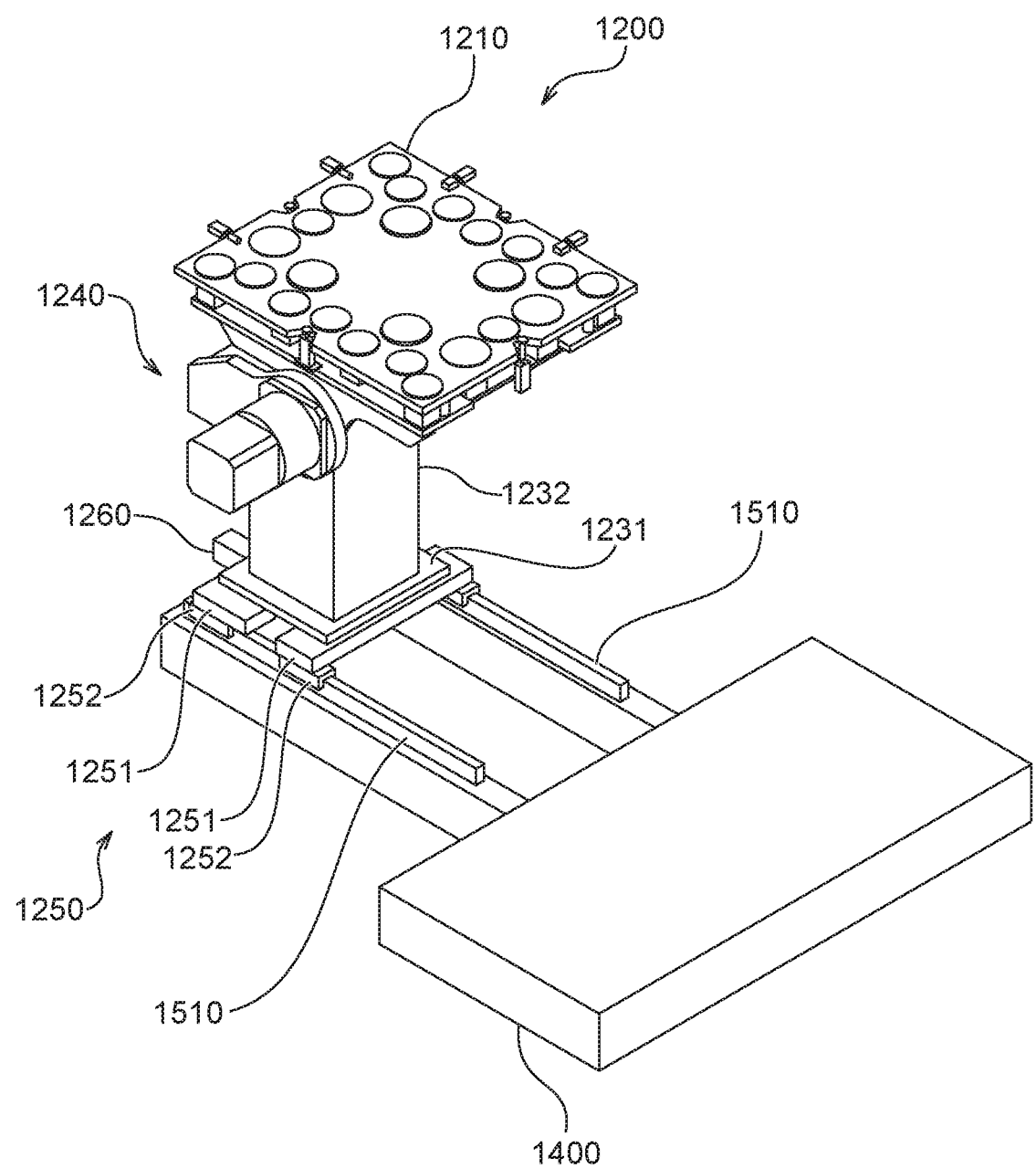
FIG. 23B is a perspective view of the turning device in a second posture.
Figure 23C:
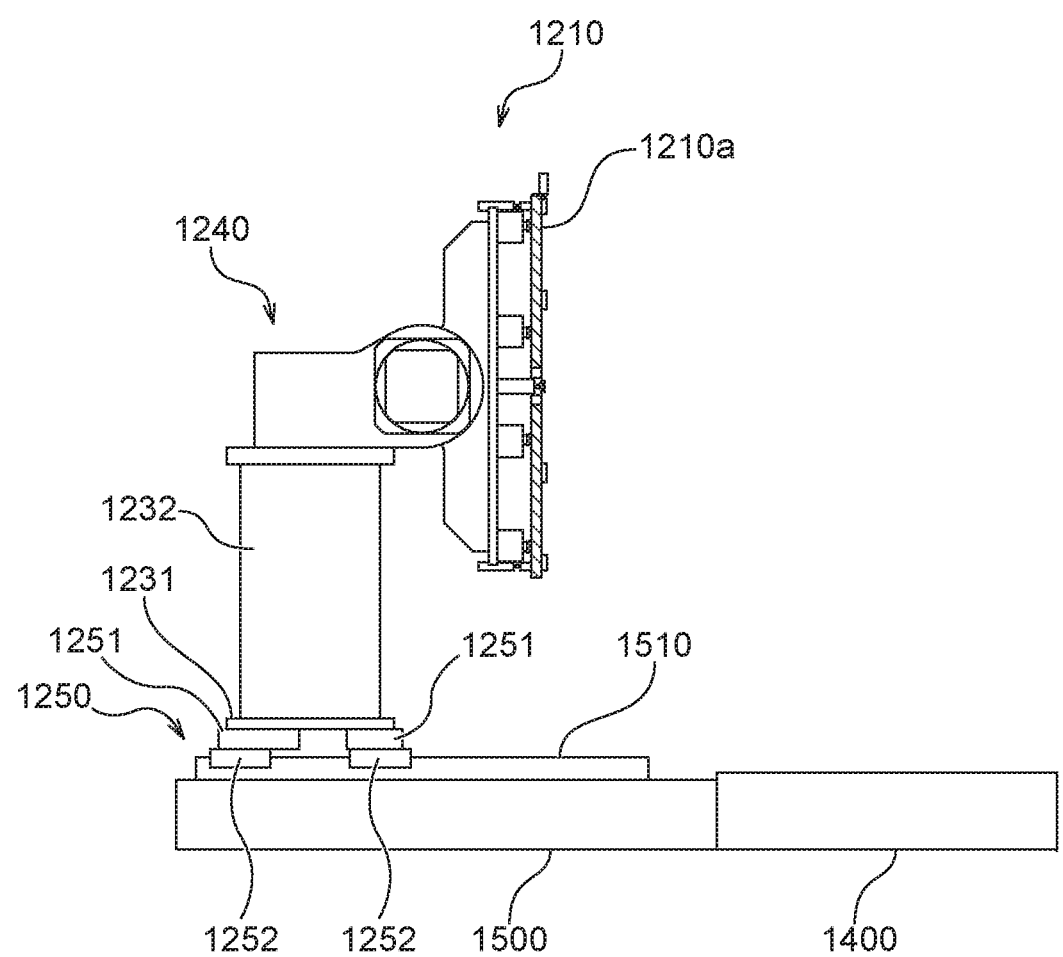
FIG. 23C is a side view of the turning device.
Figure 23D:
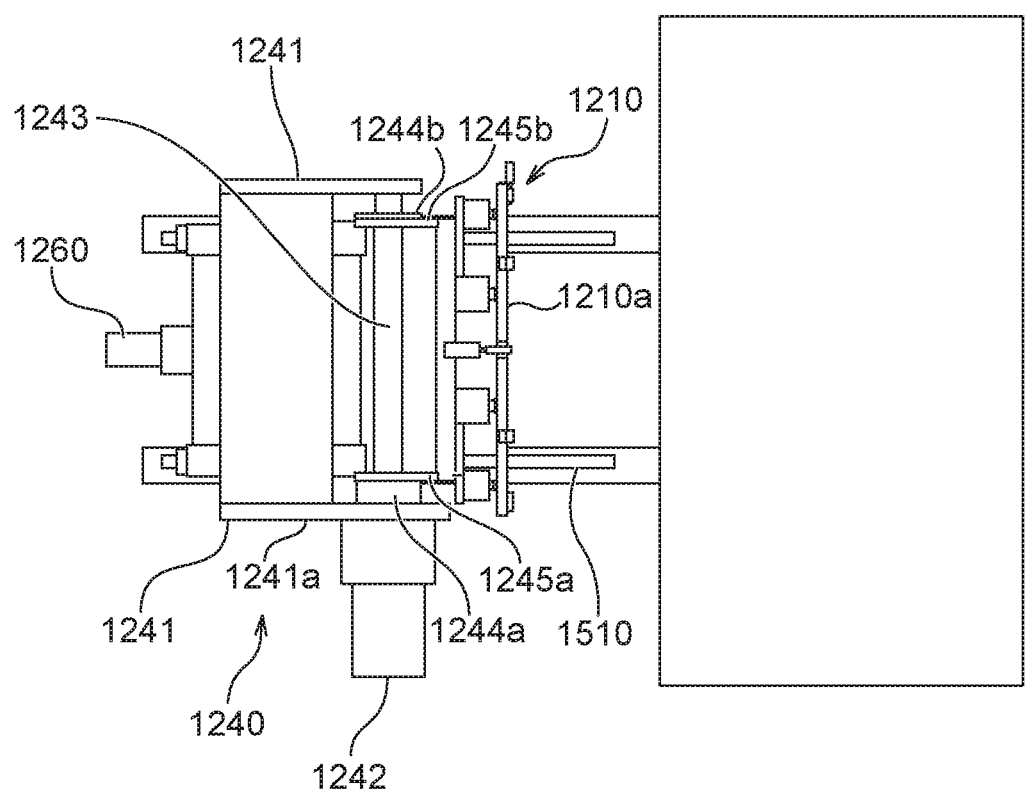
FIG. 23D is a plan view of the turning device.
Figure 23E:
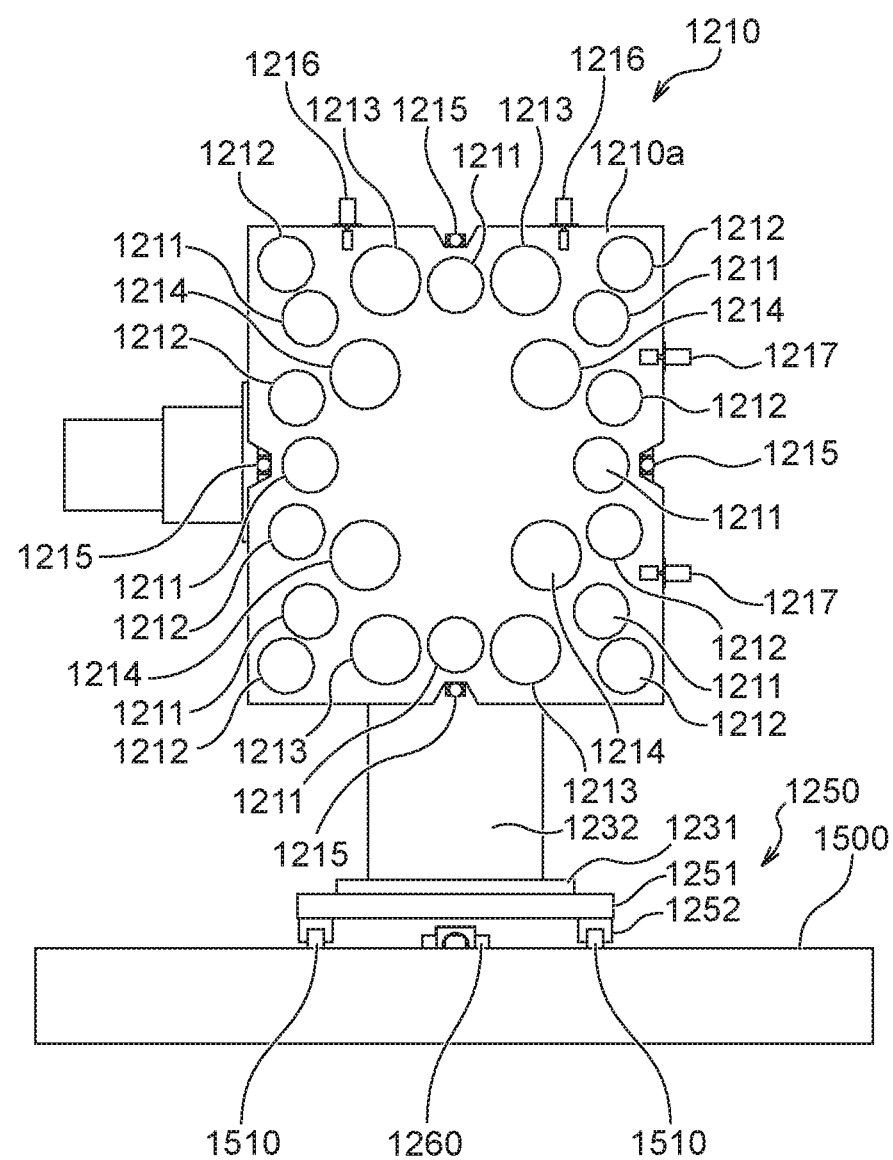
FIG. 23E is an elevation view of the turning device.
Figure 23F:
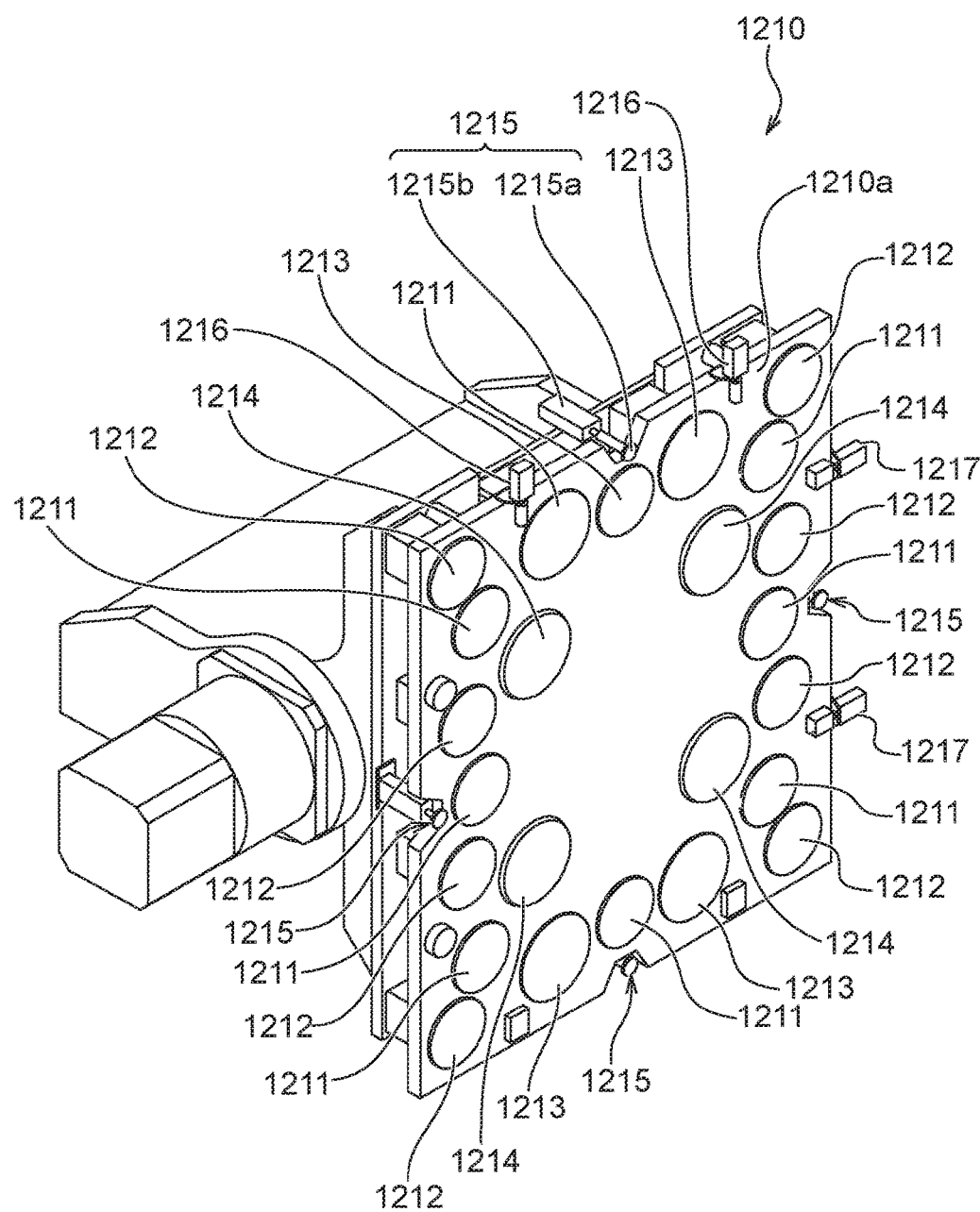
FIG. 23F is an enlarged perspective view of a support plate part of the turning device.
Figure 23G:
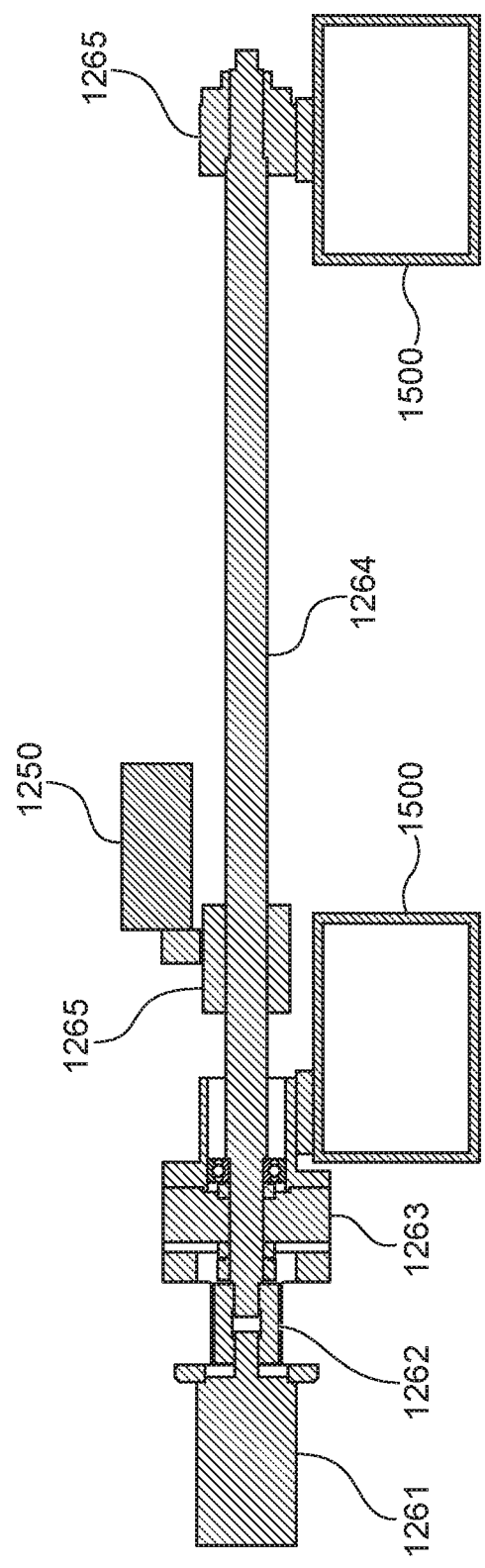
FIG. 23G is a sectional view of a linear motion mechanism of the turning device.

FIG. 23A is a perspective view of the turning device in a first posture. FIG. 23B is a perspective view of the turning device in a second posture. FIG. 23C is a side view of the turning device. FIG. 23D is a plan view of the turning device. FIG. 23E is an elevation view of the turning device. FIG. 23F is an enlarged perspective view of a support plate part of the turning device. FIG. 23G is a sectional view of a linear motion mechanism of the turning device.

As shown in FIGS. 23A to 23E, the turning device 1200 includes a main body 1232, a turning mechanism 1240, and a support plate part 1210. The main body 1232 has a substantially cuboid shape and includes a side along a longitudinal direction of the constituent components 1500 and a side along a width direction of the constituent components 1500. The side along the width direction of the constituent components 1500 is formed longer than the side along the longitudinal direction of the constituent components 1500. A flange 1231 is provided integrally with or separately from a lower part of the main body 1232. A guide member 1250 is attached to a lower surface of the flange 1231. The guide member 1250 has two coupling plates 1251 attached to the lower surface of the flange 1231, and a guide part 1252 attached to a lower surface of each of the coupling plates 1251. The coupling plates 1251 expand in a direction across the constituent components 1500. The guide part 1252 is provided to the lower surface of each of the coupling plates 1251 to be located on a width-direction end of each of the constituent components 1500. The guide parts 1252 are engaged with the rails 1510 of the constituent components 1500. The main body 1232 of the turning device 1200 is guided along the rails 1510. The configuration described above enables the turning device 1200 to move along the rails 1510 while being guided by the guide part 1252.

A linear motion mechanism 1260 is disposed in a lower surface of the guide member 1250 (coupling plate 1251) (FIG. 23E). As shown in FIG. 23G, the linear motion mechanism 1260 includes an electric motor 1261, a coupling mechanism 1262, an electromagnetic brake 1263, a ball screw 1264, and a nut 1265. The guide member 1250 (coupling plate 1251) is fixed to the nut 1265. The linear motion mechanism 1260 is fixed to the constituent components 1500. The electric motor 1261 is, for example, a servomotor. The coupling mechanism 1262 is a coupling which movably couples a rotary shaft of the electric motor 1261 and the ball screw 1264 to each other and transmits rotation of the rotary shaft of the electric motor 1261 to the ball screw 1264. The electromagnetic brake 1263, for example, turns on/off an exciting coil (electric magnet) to engage/release an armature with/from a brake hub, thereby stopping or allowing rotation of the ball screw 1264. The nut 1265 is prevented from rotating by being fastened to the guide member 1250 which is regulated in linear motion by the rails 1510. The nut 1265 linearly moves (forward or rearward) along an axial direction of the ball screw 1264 when the ball screw 1264 rotates. The ball screw 1264 and the nut 1265 form a rotation-linear motion conversion mechanism and convert the rotation of the electric motor 1261 into the linear motion of the guide member 1250 and the turning device 1200.

A turning mechanism 1240 is mounted on an upper part of the main body 1232 of the turning device 1200 (FIG. 23C). The turning mechanism 1240 includes a frame 1241, an electric motor 1242, and a support plate turning shaft 1243 (FIG. 23D). The frame 1241 has such a shape that the support plate part 1210 side is open in a planar view. The electric motor 1242 is attached to an outer surface of a side wall located close to an opening of the frame 1241. The support plate turning shaft 1243 has a first end which coupled to the rotary shaft of the electric motor 1242 through a decelerator 1244*a* disposed in a side wall 1241*a* of the frame 1241. The support plate turning shaft 1243 further has a second end which is rotatably supported by a bearing 1244*b* disposed in a side wall 1241*b* of the frame 1241, which is located opposite the side wall 1241*a*. The support plate turning shaft 1243 is unrotatably fixed to the support plate part 1210 by coupling mechanisms 1245*a* and 1245*b*. In response to the rotation of the electric motor 1242, the support plate part 1210 rotates along with the rotation of the support plate turning shaft 1243. If the decelerator 1244*a* is omitted, a bearing is utilized, instead of the decelerator 1244*a*, to rotatably support the first end of the support plate turning shaft 1243.

The support plate part 1210 is rotated around the support plate turning shaft 1243 by the turning mechanism 1240 to be capable of having two postures including a first posture (upright posture in the present example) (FIG. 23A) and a second posture (horizontal posture in the present example) (FIG. 23B). The horizontal posture is a posture that is horizontal relative to the installation surface of the device. The upright posture is a posture that is vertical to the installation surface of the device. The upright posture may be referred to as a vertical posture. The horizontal posture may be slightly deviated relative to a perfect horizontal plane as long as the deviation does not affect the later-mentioned attachment of the substrate S to the back plate 400. The upright posture does not have to be perfectly vertical as long as the later-mentioned attachment of the back plate 400 to the front plate 300 can be possible. In this light, the horizontal posture and the upright posture (vertical posture) may be referred to as a substantially horizontal posture and a substantially upright posture (substantially vertical posture), respectively.

The support plate part 1210 includes a support plate 1210*a* having a support face which supports the back plate 400 of the substrate holder 1, and various devices disposed in the support face of the support plate 1210*a* (FIGS. 23C, 23E and 23F). The various devices will be explained below with reference to FIGS. 23E and 23F.

As shown in FIGS. 23E and 23F, the support plate 1210*a* is provided with eight actuators 1211, eight actuators 1212, four actuators 1213, four vacuum device 1214, four actuators 1215, two longitudinal horizontal positioning devices 1216, and two lateral horizontal positioning devices 1217. Since more than one actuator 1212 is provided, the back plate 400 is evenly pressed by adjusting a pressing force of each actuator. Likewise, the plurality of actuators 1213 enables the back plate 400 to be evenly pressed by adjusting the pressing force of each actuator. An optimum number of the actuators and vacuum devices may be decided according to a required pressing force and/or adsorption force.

The actuator 1211 corresponds to the actuator AR2 shown in FIG. 14B. In the present example, the actuator 1211 has an air cylinder functioning as the drive DRV, the air cylinder being located on a rear face side of the support plate 1210*a*. The actuator 1211 further has a rod-like member (rod) RD which is driven by the air cylinder. The actuator 1211 presses the button 470 and thus opens the clip 421 (FIG. 14B). In practice, the rod RD of the actuator 1211 is exposed from the rear face side of the support plate 1210*a* to the front face side in a substantial center of each of respective circular areas shown in FIGS. 23E and 23F.

The actuators 1212 and 1213 are actuators for pressing the substrate holder 1 from the back plate 400 side to compress the inner seal 361 and the outer seal 362 of the substrate holder in the holder station 1100. The actuators 1212 and 1213, as well as the actuator 1211, are configured to include a rod on the rear face side of the support plate 1210*a*, the rod being driven by the air cylinder. In practice, the rods RD of the actuators 1212 are exposed from the rear face side of the support plate 1210*a* to the front face side in a substantial center of each of respective circular areas shown in FIGS. 23E and 23F.

The actuator 1213 further has an adsorption mechanism which sucks in the back plate 400 by using an adsorption chuck (also referred to as a non-contact chuck), such as a vacuum ejector and a Bernoulli chuck (see FIG. 27K, which will be explained later). The actuator 1213 has pressing and adsorbing functions, and is configured as a pressure adsorption mechanism. In the following explanation, the actuators 1213 may be also referred to as pressure adsorption cylinders 1213.

The vacuum device 1214 is a device configured to suck in and adsorb the back plate 400 by means of a vacuum pad using a vacuum ejector or the like. The vacuum device 1214 starts sucking in the back plate 400 while the support plate 1210*a* is in the second posture (horizontal posture in the present embodiment).

The actuator 1215 corresponds to the actuator AR1 in FIG. 10B. In the present example, the actuator 1215 has an air cylinder 1215*b* as the drive DRV, and further has a rod 1215*a* as the rod-like member RD which is driven by the air cylinder. The actuator 1215 is disposed in a substantial middle of each side of the support plate 1210*a*. The actuator 1215 presses the lever 342 to open the clamp 340 (FIGS. 10A and 10B).

The horizontal positioning device 1216 is an actuator having a rod which is driven by an air cylinder. The horizontal positioning device 1216 presses a side face of the back plate 400 placed on the support plate 1210*a* and adjusts the position of the back plate 400 within a plane of the support plate 1210*a*. The horizontal positioning device 1216 comprises two horizontal positioning devices disposed in two places of one side (upper side in the present example) of the support plate 1210*a*.

The horizontal positioning device 1217 is an actuator having a rod which is driven by an air cylinder. The horizontal positioning device 1217 presses a side face of the back plate of the back plate 400 placed on the support plate 1210*a* and adjusts the position of the back plate 400 within the plane of the support plate 1210*a*. The horizontal positioning device 1217 comprises two horizontal positioning devices disposed in two places of one side (right side in the present example) of the support plate 1210*a*.

The horizontal positioning devices 1216 and the horizontal positioning devices 1217 are respectively provided to adjacent sides of the support plate 1210*a*. In this example, the upper and lower sides of the support plate 1210*a* are shorter than the right and left sides. It can be therefore said that the horizontal positioning devices 1216 and the horizontal positioning devices 1217 are provided in a short side and a long side, respectively. The horizontal positioning devices 1216 are provided to the short side and presses the back plate 400 along the long side, to thereby perform longitudinal positioning. The horizontal positioning devices 1217 are provided to the long side and presses the back plate 400 along the short side, to thereby perform lateral positioning.

(Holder Station)

Figure 24A:
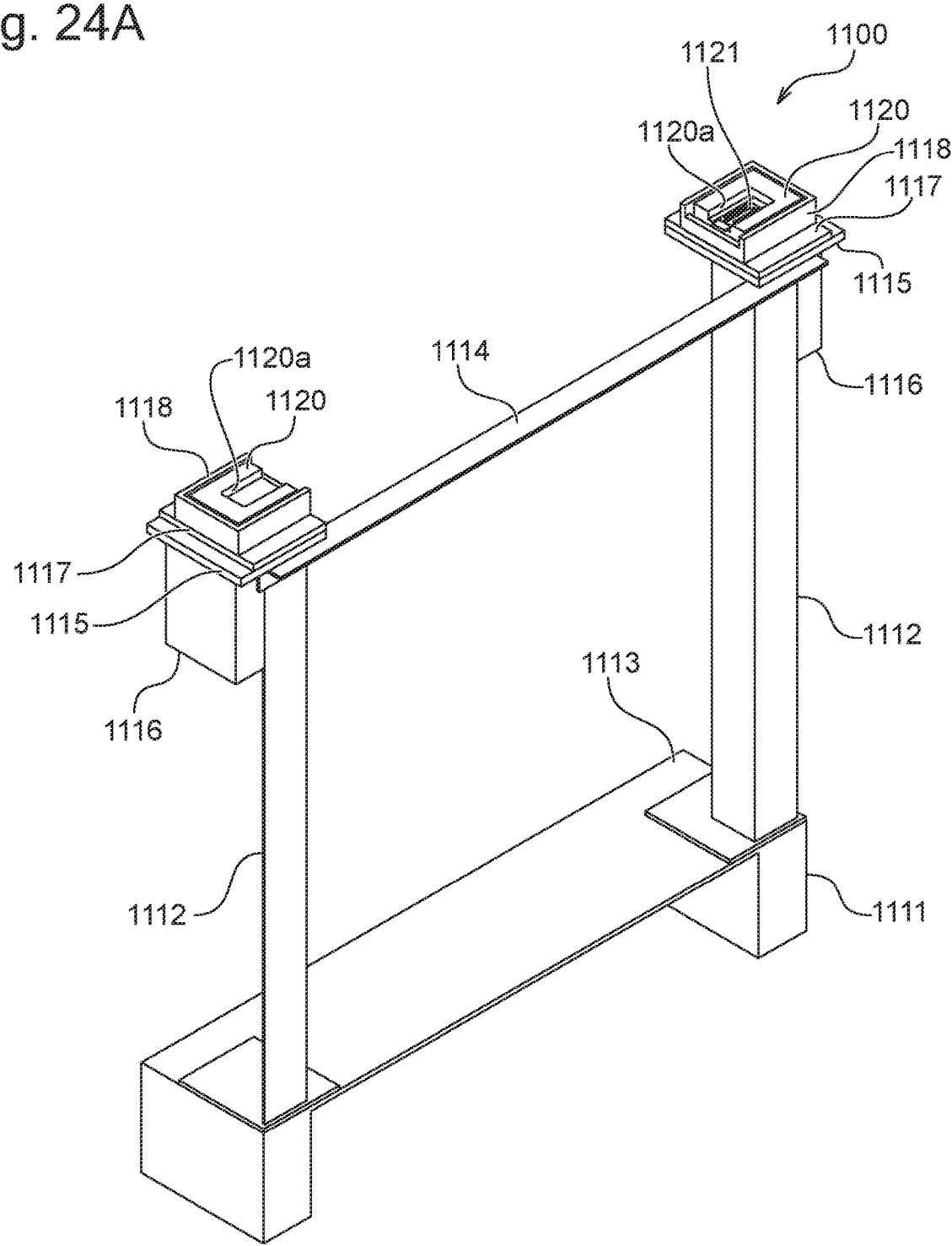
FIG. 24A is a perspective view of the holder station.
Figure 24B:
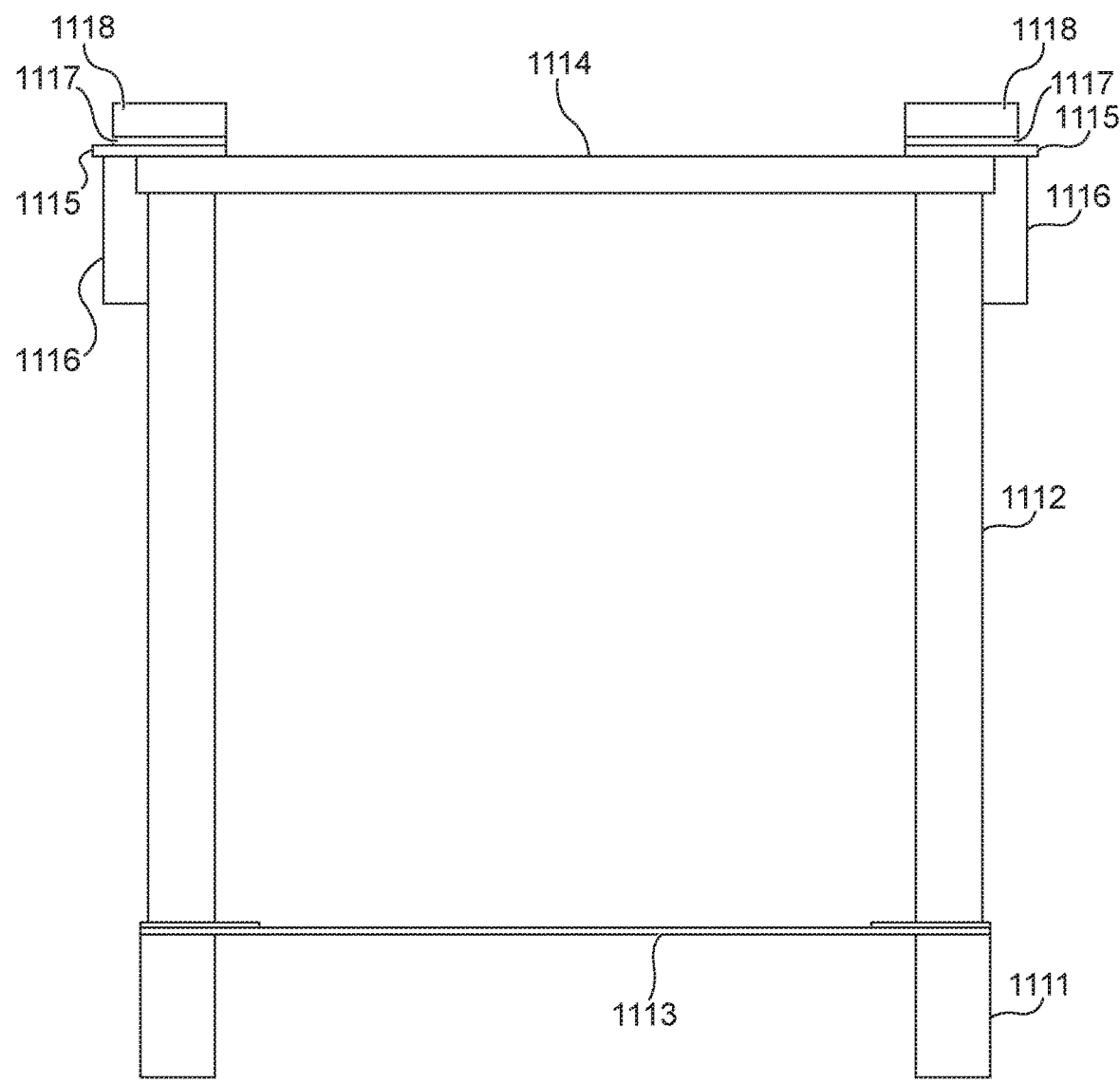
FIG. 24B is an elevation view of the holder station.
Figure 24C:
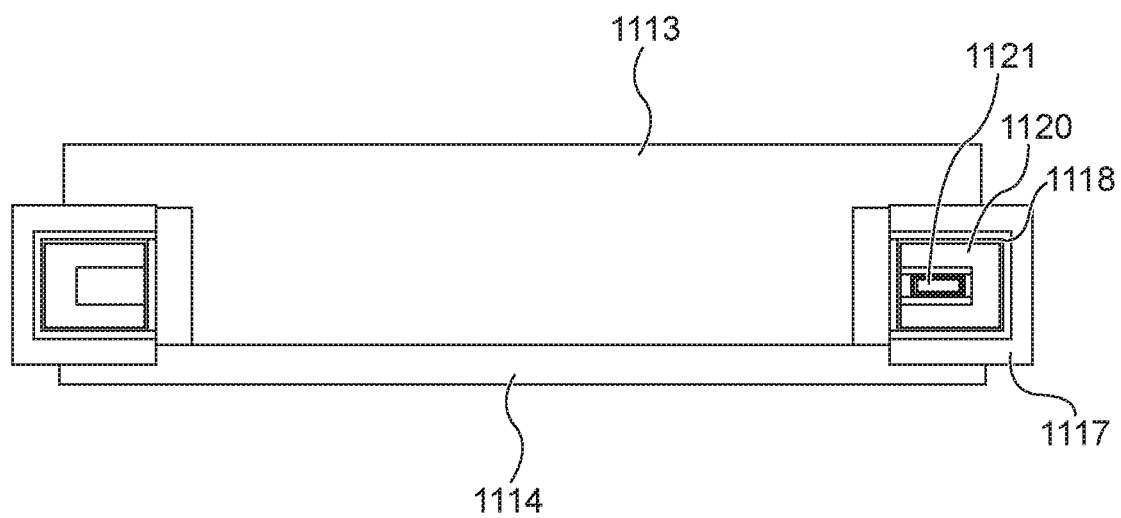
FIG. 24C is a plan view of the holder station.
Figure 24D:
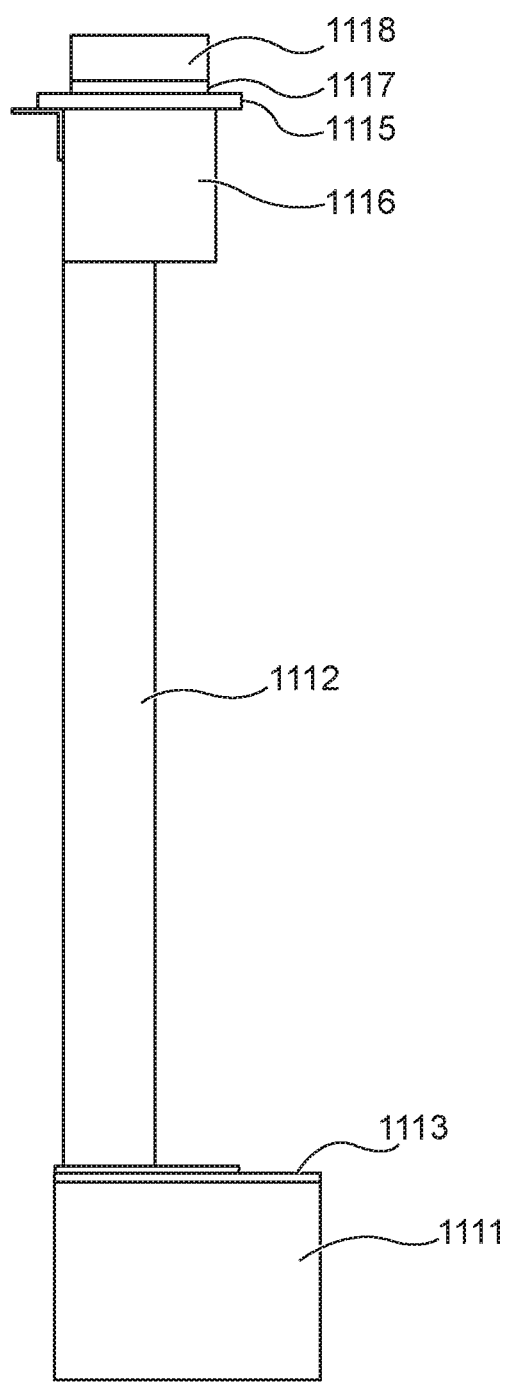
FIG. 24D is a side view of the holder station.

FIG. 24A is a perspective view of the holder station. FIG. 24B is an elevation view of the holder station. FIG. 24C is a plan view of the holder station. FIG. 24D is a side view of the holder station.

The holder station 1100 includes legs 1111, supporting columns 1112, a lower transverse plate 1113, an upper transverse plate 1114, flanges 1115, and arm receivers 1120. The two legs 1111 are fixed on the base 1400 with a predetermined distance from each other. The lower transverse plate 1113 is fixed on the legs 1111 together with the supporting columns 1112 in the vicinity of both end portions of the lower transverse plate 1113. The supporting columns 1112 are each fixed to the lower transverse plate 1113 and the legs 1111, for example, by bolts. Overhanging portions 1116 are disposed in upper portions of the supporting columns 1112. Flanges 1115 are attached to upper surfaces of the overhanging portions 1116 and the supporting columns 1112. A first attachment member 1117 is disposed on each of the flanges 1115 to he fixed to the flanges 1115 and the upper transverse plate 1114. Both ends of the upper transverse plate 1114 are fixed to lower faces of the respective flanges 1115. The arm receivers 1120 are attached on the respective first attachment members 1117 by using second attachment members 1118. The arm receivers 1120 each have a recess 1120a into which an end portion of the arm 330 of the substrate holder 1. An energization determination device 1121 explained later is disposed in the recess 1120a into which the arm 330 attached with the connector 331 is inserted. The upper transverse plate 1114 couples the upper portions of the supporting columns 1112 to each other.

Figure 25A:
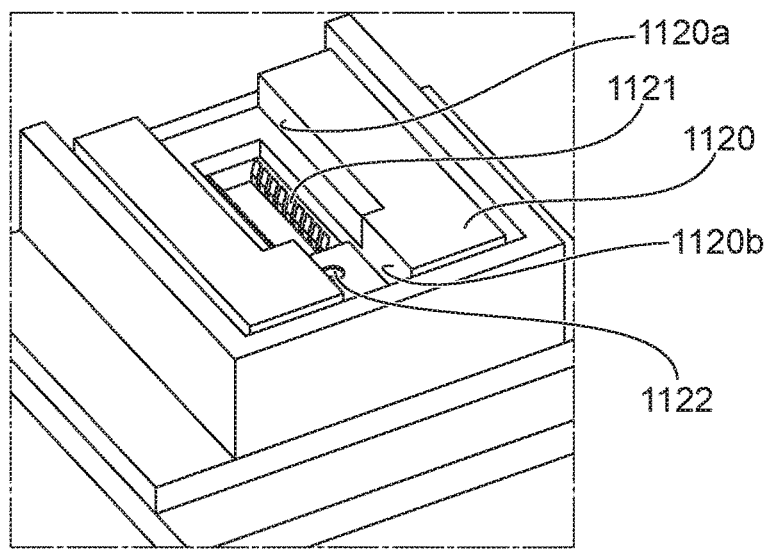
FIG. 25A is an enlarged perspective view of an arm receiver of the holder station with a positioning pin retracted.
Figure 25B:
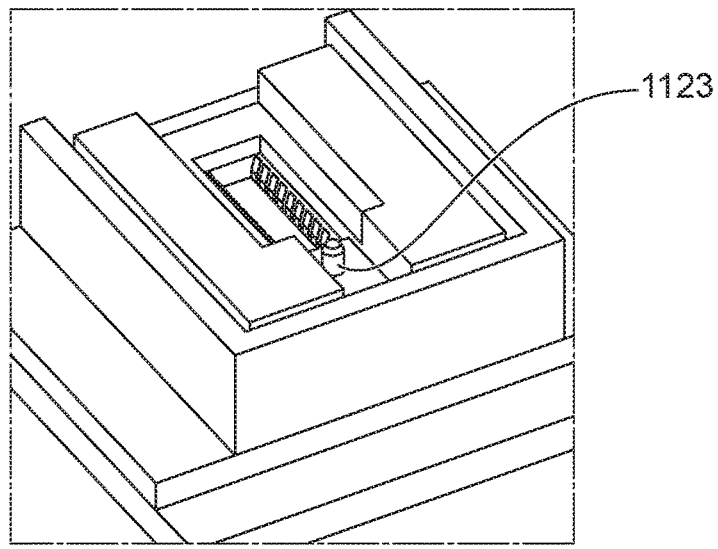
FIG. 25B is an enlarged perspective view of the arm receiver of the holder station with the positioning pin projecting.
Figure 25C:
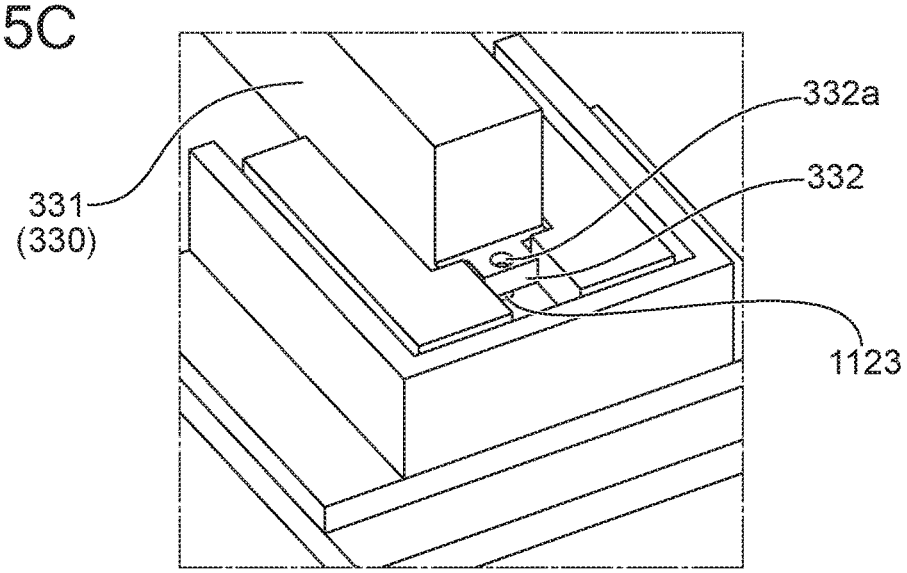
FIG. 25C is an enlarged perspective view of the arm receiver of the holder station with an arm of the substrate holder disposed.

FIG. 25A is an enlarged perspective view of the arm receiver of the holder station with a positioning pin retracted. FIG. 25B is an enlarged perspective view of the arm receiver of the holder station with the positioning pin projecting. FIG. 25C is an enlarged perspective view of the arm receiver of the holder station with an arm of the substrate holder disposed.

The arm receiver 1120 is provided with the recess 1120a for receiving the arm 330 of the substrate holder 1. In an outer side of the recess 1120a, a recess 1120b having a width smaller than the recess 1120a is formed continuously from the recess 1120a. The recess 1120b has a bottom surface which is provided with a pin hole 1122. A positioning pin 1123 is housed in the pin hole 1122. The positioning pin 1123 is configured to take either a position where the positioning pin 1123 is protruding from the pin hole 1122 (FIG. 25B) or a position where the positioning pin 1123 is housed inside the pin hole 1122 (FIG. 25A), depending on a power mechanism 1123a (FIG. 26F), such as the electric motor and the air cylinder.

The energization determining device 1121 is disposed in the recess 1120a of the arm receiver 1120. In the end portion of the arm 330 of the substrate holder 1, which is not provided with the connector 331, the energization determining device 1121 is not disposed in the arm receiver 1120.

Before the substrate 1 is received by the holder station 1100, the positioning pin 1123 is housed in the pin hole 1122 as shown in FIG. 25A. When the substrate holder 1 is received by the holder station 1100, the positioning pin 1123 is moved to the position where the positioning pin 1123 is protruding from the pin hole 1122 (FIG. 25B). The arm 330 of the substrate holder 1 is then placed on the arm receiver 1120 by a transporter, not shown. This causes the positioning pin 1123 to be inserted into a positioning hole 332a of a positioning piece 332 which is disposed integrally with or separately from the arm 330. The arm 330 is thus positioned relative to the arm receiver 1120, which also positions the substrate holder 1 in the holder station 1100.

(Support Device)

Figure 26A:
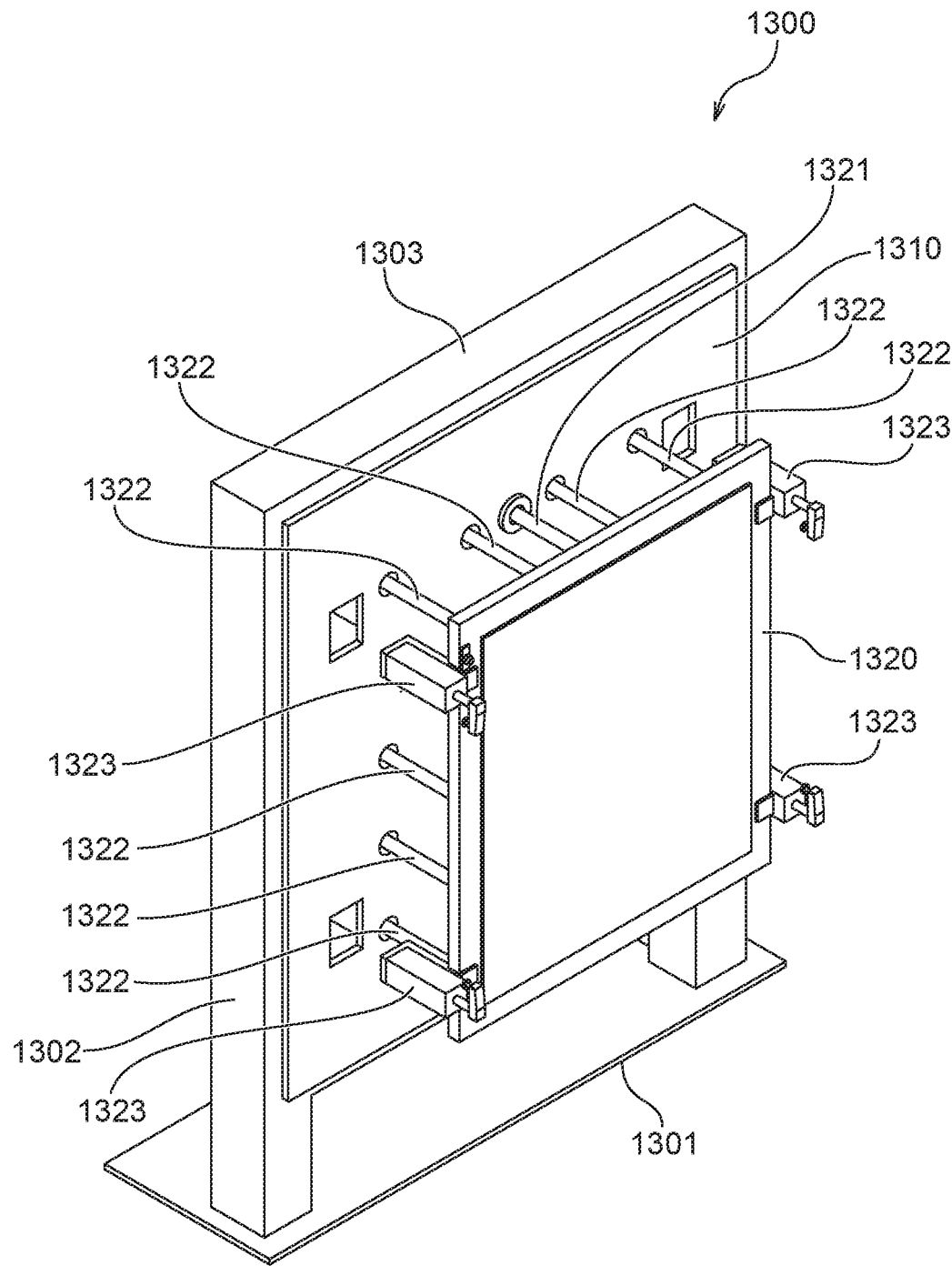
FIG. 26A is a perspective view of the supporting device.
Figure 26B:
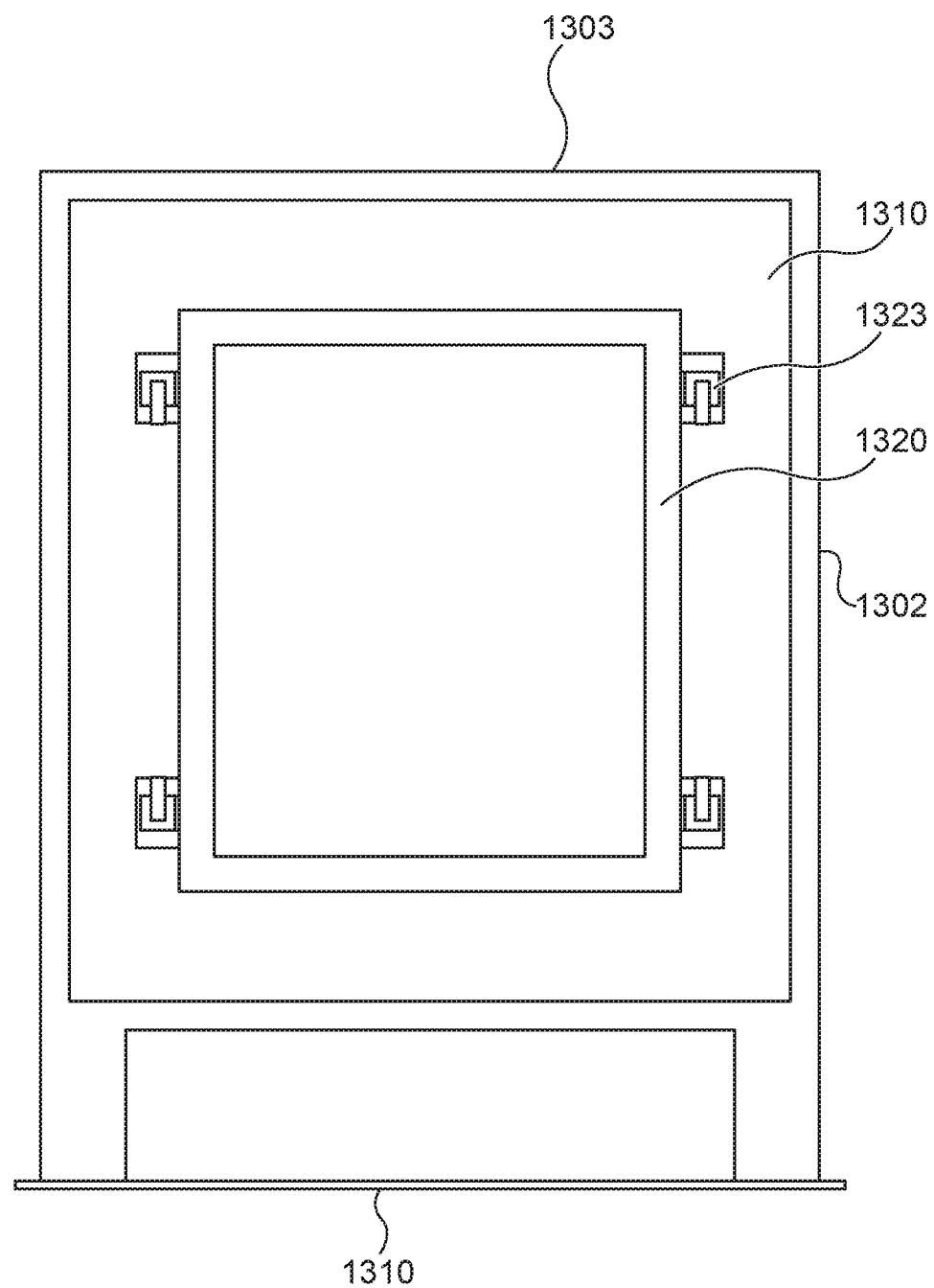
FIG. 26B is an elevation view of the supporting device.
Figure 26C:
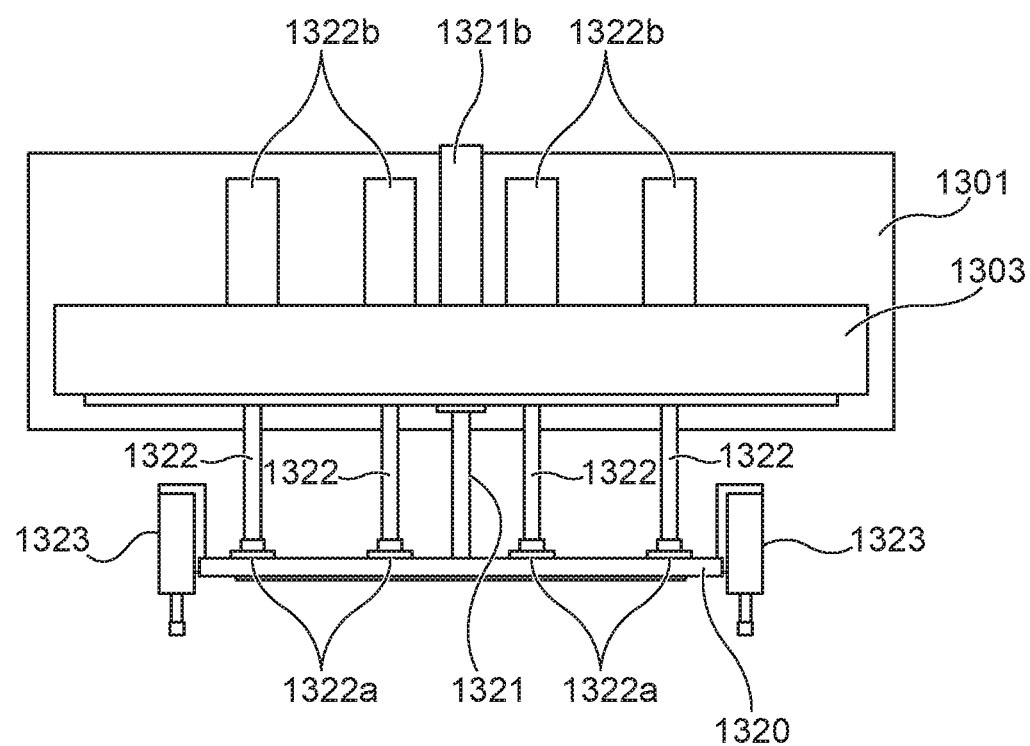
FIG. 26C is a plan view of the supporting device.
Figure 26D:
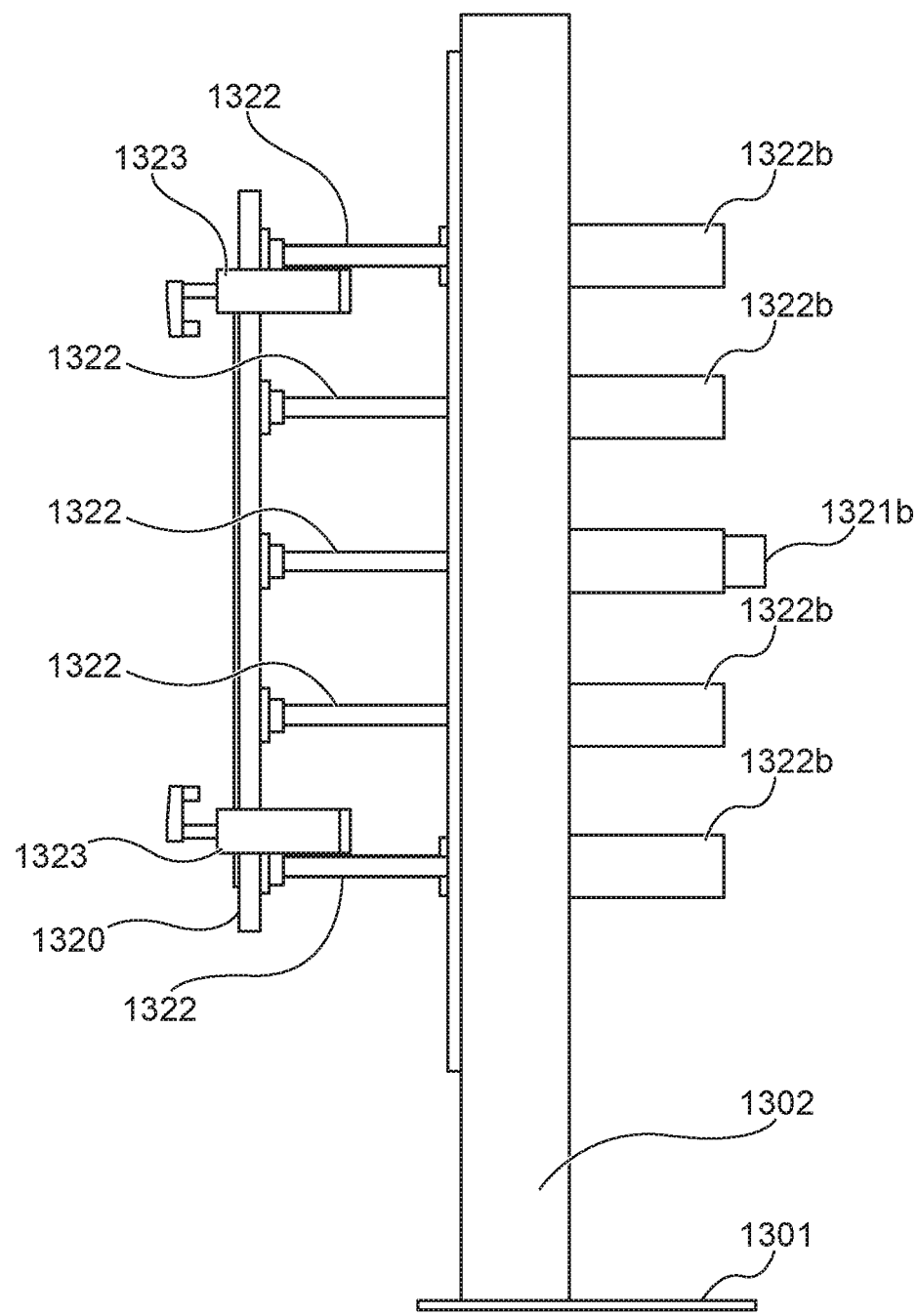
FIG. 26D is a side view of the supporting device.
Figure 26E:
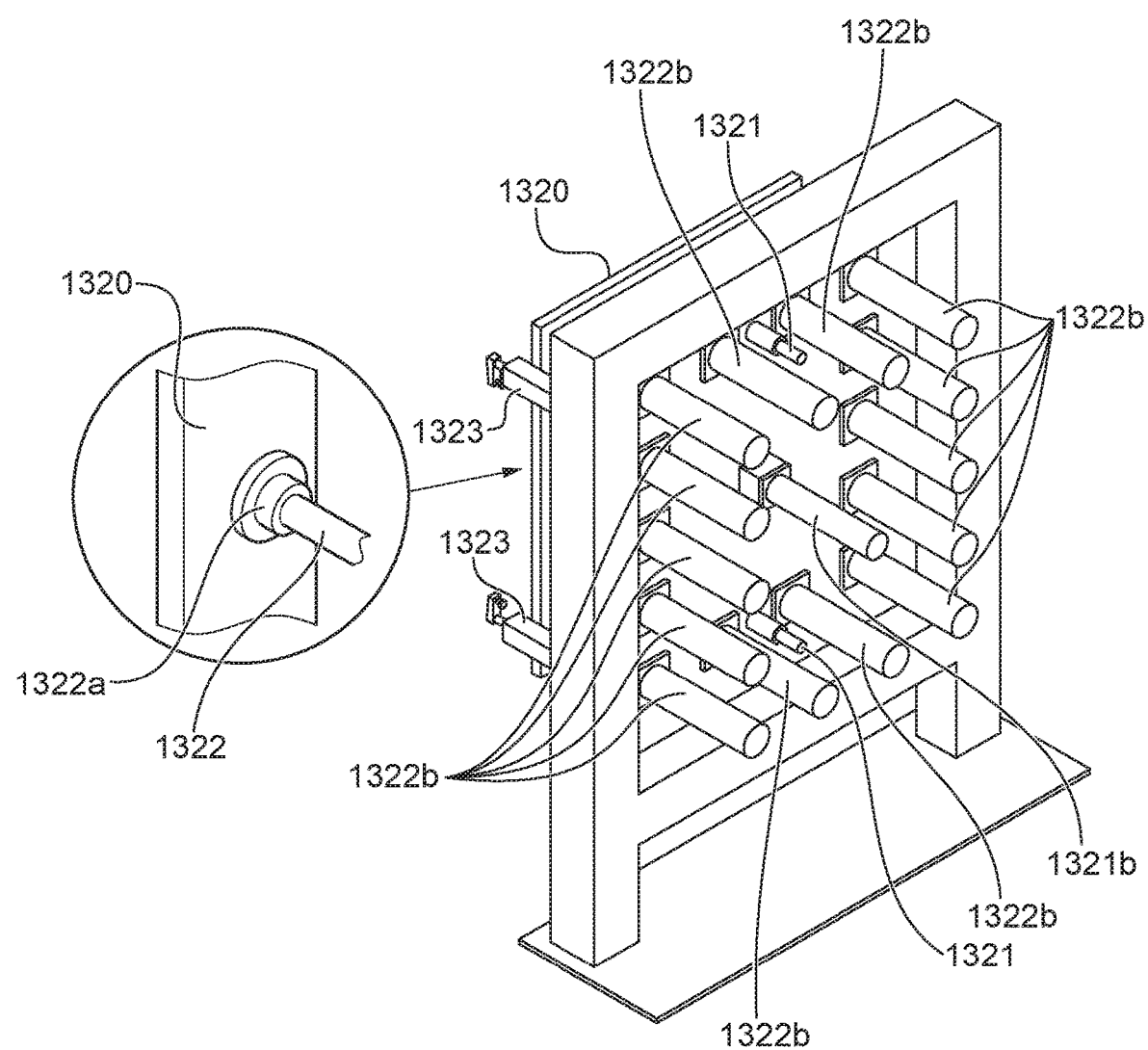
FIG. 26E is a rear perspective view of the supporting device.
Figure 26F:
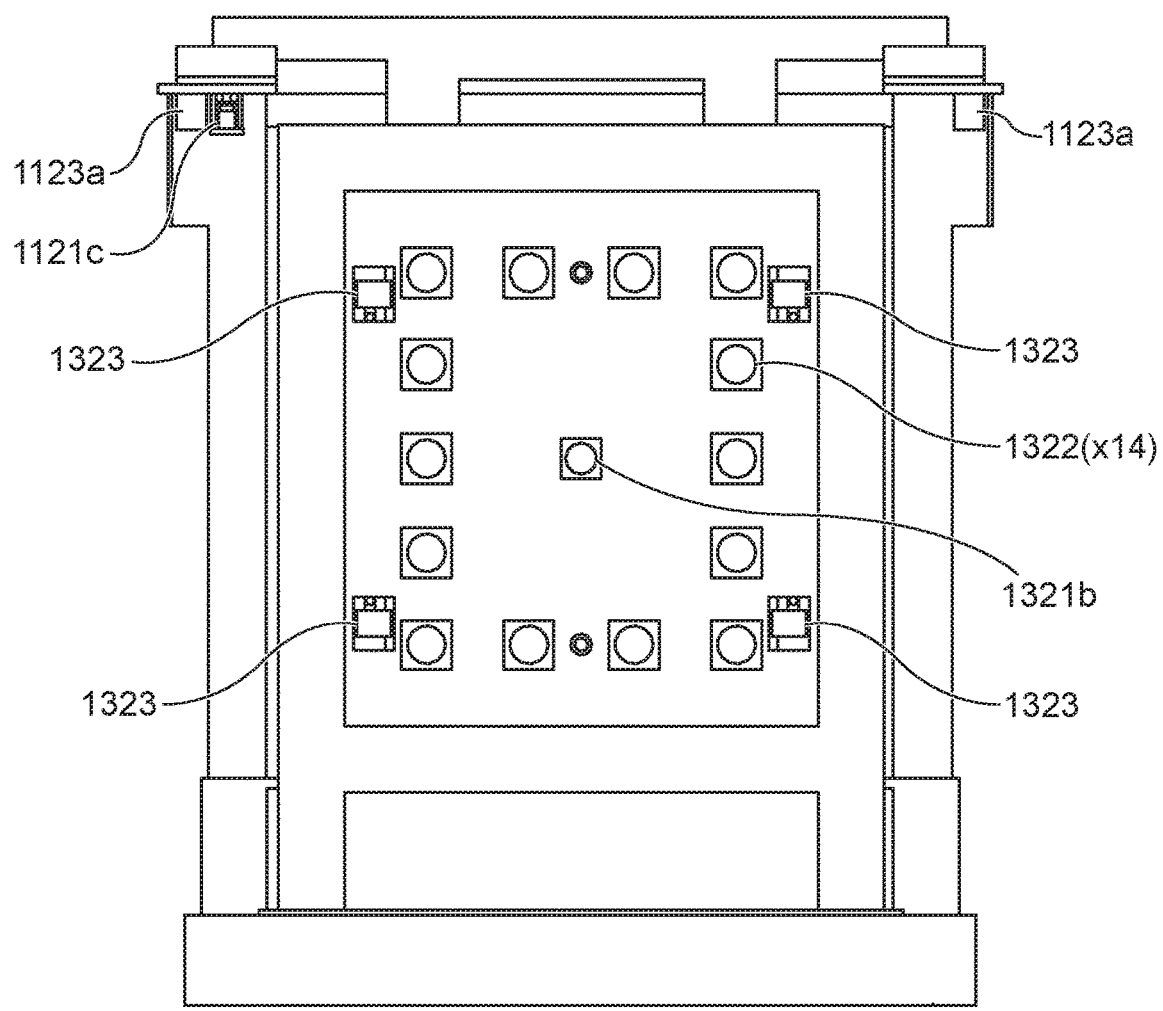
FIG. 26F is a rear view of the supporting device.

FIG. 26A is a perspective view of the supporting device. FIG. 26B is an elevation view of the supporting device. FIG. 26C is a plan view of the supporting device. FIG. 26D is a side view of the supporting device. FIG. 26E is a rear perspective view of the supporting device. FIG. 26F is a rear view of the supporting device.

The support device 1300 includes a base 1301, two supporting columns 1302, an upper transverse beam 1303, a min body panel 1310, and a support plate 1320. The base 1301 is fixed on the base 1400 mentioned above. The supporting columns 1302 are fixed on the base 1301 at predetermined distance. The upper transverse beam 1303 is fixed to upper parts of the supporting columns 1302.

The support plate 1320 is configured to be reciprocatable in directions toward and away from the main body panel 1310 due to a plurality of rods 1321 and a plurality of reinforcing rods 1322.

The three rods 1321 are evenly aligned in a vertical direction at horizontally center of the support plate 1320 (FIG. 26A). In FIG. 26A, the vertically middle and lower rods 1321 are hidden behind the support plate 1320. The vertically middle rod 1321 is a rod part of an air cylinder 1321b shown in FIG. 26E. The air cylinder 1321b is fixed to a rear face of the main body panel 1310 so that the rod 1321 extends through the main body panel 1310 from the rear face side of the main body panel 1310 to a front face side thereof. The upper and lower rods 1321 extend through through-holes formed in the main body panel 1310 to be guided to the rear face side of the main body panel 1310 (FIG. 26E), and are slidable relative to the main body panel 1310. The upper and lower rods 1321 each have a front end which is fixed to a rear face of the support plate 1320 by a fastening member such as a bolt (FIG. 26C). The middle rod 1321 extends through a through-hole formed in the main body panel 1310 to be connected to a cylinder part of the air cylinder 1321b (FIGS. 26C and 26E) which is disposed in the rear face side of the main body panel 1310. The middle rod 1321 also has a front end which is fixed to the rear face of the support plate 1320 by the fastening member such as a bolt. When the air cylinder 1321b is driven to shift the middle rod 1321 forward, the support plate 1320 also shifts forward. When the air cylinder 1321b is driven to shift the middle rod 1321 rearward, the support plate 1320 also shifts rearward. The upper and lower rods 1321 shift forward and rearward along with the forward and rearward shifting of the support plate 1320, which are caused by the middle rod 1321. In this way, the upper and lower rods 1321 perform a function of guiding the shifting of the support plate 1320.

The reinforcing rods 1322 are rod parts of air cylinders 1322b (FIG. 26C) disposed on the rear side of the main body panel 1310. Each of the reinforcing rods 1322 is connected to a cylinder pail of the air cylinder 1322b. In the present example, as shown in FIG. 26E, the air cylinders 1322b comprise 14 air cylinders 1322b. The 14 air cylinders 1322b are arranged along an edge of the support plate 1320. The reinforcing rods 1322 are arranged correspondingly to positions of the air cylinders 1322b. A flange member 1322a is screwed onto a front end of each of the reinforcing rods 1322 (FIGS. 26C and 26E). The reinforcing rod 1322 is configured to press the rear face of the support plate 1320 with an end face of the flange member 1322a. The reinforcing rod 1322 presses the rear face of the support plate 1320 with the end face of the flange member 1322a toward a front face of the support plate 1320. The reinforcing rods 1322 have a function of aiding the support of the support plate 1320 by the rods 1321.

Locking devices 1323 are fixed to the support plate 1320 to be located near four corners of the support plate 1320 (FIGS. 26A to 26D and 27G to 27I). As shown in FIGS. 27G to 27I, the locking device 1323 includes a pressing member 1323a, a rod 1323b attached with the pressing member 1323a at the first end, and an air cylinder 1323c connected to a second end of the rod 1323b. The pressing member 1323a has a pressing part 1323d in contact with the rear face of the front plate 300 (FIG. 27G). The air cylinder 1323c here is a device of a rotary clamp type. The air cylinder 1323c rotates while stroking the rod 1323b and the pressing member 1323a in a protruding direction (from FIG. 27G to FIG. 27H), and rearwardly strokes the rod 1323b and the pressing member 1323a, which are rotated at an angle of 90 degrees, to thereby press the front plate 300 with the pressing part 1323d (FIG. 27I).

(Operation Flow of the Substrate Attachment/Detachment Device)

Figure 27W:
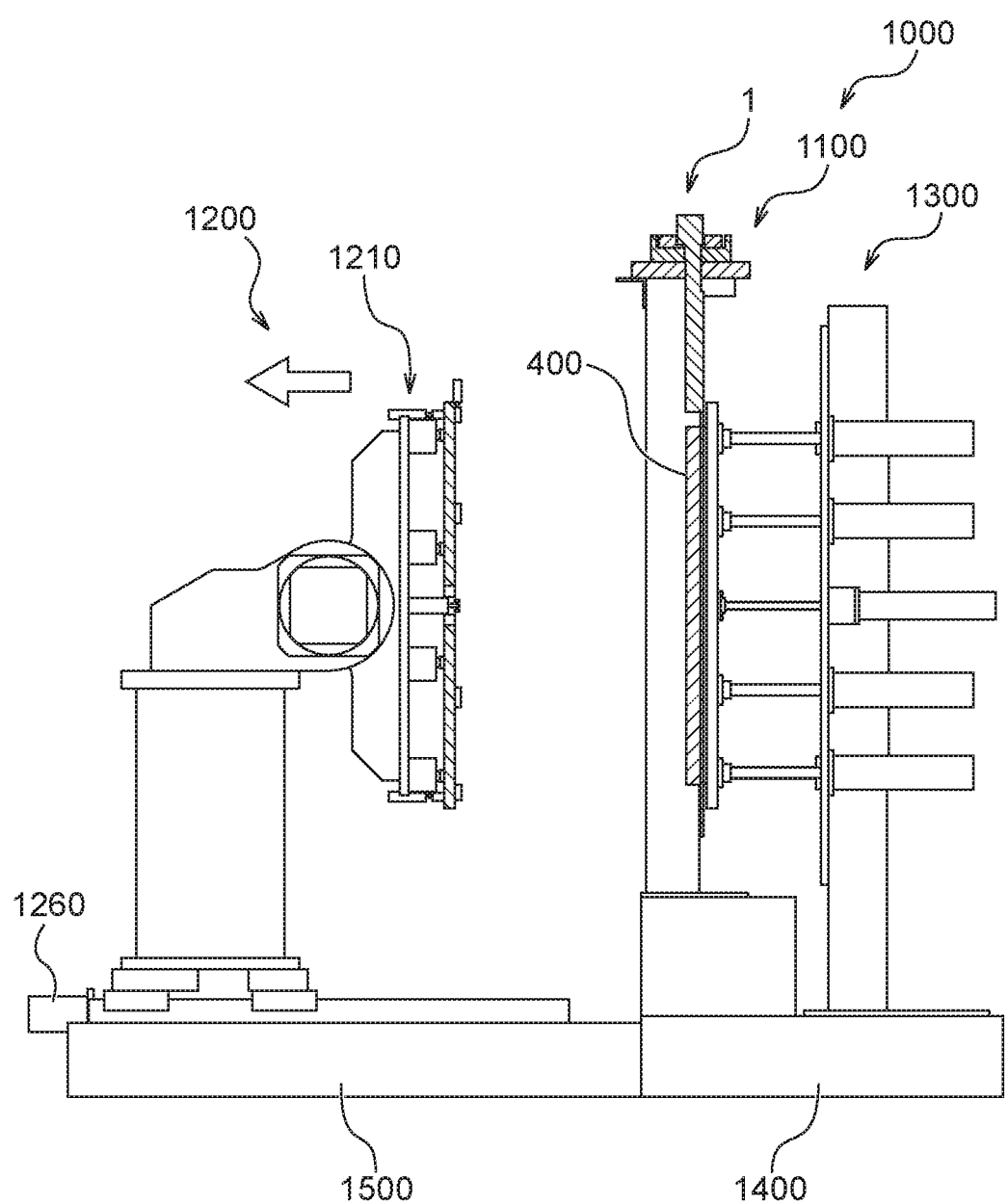
FIG. 27W is a side view of the substrate attachment/detachment device with the turning device retreated in a retreat position.
Figure 27X:
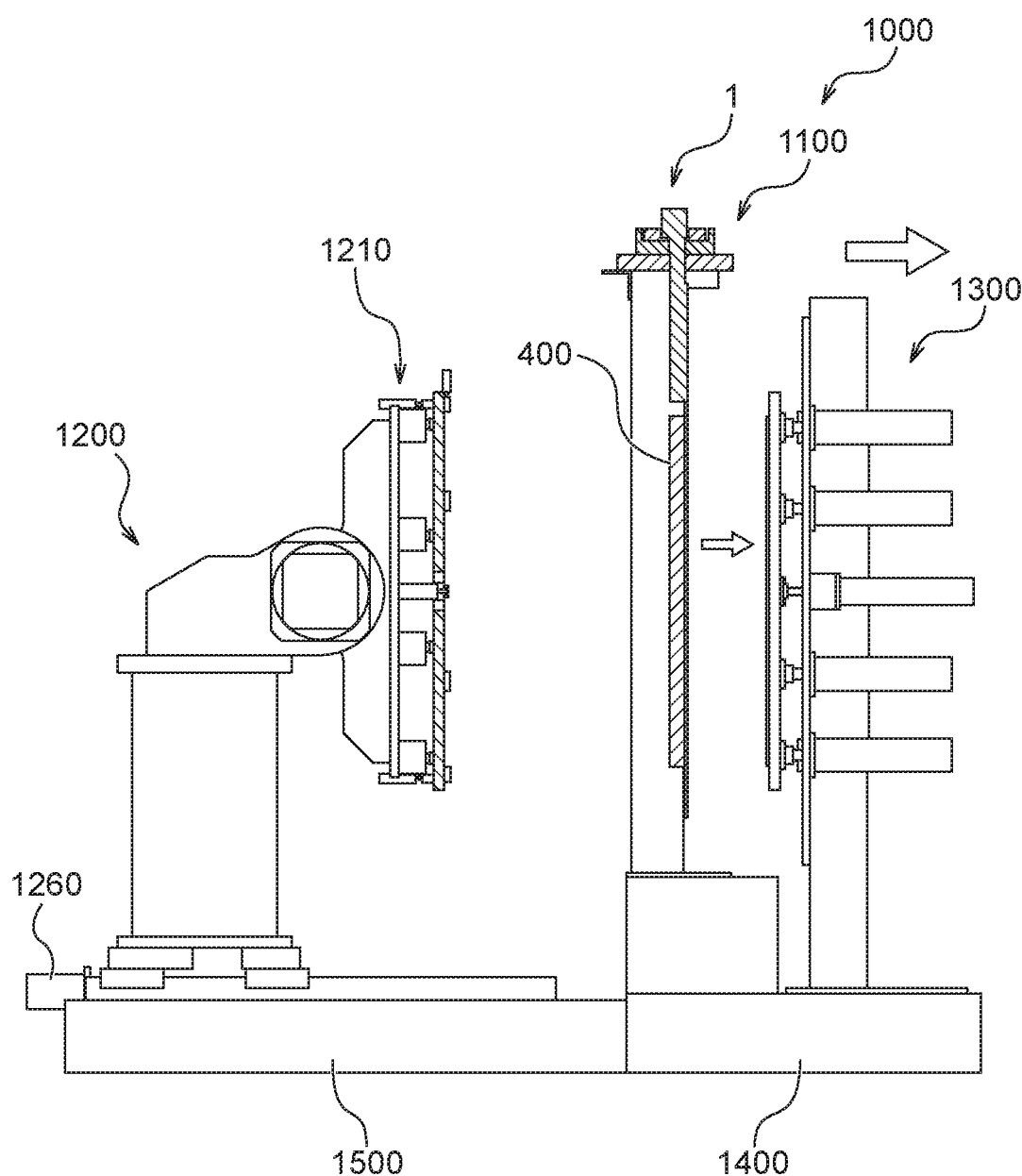
FIG. 27X is a side view of the substrate attachment/detachment device with the support plate of the supporting device retreated.

FIG. 27A to 27Y are drawings for explaining operation of the substrate attachment/detachment device. FIG. 27A is a perspective view of the substrate attachment/detachment device before receiving the substrate holder. FIG. 27B is a perspective view of the substrate attachment/detachment device after receiving the substrate holder. FIG. 27C is a side view of the substrate attachment/detachment device the substrate holder supported and fixed by the supporting device. FIG. 27D is a perspective view of the supporting device in a state where the support plate is retracted. FIG. 27E is a perspective view of the supporting device in a state where the support plate shifts forward. FIG. 27F is a perspective view of the supporting device in a state where the support plate is further supported by an auxiliary rod. FIG. 27G is a perspective view of a locking device before being activated. FIG. 27H is a perspective view of the locking device during rotation of the pressing member. FIG. 27I is a perspective view of the locking device with the rod retracted. FIG. 27J is a side view of the substrate attachment/detachment device with the substrate holder pushed and adsorbed by the support plate of the turning device. FIG. 27K is a sectional view of the pressure adsorption cylinder. FIG. 27L is a partially-enlarged view of the substrate attachment/detachment device, which explains that the clamp for locking the back plate is released. FIG. 27M is a side view of the substrate attachment/detachment device with the back plate removed by the turning device. FIG. 27N is a side view of the substrate attachment/detachment device with the filming device turned into the second posture. FIG. 27O is an elevation view of the support plate of the turning device, which explains configuration of the horizontal positioning device. FIG. 27P is a perspective view of the support plate part of the aiming device in the second posture. FIG. 27Q is a side view of the substrate attachment/detachment device at the time of detaching a substrate. FIG. 27R is a side view of the substrate attachment/detachment device at the time of attaching a substrate. FIG. 27S is a side view of the substrate attachment/detachment device after returning from the second posture to the first posture. FIG. 27T is a side view of the substrate attachment/detachment device with the back plate pushed against the front plate of the holder station by the turning device. FIG. 27U is a sectional view of an energization determining device before being operated. FIG. 27V is a sectional view of the energization determining device after being operated. FIG. 27W is a side view of the substrate attachment/detachment device with the turning device retreated in a retreat position. FIG. 27X is a side view of the substrate attachment/detachment device with the support plate of the supporting device retreated.

As shown in FIGS. 27A to 27B, the substrate holder 1 is installed in the holder station 1100 of the substrate attachment/detachment device 1000. At this time, the substrate holder 1 is installed in the holder station 1100 so that the front plate 300 faces toward the support device 1300, and the back plate 400 faces toward the turning device 1200. The turning device 1200 is in a standby position where the turning device 1200 is retracted from the holder station 1100. The support plate 1320 of the support device 1300 is in a retreat position where the support plate 1320 is retracted from the holder station 1100.

An installation work of the substrate holder 1 will be described below in details. First, the positioning pin 1123 of the holder station 1100 moves upward (FIG. 25B). The substrate holder 1 is placed on the holder station 1100 by a transporter, not shown. At this time, both the ends of the arm 330 of the substrate holder 1 are received by the recesses 1120a and 1120b of the arm receivers 1120 of the holder station 1100. The positioning pin 1123 is engaged with the positioning hole 332a of the arm 330, and the substrate holder 1 is thus positioned in the holder station 1100 (FIG. 25C). The positioning pin 1123 then moves downward (FIG. 25A).

Secondly, the substrate holder 1 is supported and fixed by the support plate 1320 of the support device 1300 (FIG. 27C). The air cylinder 1321b (FIGS. 26E and 26F) of the support device 1300 is driven from the retreat position (FIG. 27D) where the support plate 1320 of the support device 1300 is retracted. The support plate 1320 is thus brought into contact with the front plate 300 of the substrate holder 1 (FIGS. 27C and 27E). Furthermore, the air cylinder 1322b (FIGS. 26E and 26F) of the support device 1300 is driven to further support the support plate 1320 by using the reinforcing rod 1322 (FIG. 27F). The front plate 300 of the substrate holder 1 is pressed from the rear face side toward the support plate 1320 by using the locking devices 1323 disposed near the four corners of the support plate 1320. The front plate 300 is thus fixed to the support plate 1320 by the locking devices 1323 (FIGS. 27G, 27H, and 27I).

Next, the turning device 1200 is shifted to a pressing position of the substrate holder 1. The pressing and adsorption of the back plate 400 of the substrate holder 1 are carried out (FIG. 27J). First, the linear motion mechanism 1260 of the turning device 1200 is driven to shift the turning device 1200 from the standby position to the pressing position in a direction approaching the holder station 1100. At this time, the support plate 1210a of the turning device 1200 is brought into contact with the back plate 400 of the substrate holder 1 supported by the holder station 1100, in the foregoing state, the electromagnetic brake of the linear motion mechanism 1260 of the turning device 1200 is operated to fix the position of the turning device 1200. The actuator 1212 of the turning device 1200 is then operated, and the substrate holder 1 is pressed against the support plate 1320 of the support device 1300, to thereby compress the seals 361 and 362 of the substrate holder 1. The actuators (piston 1213e and the rod 1213b in FIG. 27K) of the pressure adsorption cylinder 1213 of the turning device 1200 are operated. The substrate holder 1 is pressed against the support plate 1320 of the support device 1300 by the pressure adsorption cylinder 1213 to further compress the seals 361 and 362 of the substrate holder 1. Thereafter, a suction mechanism (suction passage 1213h in FIG. 27K) of the pressure adsorption cylinder 1213 is operated to adsorb the back plate 400 by using the pressure adsorption cylinder 1213.

As shown in FIG. 27K, the pressure adsorption cylinder 1213 includes the rod 1213b, a piston 1213e coupled to a proximal end of the rod 1213b, and a suction disk 1213a coupled to a distal end of the rod 1213b. An opening 1213c opens in a proximal end face of the rod 1213b. The opening 1213c is connected to the suction passage 1213h through a passage 1213d formed in the rod 1213b. The rod 1213b is attached to the support plate 1210a through a diaphragm 1213j. The suction passage 1213h longitudinally extends through an inner cavity of the piston 1213e.

The piston 1213e is disposed inside an air chamber 1213i to divide an interior space of the air chamber 1213i into two spaces. Each of the spaces in the air chamber 1213i is connected with a pipe 1213g. Air is supplied into and discharged from the spaces through the pipes 1213g, which enables the piston 1213e to reciprocate in the longitudinal direction (upper and lower drawings of FIG. 27K). The diaphragm 1213j biases the rod 1213b in a retracting direction (toward the rear face side of the support plate 1210a) to buffer the movement of the rod 1213b which is caused by the piston 1213e. The piston 1213e and the air chamber 1213i form an air cylinder. The air cylinder makes the piston 1213e and the rod 1213b move forward, and the suction disk 1213a presses the back plate 400 of the substrate holder 1 (state shown in the lower drawing of FIG. 27K).

In the state shown in the upper or lower drawing of FIG. 27K, the back plate 400 is adsorbed by vacuum pressure generated by a vacuum ejector. More specifically, air on the suction disk 1213a side is sucked in through the suction passage 1213h to adsorb the back plate 400 onto the suction disk 1213a. It is also possible to supply air from the suction passage 1213h toward the suction disk 1213a, create negative pressure in the suction disk 1213a due to the air leaking from a gap between the suction disk 1213a and the back plate 400, and use the negative pressure to contactlessly adsorb the back plate 400 with respect to the suction disk 1213a.

The lever 342 of the back plate 400 is pressed by the actuator 1215 of the turning device 1200 to open the clamp 340. The clamp 340 is therefore released from the back plate 400 (FIG. 27L). The foregoing operation corresponds to the operation of the actuator AR1 shown in FIGS. 10A and 10B. FIG. 27L shows a state where the support plate 1210a of the turning device 1200 is separated away from the back plate 400. In practice, the actuator 1215 is operated with the support plate 1210a of the turning device 1200 in contact with the back plate 400.

The pressure of the pressure adsorption cylinder 1213 is reduced to release the pressure of the seals by the pressure adsorption cylinder 1213. The rod of the actuator 1212 is retracted to release the pressure of the seals by the actuator 1212. The suction of the back plate 400 by the pressure adsorption cylinder 1213 is continued, so that the back plate 400 is still adsorbed by the pressure adsorption cylinder 1213. The electromagnetic brake of the turning device 1200 is then released. The linear motion mechanism 1260 is driven to shift the turning device 1200 from the pressing position to a clamp opening/closing position. The back plate 400 is separated from the front plate 300 while being adsorbed by the turning device 1200. The clamp opening/closing position is a position where the back plate 400 is further away from the front plate 300 than a range of opening/closing operation (range of movement) of the clamp 340. In the foregoing state, if the rod 1215a of the actuator 1215 is retracted to release the pressure against the lever 342, the clamp 340 is closed. Since the back plate 400 is already away from the range of opening/closing operation of the clamp 340, the clamp 340 comes into a closed position without engaging with the back plate 400.

The turning device 1200 is further retracted from the clamp opening/closing position to a turning position (FIG. 27M). The turning position is a position of the turning device 1200 which is far enough away from the holder station 1100 so that the support plate part 1210 of the turning device 1200 does not interfere with the holder station 1100 during the turning of the support plate part 1210 of the turning device 1200 (during the turning between the posture shown in FIG. 23A and the posture shown in FIG. 23B).

The support plate part 1210 of the turning device 1200 is turned from the first posture (upright posture) to the second posture (horizontal posture) (FIG. 27N). The electric motor 1242 of the turning device 1200 is driven to turn the support plate part 1210 from the upright posture to the horizontal posture. The turning device 1200 is further shifted from the turning position to a substrate delivering position. The substrate delivering position is a position which is suitable for the turning device 1200 to receive the substrate from a transfer robot, not shown. The substrate delivering position may be a position anterior to the turning position by a predetermined distance. The substrate delivering position may also be the same position as the turning position. In this case, the substrate is received with the turning device 1200 rest in the turning position (substrate delivering position).

The suction by the pressure adsorption cylinder 1213 is stopped, and the suction disk 1213a of the pressure adsorption cylinder 1213 is retracted. As shown in FIG. 27O, air cylinders 1216b and 1217b of the horizontal positioning devices 1216 and 1217 are operated to project rods 1216a and 1217a, to thereby position the back plate 400 in a plane of the support plate 1210a. The vacuum device 1214 shown in FIG. 27P is operated to adsorb the back plate 400 onto the support plate 1210a. The actuator 1211 (AR2) is operated to open the clips 421 of the back plate 400 as shown in FIG. 14B and thus release the substrate S from the back plate 400.

The substrate S is removed from the back plate 400 by the transfer robot, not shown (FIG. 27Q). The transfer robot, not shown, removes the substrate S from the back plate 400 while the operation of the actuator 1211 (AR2) is continued to release the clips 421 from the substrate S. What is removed here is the substrate S which has been subjected to substrate processing (plating processing, for example).

Another substrate S is then attached to the back plate 400 (FIG. 27R). The transfer robot, not shown, places the another substrate S onto the back plate 400 while the operation of the actuator 1211 (AR2) is continued to release the clips 421 from the substrate S. The another substrate S is, for example, a substrate S which has not been subjected to the substrate processing (plating processing, for example). Thereafter, the operation of the actuator 1211 is stopped, and the clips 421 are returned to the closing position. In the result, still another substrate S is fixed by the clips 421. The rods 1216a and 1217a of the horizontal positioning devices 1216 and 1217 are retracted. The turning device 1200 is shifted from the substrate delivering position to the turning position (the shifting is not required if the substrate delivering position and the turning position are the same).

In the turning position, the support plate part 1210 of the turning device 1200 is turned from the second posture (horizontal posture) to the first posture (upright posture) (FIG. 27S).

The back plate 400 is fixed to the front plate 500 by the clamps 340 (FIG. 27T). First, the turning device 1200 is moved forward from the turning position to the clamp opening/closing position. At this time, the back plate 400 retained by the turning device 1200 is located outside a range of movement of the clamps 340 of the front plate 300. In this position, the actuator 1215 is operated to press the lever 342 of the front plate 300 and thus open the clamps 340. The turning device 1200 is moved forward from the clamp opening/closing position to the pressing position (which is located in the range of movement of the clamps 340). At this time, the back plate 400 retained by the turning device 1200 is brought into contact with and pressed against the front plate 300 without interfering with the clamps 340. The operation of the vacuum device 1214 of the turning device 1200 is then stopped. The back plate 400 is pressed against the front plate 300 by the turning device 1200, and the positioning pins 390 of the front plate 300 are fitted into a block 490 of the back plate 400 to be retained. Therefore, the back plate 400 will not drop even if the operation of the vacuum device 1214 is stopped. The electromagnetic brake of the turning device 1200 is operated. The actuator 1212 of the turning device 1200 is then operated to press the back plate 400 against the front plate 300 and thus compress the seals 361 and 362 of the substrate holder 1. The air cylinder of the pressure adsorption cylinder 1213 is operated to press the back plate 400 against the front plate 300 using the suction disk 1213a and thus further compress the seals 361 and 362 of the substrate holder 1. In the foregoing state, the rod of the actuator 1215 is retracted to close the clamp 340. The back plate 400 is thus fixed to the front plate 300 by the clamp 340. The back plate 400 is released from the pressure applied by the actuator 1212. The suction disk 1213a of the pressure adsorption cylinder 1213 is retracted from the back plate 400 to release the pressure applied to the back plate 400 by the pressure adsorption cylinder 1213.

(Energization Determination Processing)

An energization determination of the substrate holder 1 is also carried out (FIGS. 27U and 27V). Inside the arm receiver 1120 of the holder station 1100, there is provided the energization determination device 1121 shown in FIGS. 27U and 27V. The energization determination device 1121 includes a connector-side contact pair 1121a, a cylinder-side contact pair 1121b disposed under the connector-side contact pair 1121a, and an energizing cylinder 1121c fixed with the cylinder-side contact pair 1121b. The energizing cylinder 1121c is vertically movable by a drive means, not shown.

FIG. 28 is an explanatory view showing correspondence relationship between a connector contact and a contact of the energization determining device.

In FIG. 28, a first side and a second side respectively correspond to the left side and the right side in FIGS. 27U and 27V. There are provided first to third pairs of connector-side contact pairs 1121a and first to third pairs of cylinder-side contact pairs 1121b. FIGS. 27U and 27V show the first pair of connector-side contact pairs 1121a and cylinder-side contact pairs 1121b. The second pair of connector-side contact pairs 1121a and cylinder-side contact pairs 1121b, and the third pair of connector-side contact pairs 1121a and cylinder-side contact pairs 1121b are disposed in the order mentioned, behind the first pair as viewed into FIGS. 27U and 27V.

As shown in FIG. 28, the first pair of cylinder-side contact pairs 1121b corresponds to the first pair of connector-side contact pairs 1121a, and the first pair of connector-side contact pairs 1121a corresponds to the first pair of external connection contact pairs 331a of the connector 331 of the substrate holder 1. The first-side external connection contact 331a1 of the first pair of external connection contact pairs 331a of the connector 331 of the substrate holder 1 is electrically connected to the cables L17, L18, and L1 (contact zones C17, C18, and C1) shown in FIG. 17. The second-side external connection contact 331a2 is electrically connected to the cables L8, L9, and L10 (contact zones C8, C9, and C10).

Similarly, in FIG. 28, the second pair of cylinder-side contact pairs 1121b corresponds to the second pair of connector-side contact pairs 1121a, and the second pair of connector-side contact pairs 1121a corresponds to the second pair of external connection contact pairs 331a of the connector 331 of the substrate holder 1. The first-side external connection contact 331a1 of the second pair of external connection contact pairs 331a of the connector 331 of the substrate holder 1 is electrically connected to the cables L2, L3, and L4 (contact zones C2, C3, and C4). The second-side external connection contact 331a2 is electrically connected to the cables L11, L12, and L13 (contact zones C11, C12, and C13).

Likewise, in FIG. 28, the third pair of cylinder-side contact pairs 1121b corresponds to the third pair of connector-side contact pairs 1121a. The third pair of connector-side contact pairs 1121a, corresponds to the third pair of external connection contact pairs 331a. The first-side external connection contact 331a1 of the third pair of external connection contact pairs 331a of the connector 331 of the substrate holder 1 is electrically connected to the cables L5, L6, and L7 (contact zones C5, C6, and C7). The second-side external connection contact 331a2 is electrically connected to the cables L14, L15, and L16 (contact zones C14, C15, and C16).

In the present embodiment, the connector-side contact pairs 1121a and the cylinder-side contact pairs 1121b are arranged one above the other, and the energizing cylinder 1121c is moved up and down. However, the connector-side contact pairs 1121a and the cylinder-side contact pairs 1121b may be horizontally arranged next to each other to move the energizing cylinder 1121c in the horizontal direction.

When the energization determination device 1121 is not in operation, the energizing cylinder 1121c is located on a lower side, so that the cylinder-side contact pairs 1121b are separated from the contact-side contact pairs 1121a, as shown in FIG. 27U. When the connector 331 of the arm 330 of the substrate holder 1 is placed on the arm receiver 1120 of the holder station 1100, as shown in FIG. 27U, the first to third pairs of external connection contact pairs 331a (331a1, 331a2) contact the first to third pairs of contact-side contact pairs 1121a (1121a1, 1121a2), respectively (arrow A1 in FIG. 28).

In the foregoing state, the energization determination device 1121 is operated. First, as shown in FIG. 27V, the energizing cylinder 1121c is moved upward to bring contacts 1121b1 and 1121b2 of the cylinder-side contact pairs 1121b into contact with contacts 1121a1 and 1121a2 of the contact-side contact pairs 1121a (arrow A2 in FIG. 28). A predetermined checking voltage V0 is applied to between the first- and second-side contacts 1121b1 and 1121b2 of the cylinder-side contact pairs 1121b. This creates a current loop in the first pair, in which current flows from the first-side contact 1121b1 of the cylinder-side contact pairs 1121b through the first-side contact 1121a1 of the contact-side contact pairs 1121a, the first-side external connection contact 331a1 of the external connection contact pairs 331a of the connector 331, the cables L17, L18, and L1, the contacts 370 of the contact zones C17, C18, and C1, the substrate S, the contacts 370 of the contact zones C8, C9, and C10, the cables L8, L9, and L10, and the second-side external connection contact 331a2 of the external connection contact pairs 331a of the connector 331, and the second-side contact 1121a2 of the connector-side contact pairs 1121a to the second-side contact 1121b2 of the cylinder-side contact pairs 1121b. In the second and third pairs, the same current loops are created.

In each of the pairs, the current flowing through the current loop between the first side and the second side is measured to calculate a resistance value between the first- and second-side contacts 331a1 and 331a2 of the external connection contacts 331a in each pair. If the resistance value between the first side and the second side is measured to calculate a resistance value between the first- and second-side contacts 331a1 and 331a2 of the external connection contacts 331a in each of the first to third pairs is equal to or smaller than a predetermined value and also falls in a predetermined range, it is judged that an electric system of the substrate holder 1 and electrical characteristics of the substrate S are normal. If the resistance value between the first- and second-side contacts 331a1 and 331a2 of the external connection contacts 331a in each of the first to third pairs does not meet the above-mentioned conditions, it is judged that there is an electrical defect in somewhere between the connector 331 of the substrate holder 1, the cables L, and the contacts 370, that there is a defect in the electrical characteristics of the surface of the substrate S or that there is a problem in attachment of the substrate S to the substrate holder 1. If there is no problem in the energization determining operation, the energizing cylinder 1121c is moved downward. If there is a problem in the energization determining operation, the substrate is removed from the substrate holder 1 to be replaced with another substrate, or alternatively, the substrate holder 1 itself is removed from the subsequent processing.

The electromagnetic brake of the turning device 1200 is then released to retract the turning device 1200 from the pressing position to the turning position (FIG. 27W).

The support plate 1320 of the support device 1300 is retracted from the holder station 1100 (FIG. 27X). First, the fixing of the substrate holder 1 (front plate 300) by the locking devices 1323 of the support device 1300 is released in reverse order to the order of the drawings from FIG. 27G to 27I. Next, the reinforcing rods 1322 of the support device 1300 are retracted from the support plate 1320. The rods 1321 are then retracted, to thereby retract the support plate 1320 to the main body panel 1310 side.

The positioning pin 1123 of the holder station 1100 is moved upward to be engaged with the positioning hole 332a of the arm 330 of the substrate holder 1. A transport, not shown, removes the substrate holder 1.

The removal of the substrate as shown in FIG. 27Q is omitted, when the substrate is attached to the substrate holder 1 which is not loaded. The attachment of the substrate as shown in FIG. 27R is omitted, when the substrate holder 1 in an unloaded state is returned to the stocker at the end of the substrate processing.

Operation and Advantages of Embodiments

According to the substrate holder 1 of the present embodiment, the clamps 340 which are rotatable around an axis parallel to the plane of the front plate main body 310 or reciprocatable in a direction intersecting with the plane of the front plate main body 310 are used to fix the front plate 300 and the back plate 400 which hold the substrate therebetween. This suppresses or prevents the substrate from being applied with a force acing in a rotational direction. If the substrate is large-size and thin, it is likely that the substrate is bent by being applied with the force acting in the rotational direction. The substrate holder 1, however, suppresses or prevents the substrate from being bent even if the substrate holder 1 holds the large-size and thin substrate.

Since the clamps 340 are of a normally-closed type, once the clamps are opened when the back plate main body 410 is brought into contact with the front plate main body 310, the clamps 340 do not have to be applied with an external force by the actuator or other devices when in the clamping position. This reduces energy consumption.

It is also possible to clamp the back plate 400 at more than one place by using the clamps 340. Furthermore, behaviors of the clamps 340 are synchronized by the coupling members (rotary shafts 341), so that clamp operation can be performed with efficiency. In addition, it is possible to simplify the configuration of the actuator AR1 applied with an external force. Since the lever 342 receives force from the first actuator AR1 located outside to operate the clamps 340 through the rotary shafts 341, it is easy to automate the fixing by the clamps 340.

The back plate 400 is provided with the engaging receiving parts 430 each having a shape designed to receive the engaging part 340a of the clamp 340, which improves the engagement by the clamps. Since the back plate main body 410 is attached with the engaging receiving parts 430 as separate bodies, a proper selection can be made as to the dimensions, shape, number, and other details of the engaging receiving parts 430.

The clips 421 which are rotatable around the shaft 424 parallel to a plane of the back plate main body 410 or reciprocatable in a direction intersecting with the plane of the back plate main body 410 are used to fix the substrate to the back plate 400. This suppresses or prevents the substrate from being applied with a force acing in a rotational direction. If the substrate is large-size and thin, it is likely that the substrate is bent by being applied with the force acting in the rotational direction. The substrate holder, however, suppresses or prevents the substrate from being bent even if the substrate holder 1 bolds the large-size and thin substrate. In addition, since the clips 421 move in a direction perpendicular to a plane of the substrate, the substrate holder is adaptable to a thin warped substrate and a substrate with various thicknesses.

Since the clips 421 are of a normally-closed type, once the clips 421 are opened when the substrate is brought into contact with the back plate main body 410, the clips 421 do not have to be applied with an external force by the actuator or other devices when in the closed position. This reduces energy consumption.

The buttons 470 receiving a force from the opposite face to the side in contact with the substrate is provided, so that the actuator AR2 can be disposed on the opposite side to the substrate contacting face. This makes it easy to transfer the back plate 400, change the posture of the back plate 400, and the like after the substrate is fixed.

The clips 421 can be operated by the buttons 470 receiving the force from the second actuator AR2, which makes it easy to automate the fixing by the clips 421.

The seal holders 363 and 364 for retaining the inner seal 361 and the outer seal 362 are separately provided, so that the seals can be separately replaced.

According to the substrate holder of the present embodiment, the jacket 602 is removed from the one end of the cable L, and the core wire 601 of the cable L is held together with a conductive plate 371 (or the contact 370). This makes it possible to establish an electrical connection between the cables L and the conductive plates 371 (or the contacts 370). In other words, the cables L and the conductive plates 371 (or the contacts 370) can be connected without providing the connector or the like to the end of the cable. When power is supplied while the contacts 370 are in contact with a plurality of places of the substrate S, the plurality of cables L have to be drawn within the substrate holder to achieve an electrical connection. The above-described substrate holder, however, makes it possible to establish an electrical connection between the cables L and the conductive plates 371 (or the contacts 370) with a simple configuration, and suppress the substrate holder from increasing in size. If power is supplied to the substrate of a large size or if the substrate is supplied with current at a large supply current value, the cables are increased in number and diameter. In such a case, for example, the simple cable connection achieved by the above-described substrate holder is useful.

According to the substrate holder of the present embodiment, it is possible to establish the electric connection between the cables L and the conductive plates 371 (or the contacts 370) with the simple configuration and by doing simple work due to the fastening member 511, such as a bolt and a screw.

According to the substrate holder of the present embodiment, the cables L and the conductive plates 371 can be clamped using the seal holder 363, so that an existing configuration can be adopted, which suppresses the substrate holder from increasing in size and suppresses cost increase.

According to the substrate holder of the present embodiment, the seal holders 363 and 364 of the seals 361 and 362 are separated from each other, it is easy to separately replace the seals. It is also easy to separately replace the seal holders 363 and 364.

According to the substrate holder of the present embodiment, the cables L do not overlap with one another in a thickness direction of the substrate holder, which makes it possible to suppress the thickness of the substrate holder from increasing. Especially when the substrate is of a large-size or when current amount is large, the cables are likely to be increased in number and diameter. With the above-described configuration, however, it is possible to suppress the increase a size of the substrate holder in the thickness direction.

According to the substrate holder of the present embodiment, the cables L from which the jackets 602 at the distal end is removed are serially pulled in to the positions of the conductive plates 371 (or contacts 370) to be connected. It is therefore possible to secure insulation between the cables until the cables reach the connecting positions and connect the cables to the conductive members with the simple configuration.

If the substrate holder of the present embodiment is applied to a plating device, it is possible to suppress the plating device from increasing in size since the increase of size of the substrate holder can be suppressed.

In a method of producing the substrate holder according to the present embodiment, the jacket 602 is removed at the one end of the cable L, and the core wire 601 of the cable L is clamped together with the conductive plate 371 (or the contact 370). This makes it possible to establish an electric connection between the cable L and the conductive plate 371 (or the contact 370) with a simple configuration. In other words, the connection between the cable L and the conductive plate 371 (or the contact 370) can be achieved without providing the connector or the like to the end of the cable. When power is supplied while the contacts 370 are in contact with a plurality of places of the substrate S, the plurality of cables L have to be drawn within the substrate holder to achieve an electrical connection. The above-described substrate holder, however, makes it possible to establish an electrical connection between the cables L and the conductive plates 371 (or the contacts 370) with a simple configuration, and suppress the substrate holder from increasing in size. If power is supplied to the substrate of a large size or if the substrate is supplied with current at a large supply current value, the cables are increased in number and diameter. In such a case, for example, the simple cable connection achieved by the above-described substrate holder is useful.

A plating method according to the present embodiment is a plating method for applying plating processing to the substrate held by the substrate holder 1. The plating method includes causing the substrate holder 1 to hold the substrate, in which the substrate holder 1 has at least one cable L having one end from which a jacket is removed; at least one contact 370 configured to be electrically contactable to the substrate; and a clamping member 511 configured to clamp the one end of the cable L with the contact 370 or a second conductive member which is electrically conductive to the contact 370, and applying the plating processing to the substrate held by the substrate holder 1 while supplying power to the substrate through the cable L.

According to the above-described plating method, even if power is supplied to a large-size substrate or if a value of the current supplied to the substrate is large, the plating processing can be carried out using the substrate holder which is suppressed or prevented from increasing in size due to the simple configuration in which the electrical connection between the cables and the contacts in the substrate holder.

In the plating method according to the present embodiment, the substrate holder 1 includes a first predetermined number of the cables L and the plurality of external connection contact pairs 331$a$. The external connection contact pairs 331$a$ include the first-side contact 331$a$1 and the second-side contact 331$a$2. The first-side and second-side contacts 331$a$1 and 331$a$2 are electrically connected with a second predetermined number of the cables L, which is smaller than the first predetermined number and equal to or larger than 2. The method further includes bringing the resistance meter 1121 into contact between the first-side contact 331$a$1 and the second-side contact 331$a$2 of each of the external connection contact pairs 331$a$, and measuring an electric resistance of each of the external connection contact pairs 331$a$.

In this case, the method performs energization determination processing which measures the electric resistance between the first-side and second-side contacts 331$a$1 and 331$a$2 of each of the external connection contact pairs 331$a$ prior to the plating processing, and determined whether there is variation in the electric resistances of the plurality of external connection contact pairs 331$a$. The plating processing therefore can be carried out after a determination is made as to whether there is a problem in uniformity of plating film thickness, which is caused by variation in electric resistances of the plurality of external connection contact pairs 331$a$. This improves reliability of the plating processing.

[1] The substrate attachment/detachment device 1000 of the present embodiment is the substrate attachment/detachment device configured to clamp and hold the substrate by using the front and back plates 300 and 400 of the substrate holder 1. The device comprises the holder station 1100 configured to support the front plate 300 in the first posture, and the turning device 1200. The turning device 1200 is linearly movable toward and away from the holder station 1100, capable of holding the back plate 400 in the first posture and the second posture which is substantially orthogonal to the first posture, and presses the back plate 400 against the front plate 300 in the first posture to fix the front plate 300 and the back plate 400 to each other.

According to the substrate attachment/detachment device 1000 of the present embodiment, after the back plate 400 of the substrate holder 1 receives the substrate in the second posture, the front and back plates 300 and 400 can be fixed to each other in the first posture. For example, if the front and back plates 300 and 400 are fixed to each other in the upright posture after the back plate 400 receives the substrate in the horizontal posture, it is possible to deliver the substrate holder 1 attached with the substrate in the upright posture. This reduces the possibility of making a scratch on a substrate surface and causing a damage onto the substrate, which are problems caused when the substrate is carried with the to-be-processed face facing upward.

Since the turning device 1200 is linearly movable toward and away from the holder station 1100, the turning device 1200 can change the posture by turning the back plate 400 at a position far enough from the holder station 1100. This prevents the device from increasing in size and makes it easy to position the front and back plates 300 and 400 relative to each other.

[2] According to the substrate attachment/detachment device of the present embodiment, the first posture may be the posture substantially perpendicular to the installation surface of the substrate attachment/detachment device 1000.

In this case, the second posture is the posture substantially horizontal to the installation surface, and it is possible to receive the substrate while the back plate 400 of the substrate holder 1 is in the substantially horizontal state, and fix the front and back plates 300 and 400 to each other in the substantially vertical posture. The first posture mentioned above is therefore suitable for the attachment of the substrate to the substrate holder 1 as already described.

[3] The substrate attachment/detachment device 1000 of the present embodiment includes the support device 1300 having the first support plate 1320 for supporting the front plate 300 on the opposite side of the turning device 1200, and the locking mechanism 1323 for holding the front plate 300 on the first support plate 1320.

In this case, the turning device 1200 performs the attachment/detachment of the back plate 400 with the substrate holder 1 supported and fixed by the support device 1300 on the opposite side to the turning device 1200. When the back plate 400 is pressed against the front plate 300, the support device 1300 supports the front plate 300 to prevent a displacement of the position of the front plate 300.

[4] According to the substrate attachment/detachment device 1000 of the present embodiment, the support device 1300 has the plurality of rods 1321 coupled to the face of the first support plate 1320 which is on the opposite side to the side where the front plate 300 is supported. The first support plate 1320 is movable by the movement of the plurality of rods 1321.

The plurality of rods 1321 makes it possible to move the first support plate 1320 in the correct posture and favorably support the first retaining member 300.

[5] According to the substrate attachment/detachment device 1000 of the present embodiment, the fixing mechanism 1323 has the pressing member 1323*a* configured to rotate between the position overlapping the face of the front plate 300 and the position not overlapping the face of the front plate 300.

The first support plate 1320 is brought into contact with the front plate 300 with the fixing device 1323 located in the position not overlapping the face of the front plate 300. Thereafter, the fixing device 1323 is moved to the position overlapping the face of the front plate 300, and the front plate 300 is fixed to the first support plate 1320 by the fixing device 1323. This makes it possible to perform the fixing operation while avoiding an interference with the front plate 300.

[6] According to the substrate attachment/detachment device 1000 of the present embodiment, the holder station 1100 further has the arm receiver configured to support the arm 330 of the front plate 300. The front plate 300 is suspended by the arm receiver 1120.

Since the holder station 1100 has the configuration in which the front plate 300 is suspended by the arm 330, the holder station 1100 can be simply configured.

[7] According to the substrate attachment/detachment device 1000 of the present embodiment, the arm receiver 1120 of the holder station 1100 has the positioning pin 1123 which is movable between the position for being engaged with the positioning hole 332*a* formed in the arm 330 of the front plate 300 and the position in which the arm receiver 1120 is not engaged with the positioning hole 332*a*.

The positioning pin 1123 enables the substrate holder 1 to be accurately positioned relative to the holder station.

[8] According to the substrate attachment/detachment device 1000 of the present embodiment, the arm receiver 1120 has the energization determination device 1121 for checking electrical conduction of the substrate via the connector 331 of the front plate 300. The energization determination device 1121 measures the resistance value between the contacts in the plurality of external connection contact pairs 331*a* of the connector 331.

In this case, the energization determination device 1121 makes it possible to determine whether there is abnormality in electrical characteristics of a preprocessed substrate and those of the substrate holder, so that it is also possible to prevent the substrate processing from being performed using an abnormal substrate or substrate holder. When the plurality of cables L are connected to the common external connection contact points 331*a*1 and 331*a*2 of the connector 331, due to the measurement of the resistance value between the external connection contact points 331*a*1 and 331*a*2 of each of the external connection contact points 331*a* of the connector 331, an energization determination can be performed by determining if there is variation between resistance values of the external connection contact point pairs 331*a*. This improves reliability of the plating processing.

[9] According to the substrate attachment/detachment device 1000 of the present embodiment, the first support plate 1320 has a rectangular shape and is configured to support the first retaining member 300 having a polygonal shape.

The first retaining member 300 having a polygonal shape makes it possible to properly retain a large-size substrate having a rectangular shape or another shape.

[10] According to the substrate attachment/detachment device 1000 of the present embodiment, the turning device 1200 has the first actuator 1215 for operating the clamps 340 formed in the front plate 300 supported by the holder station 1100 to cause the front plate 300 to retain the back plate 400.

The actuator 1215 of the turning device 1200 makes it possible to operate the clamps 340 of the front plate 300, and the clamps 340 of the front plate 300 make it possible to fix the back plate 400 with ease. Since the front plate 300 is provided with the clamps 340, the configuration of the back plate 400 which is separated and moved from the holder station 1100 can be made simple.

[11] According to the substrate attachment/detachment device 1000 of the present embodiment, the first actuator 1215 has the first rod-like member 1215a which moves in the direction perpendicular to the first support plate 1320, presses the levers 342 coupled to the clamps 340 by the first rod-like member 1215a, and rotate the clamps 340 of the front plate 300 around the axis parallel to the first support plate 1320.

In this case, since the clamps 340 rotate around the axis parallel to the first support plate 1320 (that is, parallel to the substrate), so that the substrate is suppressed from being applied with the force acting in the substrate plane direction, thereby preventing or reducing the deflection and distortion of the substrate. Consequently, deflection is reduced or prevented even when a large-size thin substrate is held.

[12] According to the substrate attachment/detachment device 1000 of the present embodiment, the first rod-like member 1215a is the piston driven by the air cylinder.

In this case, the first rod-like member 1215a can be pressed against the lever 342 with a proper force by the air cylinder.

[13] According to the substrate attachment/detachment device 1000 of the present embodiment, the turning device 1200 includes the second support plate 1210a for supporting the back plate 400 and the second actuator 1211 provided to the second support plate 1210a. The second actuator 1211 operates the clips 421 provided to the back plate 400 to cause the clips 421 to hold the substrate.

In this case, the substrate can be fixed to the second support plate 1210a by the clips 421 when the back plate 400 receives the substrate. The substrate therefore can be securely held even if the posture of the back plate 400 is changed.

[14] According to the substrate attachment/detachment device 1000 of the present embodiment, the second actuator 1200 has the second rod-like member 1211 which moves in the direction perpendicular to the second support plate 1210a, and uses the second rod-like member to rotate the clips 421 of the back plate 400 around the axis parallel to the second support plate 1210a.

In this case, since the clips 421 rotate around the axis parallel to the second support plate 1210a (that is, parallel to the substrate), it is possible to suppress the substrate from being applied with the force acting in the substrate plane direction, thereby preventing or reducing deflection and distortion of the substrate. Consequently, deflection is reduced or prevented even when a large-size thin substrate is held.

[15] According to the substrate attachment/detachment device 1000 of the present embodiment, the second rod-like member 1211 is the piston which is driven by the air cylinder.

In this case, it is possible to apply a proper force from the second rod-like member 1211 to the clip 421 by using the air cylinder.

[16] According to the substrate attachment/detachment device 1000 of the present embodiment, the turning device 1200 includes the pressure adsorption cylinder 1213 and the vacuum device 1214 for keeping the back plate 400 on the second support plate 1210a, the turning mechanism 1240 for turning the second support plate 1210a, and the liner motion mechanism 1260 configured to shift the second support plate 1210a toward and away from the first retaining member 1100.

In this case, the turning mechanism 1240 and the linear motion mechanism 1260 enable the second support plate 1210a to be turned and shifted in the linear manner. The back plate 400, while being turned and shifted in the linear manner, can be favorably held by the pressure adsorption cylinder 1213 and the vacuum device 1214.

[17] According to the substrate attachment/detachment device 1000 of the present embodiment, the pressure adsorption cylinder 1213 includes the suction disk 1213a that is pressed against the back plate 400, and an opening 1213c that opens in the suction disk 1213a and supplies gas to the back plate 400 side.

The pressure adsorption cylinder 1213 makes it possible to perform both pressing and adsorption of the back plate 400.

[18] According to the substrate attachment/detachment device 1000 of the present embodiment, the turning mechanism 1240 includes the first electric motor 1242 for rotating the second support plate 1210a.

The first electric motor 1242 enables the second support plate 1210a to be accurately rotated.

[19] According to the substrate attachment/detachment device 1000 of the present embodiment, the linear motion mechanism 1260 includes the second electric motor 1261 and the rotation-linear motion conversion mechanism (the ball screw 1264 and the nut 1265) configured to convert a motive power of the second electric motor 1261 into a linear motion. The second electric motor 1261 includes the electromagnetic brake 1263.

In this case, the second electric motor 1261 enables the turning device 1200 to be accurately shifted to the desired position, and the electromagnetic brake 1263 can fix the position of the turning device 1200.

[20] According to the attachment/detachment device 1000 of the present embodiment, the turning device 1200 further includes the horizontal position determining devices 1216 and 1217 configured to come into contact with the lateral face of the back plate 400 to position the back plate 400 within the plane of the second support plate 1210a.

The horizontal position determining devices 1216 and 1217 enable the back plate 400 to be accurately positioned within the plane of the second support plate 1210a. The substrate therefore can be accurately mounted on the back plate 400 by means of the transfer robot.

[21] According to the substrate attachment/detachment device of the present embodiment, the second support plate 1210a has the rectangular shape and is configured to support the back plate 400 having the polygonal shape.

The back plate 400 in the polygonal shape enables a rectangular large-size substrate to be held properly.

[22] The plating device according to the present embodiment comprises the substrate attachment/detachment device 1000 which clamps and holds the substrate by means of the front and back plates 300 and 400 of the substrate holder 1, the plating device comprising the plating processing section 120B configured to receive the substrate holder 1 holding the substrate, which has been held in the substrate attachment/detachment device 1000 and apply the plating processing to the substrate. The substrate attachment/detachment device 1000 comprises the holder station 1100 configured to support the front plate 300 in the first posture; and the turning device 1200 configured to be movable in the linear manner toward and away from the holder station 1100, capable of holding the back plate 400 in the first posture and the second posture which is substantially perpendicular to the first posture, and configured to push the back plate 400 against the front plate 300 in the first posture to lock the front plate 300 and the back plate 400 to each other.

The plating device provides the same operation and advantages as those discussed in the explanation of the operation and advantages of the substrate attachment/detachment device 1000. The plating device further enables the plating processing to be performed using the substrate holder 1 which properly holds the substrate, and thus improves reliability of the plating processing. The plating device especially makes it possible to properly hold a thin and large substrate and favorably perform the plating processing.

[23] The controller control device) 175 of the present embodiment controls the substrate attachment/detachment device 1000 configured to clamp and hold the substrate by means of the front and back plates 300 and 400 of the substrate holder 1. The controller 175 executes processing including supporting the front plate 300 in the first posture by means of the holder station 1100; fixing the substrate to the back plate 400 by means of the turning device 1200 while the back plate 400 is supported by the turning device 1200 in the second posture which is substantially perpendicular to the first posture, and then turning the back plate 400 into the first posture; causing the turning device 1200 to make the linear motion toward the holder station 1100; and pressing the back plate 400 against the front plate 300 by means of the turning device 1200 to lock the front plate 300 and the back plate 400 to each other.

The control device provides the same operation and advantages as those discussed in the explanation of the operation and advantages of the substrate attachment/detachment device 1000.

[24] The storage medium of the present embodiment stores a program for causing the computer to execute the method of controlling the substrate attachment/detachment device 1000 configured to clamp and hold the substrate by means of the front and back plates 300 and 400 of the substrate holder 1. The program causes the computer to execute supporting the front plate 300 in the first posture by means of the holder station 1100; fixing the substrate to the back plate 400 by means of the turning device 1200 while the back plate 400 is supported by the turning device in the second posture which is substantially perpendicular to the first posture, and then turning the back plate 400 into the first posture; causing the back plate 400 to make the linear motion toward the front plate 300; and pressing the back plate 400 against the front plate 300 by means of the turning device 1200 to lock the front plate 300 and the back plate 400 to each other.

The control device provides the same operation and advantages as those discussed in the explanation of the operation and advantages of the substrate attachment/detachment device 1000.

At least following technical concepts can be recognized from the above-discussed embodiments.

[1] A substrate attachment/detachment device according to one embodiment of the invention is a substrate attachment/detachment device which clamps and holds a substrate by means of first and second retaining members of a substrate holder, the device comprising a first holder retainer configured to hold the first retaining member in a first posture; and a second holder retainer configured to be movable in a linear manner toward and away from the first holder retainer, capable of holding the second retaining member in the first posture and a second posture which is substantially orthogonal to the first posture, configured to push the second retaining member against the first retaining member in the first posture to lock the first and second retaining members to each other.

The substrate attachment/detachment device described above enables the first and second retaining members to be locked to each other in the first posture after the second retaining member of the substrate holder receives the substrate in the second posture. For example, if the first and second retaining members are locked to each other in an upright posture after the second holder receives the substrate in a horizontal posture, the substrate holder on which the substrate is mounted can be carried in the upright posture. This reduces the possibility of making a scratch on a substrate surface and causing a damage onto the substrate, which are problems caused when the substrate is carried with a to-be-processed face facing upward. The horizontal posture and the upright posture (perpendicular posture) here include postures which slightly deviate from the horizontal or upright posture, and can be rephrased as a substantially horizontal posture and a substantially upright posture (perpendicular posture).

Since the second holder retainer is movable in a linear manner toward and away from the first holder retainer, the second holder retainer can turn the second retaining member to change the posture at a position far enough away from the first holder retainer. This prevents the device from being increased in size and facilitates a position adjustment between the first and second retaining members.

[2] In the substrate attachment/detachment device according to [1], the first posture can be a posture substantially perpendicular to an installation surface of the substrate attachment/detachment device.

In this case, the second posture is a posture substantially horizontal to the installation surface. The substrate can be received with the second retaining member of the substrate holder maintained in a substantially horizontal state, and the first and second retaining members can be locked to each other in the substantially perpendicular posture. The device is therefore suitable for mounting the substrate on the substrate holder.

[3] The substrate attachment/detachment device according to [1] or [2] can further comprise a support device including a first support plate for supporting the first retaining member on the other side of the second holder retainer, and a locking mechanism for keeping the first retaining member on the first support plate.

In this case, the second holder retainer performs attachment/detachment of the second retaining member while the first retaining member is supported and locked by the support device. This prevents the first retaining member from deviating from a position thereof when the second holder retainer pushes the second retaining member against the first retaining member of the first holder retainer.

[4] In the substrate attachment/detachment device according to [3], the support device includes a plurality of rods coupled to a face of the first support plate, which is opposite to a face on which the first retaining member is supported, and the first support plate can be shifted by shifting the plurality of rods.

The plurality of rods allow the first support plate to shift in a correct posture and enables the first retaining member to be favorably supported.

[5] In the substrate attachment/detachment device according to [3], the locking mechanism includes a pressing member which is rotatable between a position overlapping a face of the first retaining member and a position not overlapping the face of the first retaining member.

If the first support plate is brought into contact with the first retaining member while a locking device is placed in the position not overlapping the face of the first retaining member, and the locking device is then placed in the position overlapping the face of the first retaining member to lock the first retaining member to the first support plate by using the locking device, it is possible to perform a locking operation while avoiding an interference with the first retaining member.

[6] In the substrate attachment/detachment device according to [3], the first retaining member has an arm. The first holder retainer further has an arm receiver which supports the arm of the first retaining member. The first retaining member is suspended by the arm receiver.

Due to a configuration in which suspension is carried out by the arm of the first retaining member, the first holder retainer can be simply configured.

[7] In the substrate attachment/detachment device according to [6], the arm receiver has a positioning pin which is movable between a position in which the positioning pin is engaged with a positioning hole formed in the arm of the first retaining member and a position in which the positioning pin is not engaged with the positioning hole.

In this case, the positioning pin enables the substrate holder to be accurately positioned relative to the first retaining member.

[8] In the substrate attachment/detachment device according to [6], the arm receiver includes an energization determining device for checking electrical conduction of the substrate via a connector of the first retaining member. The energization determining device measures a resistance value between external connection contact points of a plurality of external connection contact point pairs of the connector.

In this case, the energization determining device makes it possible to determine if there is abnormality in electrical characteristics of a preprocessed substrate and those of the substrate holder, so that it is also possible to prevent substrate processing from being performed using an abnormal substrate or substrate holder. When a plurality of cables are connected to common external connection contact points of the connector, due to the measurement of the resistance value between the external connection contact points of each of the external connection contact points of the connector, an energization determination can be performed by determining if there is variation between resistance values of the external connection contact point pairs. This improves reliability of plating processing.

[9] In the substrate attachment/detachment device according to any one of [3] to [8], the first support plate has a rectangular shape and is configured to support the first retaining member having a polygonal shape. The first retaining member in the polygonal shape enables a rectangular large-size substrate to be held properly.

[10] In the substrate attachment/detachment device according to any one of [1] to [9], the second holder retainer dudes a first actuator configured to actuate a clamp which is provided to the first retaining member supported by the first holder retainer, and thus cause the first retaining member to hold the second retaining member.

In this case, the first actuator of the second holder retainer makes it possible to actuate the clamp of the first retaining member, and the clamp of the first retaining member makes it possible to easily lock the second retaining member. Since the clamp is provided to the first retaining member, the configuration of the second retaining member which is separated from the first holder retainer to be moved can be made to be simple.

[11] In the substrate attachment/detachment device according to [10], the first actuator includes a first rod-like member configured to shift in a perpendicular direction to the first support plate. The first actuator uses the first rod-like member to press a lever coupled to the clamp and thus rotate the clamp of the first retaining member around an axis parallel to the first support plate.

In this case, since the clamp is rotated around the axis parallel to the first support plate (that is, parallel to the substrate), it is possible to suppress the substrate from being applied with a force acting in a substrate plane direction, thereby preventing or reducing deflection and distortion of the substrate. Consequently, deflection is reduced or prevented even when a large-size thin substrate is held.

[12] In the substrate attachment/detachment device according to [11], the first rod-like member is a piston which is driven by an air cylinder.

In this case, the first rod-like member can be pressed against lever with a proper force by the air cylinder.

[13] In the substrate attachment/detachment device according to any one of [1] to [12], the second holder retainer includes a second support plate for supporting the second retaining member and a second actuator provided to the second support plate. The second actuator operates a clip provided to the second retaining member to cause the clip to hold the substrate.

In this case, the substrate can be locked onto the substrate support plate with the clip when the second retaining member receives the substrate. Therefore, even if the posture of the second retaining member is changed, the substrate can be surely held.

[14] In the substrate attachment/detachment device according to [13], the second actuator includes a second rod-like member configured to shift in a perpendicular direction to the second support plate. The second actuator uses the second rod-like member to rotate the clip of the second retaining member around an axis parallel to the second support plate.

In this case, the clamp is rotated around the axis parallel to the second support plate (that is, parallel to the substrate), so that it is possible to suppress a force acting the plane of the substrate from being applied onto the substrate, thereby preventing or reducing deflection and distortion of the substrate. Consequently, deflection is reduced or prevented even when a large-size thin substrate is held. Furthermore, since the clip is moved in the perpendicular direction to the substrate plane, the device is adaptable to thin warped substrates and substrates with various thicknesses.

[15] In the substrate attachment/detachment device according to [14], the second rod-like member is a piston which is driven by an air cylinder. In this case, it is possible to apply a proper force from the second rod-like member to the clip by using the air cylinder.

[16] In the substrate attachment/detachment device according to any one of [1] to [15], the second holder retainer includes an adsorption device for keeping the second retaining member on the second support plate, a turning mechanism for turning the second support plate, and a liner motion mechanism configured to shift the second support plate toward and away from the first holder retainer.

The turning mechanism and the linear motion mechanism enable the second support plate to be turned and shifted in a linear manner. The second retaining member, while being turned and shifted in the linear manner, can be favorably held by the adsorption device.

[17] In the substrate attachment/detachment device according to [16], the adsorption device includes a pressure adsorption cylinder. The pressure adsorption cylinder includes a suction disk that is pressed against the second retaining member and an opening that opens in the suction disk and supplies gas to the second retaining member side.

The pressure adsorption cylinder makes it possible to perform both pressing and adsorption of the second retaining member.

[18] In the substrate attachment/detachment device according to [16] or [17], the turning mechanism includes a first electric motor for rotating the second support plate.

The first electric motor enables the second support plate to be accurately rotated.

[19] In the substrate attachment/detachment device according to any one of [16] to [18], the linear motion mechanism includes a second electric motor and a rotation-linear motion conversion mechanism configured to convert a motive power of the second electric motor into a linear motion. The second electric motor includes an electromagnetic brake. In this case, the second electric motor enables the second holder retainer to be accurately shifted to a desired position, and the electromagnetic brake can fix a position of the second holder retainer.

[20] In the substrate attachment/detachment device according to any one of [16] to [19], the second holder retainer further includes a horizontal position determining device configured to come into contact with a lateral face of the second retaining member to position the second retaining member within a plane of the second support plate.

The horizontal position determining device enables the second retaining member to be accurately positioned within the plane of the second support plate. The substrate therefore can be accurately mounted on the second retaining member by means of a transfer robot.

[21] In the substrate attachment/detachment device according to any one of [16] to [20], the second support plate has a rectangular shape and is configured to support the second retaining member having a polygonal shape.

The second retaining member in the polygonal shape enables a rectangular large-size substrate to be held properly.

[22] A plating device according to one embodiment of the invention comprises a substrate attachment/detachment device which clamps and holds a substrate by means of first and second retaining members of a substrate holder, and a plating processing section which receives the substrate holder holding the substrate in the substrate attachment/detachment device and applies plating processing to the substrate. The substrate attachment/detachment device comprises a first holder retainer configured to support the first retaining member in a first posture; and a second holder retainer configured to be movable in a linear manner toward and away from the first holder retainer, capable of holding the second retaining member in the first posture and a second posture which is substantially orthogonal to the first posture, and configured to push the second retaining member against the first retaining member in the first posture to lock the first and second retaining members to each other.

The plating device described above provides the same operation and advantages as those discussed in [1]. The plating device further enables the plating processing to be performed using the substrate holder which properly holds the substrate, and thus improves reliability of the plating processing. The plating device especially makes it possible to properly hold a thin and large substrate and favorably perform the plating processing.

[23] A control device according to one embodiment of the invention is a control device of the substrate attachment/detachment device configured to clamp and hold a substrate by means of the first and second retaining members of the substrate holder. The control device executes processing including supporting the first holder retainer in the first posture by means of a first retaining member; fixing a substrate to the second retaining member by means of a second holder retainer while supporting the second retaining member by means of the second holder retainer in a second posture which is substantially orthogonal to the first posture, and then turning the second retaining member into the first posture; causing the second holder retainer to make a linear motion toward the first holder retainer; and pressing the second retaining member against the first retaining member by means of the second holder retainer to lock the first and second retaining members to each other.

The control device provides the same operation and advantages as those described in [1].

[24] A storage medium according to one embodiment of the invention is a storage medium that stores a program for causing a computer to execute a method of controlling a substrate attachment/detachment device configured to clamp and hold a substrate by means of first and second retaining members of the substrate holder. The storage medium stores a program for causing a computer to execute supporting the first retaining member in the first posture by means of the first holder retainer; fixing the substrate to the second retaining member by means of the second holder retainer while the second retaining member is supported by the second holder retainer in a second posture which is substantially orthogonal to the first posture, and turning the second retaining member into the first posture; causing the second holder retainer to make a linear motion toward the first holder retainer; and pressing the second retaining member against the first retaining member by means of the second holder retainer to lock the first and second retaining members to each other.

The program provides the same operation and advantages as those described in [1].

The embodiments of the invention have been explained on the basis of some examples. The embodiments of the invention are provided to facilitate understanding of the invention and do not limit the invention. The invention may be modified or improved without deviating from the gist thereof, and equivalents thereof are included in the present invention. For example, the shape of the large-size substrate is not limited to the rectangle but may be a square or another polygonal shape, such as a pentacle and a hexagon. The invention is applicable to a substrate attachment/detachment device for attaching/detaching a circular substrate to/from a substrate holder. As far as at least part of the foregoing problem can be solved or at least some of the advantages can be provided, the constituent elements mentioned in the claims or description may be arbitrarily combined or omitted.

The present application claims priority to Japanese Patent Application No. 2016-249631 filed on Dec. 22, 2016. The entire disclosure of Japanese Patent Application No. 2016-249631 filed on Dec. 22, 2016 including specification, claims, drawings and summary is incorporated herein by reference in its entirety.

The entire disclosure of Japanese Unexamined Patent Application Publication (Kokai) No. 2016-117917 (Patent Literature 1), Japanese Patent No. 4179707 (Patent Literature 2), Japanese Unexamined Patent Application Publication (Kokai) No. 2009-270167 (Patent Literature 3), and Japanese Unexamined Patent Application Publication (Kokai) No. 2016-127069 (Patent Literature 4), including specification, claims, drawings and summary is incorporated herein by reference in its entirety.

REFERENCE SIGNS LIST

1: substrate holder, 25: cassette table, 25a: cassette, 27: substrate transfer device
28: traveling mechanism, 29: substrate attachment/detachment mechanism
30: stocker, 32: prewet tank, 33: presoak tank, 34: prerinse tank, 35: blow tank
36: rinse tank, 37: substrate holder transfer device, 38: overflow tank, 39: plating tank
50: washing device, 50a: washing section, 100: plating device, 110: unload section
120: processing section, 120A: preprocessing and postprocessing section
120B: processing section, 175: controller, 175A: CPU, 175B: memory, 175C: controller
300: front plate, 301: front face, 302: rear face, 303: opening, 310: front plate main body
311: wiring buffer part, 311a: wiring hole, 312: face part, 313: wall thickness part
320: attachment part, 330: arm, 331: connector, 331a: external connection contact pair
331a1: first-side external connection contact, 331a2: second-side external connection contact
332: positioning piece 332a: positioning hole, 340: clamp. 340a: engaging part
342: lever, 350: fixing part, 361: inner seal, 362: outer seal, 363: seal holder,
363a: wiring gutter, 364: seal holder, 365: cable conduit, 370: contact, 371: conductive plate
390: positioning pin, 400: back plate, 401: front face, 402: rear face,
410: back plate main body, 420: clip part, 421: clip, 421a: claw, 421b: elongate hole
421c: circular hole, 422: spiral spring, 422a: leg, 422b: leg, 422c: spiral part
423: fixed part 423a: regulation face: 423b: guide face, 424: fixed shaft
430: engaging receiving part, 430a: projection, 470: button, 471: force receiving part
472: elastic portion, 473: attachment part, 474: pressing member, 475: fastening member
490: positioning piece, 601: conductive wire, 602: jacket
1000: substrate attachment/detachment device
1100: holder station, 1111: leg, 1112: supporting column, 1113: lower transverse plate
1114: upper transverse plate, 1115: flange, 1116: overhanging portion,
1117: first attachment member, 1118: second attachment member, 1120: arm receiver
1120a: recess, 1120b: recess, 1121: energization determination device
1121a: connector-side contact pair, 1121a1: first-side connector-side contact
1121a2: second-side connector-side contact, 1121b: cylinder-side contact pair
1121b1: first-side cylinder-side contact, 1121b2: second-side cylinder-side contact
1121c: energizing cylinder, 1122: pin hole, 1123: positioning pin, 1200: turning device
1210: support plate part, 1210a: support plate, 1211: actuator, 1212: actuator
1213: actuator (pressure adsorption cylinder), 1213a: suction disk
1213b: rod, 1213c: opening, 1213d: passage, 1213e: piston, 1213g: pipes
1213h: suction passage, 1213i: air chamber, 1213j: diaphragm, 1214: vacuum device
1215: actuator, 1216: horizontal positioning device, 1216a: rod, 1216b: air cylinder
1217: horizontal positioning device, 1217a: rod, 1217b: air cylinder
1231: flange, 1232: main body, 1240: turning mechanism, 1241: flame, 1241a: side wall
1241b: side wall, 1244a: bearing, 1244b: bearing, 1242: electric motor
1243: support plate turning shaft, 1245a: coupling mechanism, 1250: guide member
1251: coupling plate, 1252: guide part, 1260: linear motion mechanism
1261: electric motor, 1262: coupling mechanism, 1263: electromagnetic brake
1264: ball screw, 1265: nut, 1266: base, 1300: support device, 1301: base
1302: support column, 1303: upper transverse beam, 1310: main body panel
1320: support plate, 1321: rod, 1321b: air cylinder, 1322: rod, 1322a: flange member
1322b: air cylinder, 1323: fixing device, 1323a: pressing member, 1323b: rod
1323c: air cylinder, 1323d: pressing part, 1400: base, 1500: rail, 1510: rail part

What is claimed is:

1. A substrate attachment/detachment device which operates a substrate holder to clamp and hold a substrate by means of first and second retaining members of the substrate holder, the substrate attachment/detachment device being a device separate from the substrate holder, the substrate attachment/detachment device comprising:
a first holder retainer configured to hold the first retaining member of the substrate holder in a first posture;
a second holder retainer configured to be movable in a linear manner toward and away from the first holder retainer, capable of holding the second retaining member of the substrate holder in the first posture and a second posture which is substantially orthogonal to the first posture, configured to push the second retaining member of the substrate holder against the first retaining member of the substrate holder in the first posture to lock the first and second retaining members of the substrate holder to each other; and
a support part coupling the second holder retainer to the first holder retainer so that the second holder retainer is movable in the linear manner by way of the support part.

2. The substrate attachment/detachment device of claim 1, wherein the first posture is a posture substantially perpendicular to an installation surface of the substrate attachment/detachment device.

3. The substrate attachment/detachment device of claim 1, further comprising a support device including:
a first support plate for supporting the first retaining member on a side opposite to the second holder retainer; and
a locking mechanism for keeping the first retaining member on the first support plate.

4. The substrate attachment/detachment device of claim 3, wherein
the support device includes a plurality of rods coupled to a face of the first support plate, which is opposite to a face on which the first retaining member is supported, and the first support plate can be shifted by shifting the plurality of rods.

5. The substrate attachment/detachment device of claim 3, wherein
the locking mechanism includes a pressing member which is rotatable between a position overlapping a face of the first retaining member and a position not overlapping the face of the first retaining member.

6. The substrate attachment/detachment device of claim 3, wherein
the first retaining member has an arm;
the first holder retainer further has an arm receiver which supports the arm of the first retaining member, the first retaining member being suspended by the arm receiver.

7. The substrate attachment/detachment device of claim 6, wherein
the arm receiver has a positioning pin which is movable between a position in which the positioning pin is engaged with a positioning hole formed in the arm of the first retaining member and a position in which the positioning pin is not engaged with the positioning hole.

8. The substrate attachment/detachment device of claim 6, wherein
the arm receiver includes an energization determining device for checking electrical conduction of the substrate via a connector of the first retaining member, and the energization determining device measures a resistance value between external connection contact points of a plurality of external connection contact point pairs of the connector.

9. The substrate attachment/detachment device of claim 3, wherein
the first support plate has a rectangular shape and is configured to support the first retaining member having a polygonal shape.

10. The substrate attachment/detachment device of claim 1, wherein
the second holder retainer includes a first actuator configured to actuate a clamp which is provided to the first retaining member supported by the first holder retainer, and thus cause the first retaining member to hold the second retaining member.

11. The substrate attachment/detachment device of claim 10, wherein
the first actuator includes a first rod-like member configured to shift in a perpendicular direction to the first support plate, and uses the first rod-like member to press a lever coupled to the clamp to rotate the clamp of the first retaining member around an axis parallel to the first support plate.

12. The substrate attachment/detachment device of claim 11, wherein
the first rod-like member is a piston which is driven by an air cylinder.

13. The substrate attachment/detachment device of claim 1, wherein
the second holder retainer includes a second support plate for supporting the second retaining member and a second actuator provided to the second support plate, and the second actuator operates a clip provided to the second retaining member to cause the clip to hold the substrate.

14. The substrate attachment/detachment device of claim 13, wherein
the second actuator includes a second rod-like member configured to shift in a perpendicular direction to the second support plate, and uses the second rod-like member to rotate the clip of the second retaining member around an axis parallel to the second support plate.

15. The substrate attachment/detachment device of claim 14, wherein
the second rod-like member is a piston which is driven by an air cylinder.

16. The substrate attachment/detachment device of claim 1, wherein the second holder retainer includes:
a second support plate for supporting the second retaining member;
an adsorption device for keeping the second retaining member on the second support plate;
a turning mechanism actuated by a third actuator to turn the second support plate; and
a linear motion mechanism actuated by a fourth actuator to shift the second support plate toward and away from the first holder retainer.

17. The substrate attachment/detachment device of claim 16, wherein
the adsorption device includes a pressure adsorption cylinder; and
the pressure adsorption cylinder includes a suction disk that is pressed against the second retaining member, and an opening that opens in the suction disk and supplies gas to a side of the second retaining member.

18. The substrate attachment/detachment device of claim 16, wherein
the third actuator includes a first electric motor for rotating the second support plate.

19. The substrate attachment/detachment device of claim 16, wherein the fourth actuator includes a second electric motor, and a rotation-linear motion conversion mechanism configured to convert a motive power of the second electric motor into a linear motion, and the second electric motor includes an electromagnetic brake.

20. The substrate attachment/detachment device of claim 16, wherein
the second holder retainer further includes a horizontal position determining device configured to come into contact with a lateral face of the second retaining member to position the second retaining member within a plane of the second support plate.

21. The substrate attachment/detachment device of claim 16, wherein
the second support plate has a rectangular shape and is configured to support the second retaining member having a polygonal shape.

22. A plating device comprising:
a substrate attachment/detachment device which operates a substrate holder to clamp and hold a substrate by means of first and second retaining members of the substrate holder, the substrate attachment/detachment device being a device separate from the substrate holder; and
a plating processing section which receives the substrate holder holding the substrate which has been held in the substrate attachment/detachment device, and applies plating processing to the substrate, wherein the substrate attachment/detachment device includes:
a first holder retainer configured to support the first retaining member of the substrate holder in a first posture; and
a second holder retainer configured to be movable in a linear manner toward and away from the first holder retainer, capable of holding the second retaining member of the substrate holder in the first posture and a second posture which is substantially orthogonal to the first posture, and press the second retaining member of the substrate holder against the first retaining member of the substrate holder in the first posture to lock the first and second retaining members of the substrate holder to each other,
a support part coupling the second holder retainer to the first holder retainer so that the second holder retainer is movable in the linear manner by way of the support part.

* * * * *